(12) United States Patent
Baek et al.

(10) Patent No.: US 11,515,485 B2
(45) Date of Patent: Nov. 29, 2022

(54) ORGANIC LIGHT EMITTING DIODE AND ORGANIC LIGHT EMITTING DEVICE HAVING THE SAME

(71) Applicant: LG Display Co., Ltd., Seoul (KR)

(72) Inventors: Jeong-Eun Baek, Paju-si (KR); Bo-Min Seo, Paju-si (KR); Hyo-Jin Noh, Paju-si (KR); Mi-Sang Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 352 days.

(21) Appl. No.: 16/702,064

(22) Filed: Dec. 3, 2019

(65) Prior Publication Data

US 2020/0185616 A1 Jun. 11, 2020

(30) Foreign Application Priority Data

Dec. 5, 2018 (KR) .................. 10-2018-0155556

(51) Int. Cl.
*H01L 51/00* (2006.01)
*C09K 11/06* (2006.01)
*H01L 51/50* (2006.01)

(52) U.S. Cl.
CPC .......... *H01L 51/0067* (2013.01); *C09K 11/06* (2013.01); *H01L 51/0072* (2013.01); *H01L 51/5004* (2013.01); *C09K 2211/1018* (2013.01); *H01L 51/5012* (2013.01); *H01L 51/5096* (2013.01); *H01L 2251/552* (2013.01)

(58) Field of Classification Search
CPC ............. H01L 51/0067; H01L 51/0072; H01L 51/5004; H01L 51/5012; H01L 51/5096; H01L 2251/552; H01L 51/0059; H01L 51/5028; H01L 27/3244; H01L 51/0052; H01L 51/0054; H01L 51/0055; H01L 51/0056; H01L 51/5024; H01L 51/5044; H01L 51/0071; H01L 51/504; C09K 11/06; C09K 2211/1018
USPC ........................................................ 428/690
See application file for complete search history.

(56) References Cited

U.S. PATENT DOCUMENTS

| | | | | |
|---|---|---|---|---|
| 10,889,602 B2* | 1/2021 | Kim | ..................... | H01L 51/0094 |
| 10,978,642 B2* | 4/2021 | Pan | ......................... | H01L 51/00 |
| 11,121,184 B2* | 9/2021 | Song | ..................... | H01L 51/504 |
| 11,384,072 B2* | 7/2022 | Yoon | ..................... | C07D 405/14 |
| 2012/0126179 A1* | 5/2012 | Parham | ................ | H01L 51/0067 585/27 |
| 2014/0138669 A1* | 5/2014 | Nakagawa | ........... | C07D 519/00 548/440 |
| 2015/0243897 A1* | 8/2015 | Montenegro | ........ | C07D 213/22 544/215 |
| 2016/0190474 A1* | 6/2016 | Kim | ..................... | H01L 51/0067 257/40 |
| 2016/0190475 A1* | 6/2016 | Kim | ..................... | H01L 51/0067 257/40 |
| 2016/0190478 A1* | 6/2016 | Nakanotani | ......... | H01L 51/0071 257/40 |
| 2017/0025621 A1 | 1/2017 | Suzuki et al. | | |
| 2018/0186819 A1* | 7/2018 | Kim | ..................... | C07D 491/107 |
| 2019/0292309 A1* | 9/2019 | Pan | ..................... | H01L 51/0067 |
| 2020/0098992 A1* | 3/2020 | Pan | ......................... | H01L 51/00 |
| 2020/0098996 A1* | 3/2020 | Koenen | ................. | H01L 51/006 |
| 2020/0185632 A1* | 6/2020 | Kim | ..................... | H01L 51/0067 |
| 2020/0190100 A1* | 6/2020 | Yoon | ................... | H01L 51/0061 |
| 2020/0194689 A1* | 6/2020 | Seo | ..................... | H01L 51/0072 |
| 2021/0066636 A1* | 3/2021 | Baek | ................... | H01L 51/5012 |
| 2021/0151683 A1* | 5/2021 | Sakaino | ............... | C07D 487/04 |
| 2021/0202864 A1* | 7/2021 | Nakanotani | .......... | C07D 209/88 |

FOREIGN PATENT DOCUMENTS

| | | | | |
|---|---|---|---|---|
| CN | 105670606 A | 6/2018 | | |
| EP | 3 029 125 A1 | 6/2016 | | |
| WO | WO-2018103744 A1 * | 6/2018 | ............. | C09K 11/06 |

OTHER PUBLICATIONS

Hajime Nakanotina et al., "Promising operational stability of high-efficiency organic light-emitting diodes based on thermally activated delayed fluorescence", Scientific Reports, 3:2127, pp. 1-5, Jul. 3, 2013. (Year: 2013).*

* cited by examiner

*Primary Examiner* — Douglas J McGinty
(74) *Attorney, Agent, or Firm* — Birch, Stewart, Kolasch & Birch, LLP

(57) ABSTRACT

An organic light emitting diode including a plurality delayed fluorescent materials with specific energy levels and an organic light emitting device including the diode is disclosed. When the plurality delayed fluorescent materials with specific energy levels are applied in an emitting material layer, it is possible to minimize the energy loss or exciton quenching during luminous process and to prevent the diode from reducing life span caused by the exciton quenching. When the emitting material layer includes other luminous material having a narrow FWHM, the organic light emitting diode can enhance its color purity.

34 Claims, 16 Drawing Sheets

ORGANIC LIGHT EMITTING DIODE AND ORGANIC LIGHT EMITTING DEVICE HAVING THE SAME

CROSS-REFERENCE TO RELATED APPLICATIONS

This application claims the benefit under 35 U.S.C. § 119(a) of Korean Patent Application No. 10-2018-0155556, filed in the Republic of Korea on Dec. 5, 2018, which is incorporated herein by reference in its entirety.

BACKGROUND

Technical Field

The present disclosure relates to an organic light emitting diode, and more specifically, to an organic light emitting diode having enhanced luminous efficiency and life span and an organic light emitting device having the same.

Description of the Related Art

As display devices have become larger, there exists a need for a flat display device with lower spacing occupation. Among the flat display devices, a display device using an organic light emitting diode (OLED) has come into the spotlight.

In the OLED, when electrical charges are injected into an emission layer between an electron injection electrode (i.e., cathode) and a hole injection electrode (i.e., anode), electrical charges are combined to be paired, and then emit light as the combined electrical charges are disappeared.

The OLED can be formed even on a flexible transparent substrate such as a plastic substrate. In addition, the OLED can be driven at a lower voltage of 10 V or less. Besides, the OLED has relatively lower power consumption for driving compared to plasma display panel and inorganic electroluminescent devices, and color purity thereof is very high. Further, since the OLED can display various colors such as green, blue, red and the likes, the OLED display device has attracted a lot of attention as a next-generation display device that can replace a liquid crystal display device (LCD).

Since the blue luminous material requires a very wide energy bandgap compared to green or red luminous material, it has been difficult to develop blue luminous material. In addition, the organic light emitting diode to which blue luminous material is applied showed low luminous efficiency and unsatisfactory life span and color purity.

BRIEF SUMMARY

Accordingly, the present disclosure is directed to an organic light emitting diode and an organic light emitting device including the organic light emitting diode that can reduce one or more of the problems due to the limitations and disadvantages of the related art.

An object of the present disclosure is to provide an organic light emitting diode that can enhance its luminous efficiency and life span and an organic light emitting device including the diode.

Another object of the present disclosure is to provide an organic light emitting diode having improved color purity and an organic light emitting device including the diode.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

According to an aspect, the present disclosure provides an organic light emitting diode that comprises first and second electrodes facing each other, and an at least one emitting unit disposed between the first and second electrodes and including a first emitting material layer, wherein the first emitting material layer includes a first host, a first delayed fluorescent dopant and a second delayed fluorescent dopant, wherein an excited state triplet energy level ($T_1^{TD1}$) of the first delayed fluorescent dopant and an excited state triplet energy level ($T_1^{TD2}$) of the second delayed fluorescent dopant satisfy the following relationship in Equation (1), wherein a highest occupied molecular orbital (HOMO) energy level (HOMO$^H$) of the first host, a HOMO energy level (HOMO$^{TD1}$) of the first delayed fluorescent dopant and a HOMO energy level (HOMO$^{TD2}$) of the second delayed fluorescent dopant satisfy the following relationships in Equations (3) and (4), and wherein a lowest unoccupied molecular orbital (LUMO) energy level (LUMO$^H$) of the first host, a LUMO energy level (LUMO$^{TD1}$) of the first delayed fluorescent dopant and a LUMO energy level (LUMO$^{TD2}$) of the second delayed fluorescent dopant satisfy the following relationships in Equations (6) and (7).

$$0.1\ eV \leq T_1^{TD2} - T_1^{TD1} \leq 0.5\ eV \qquad (1)$$

$$HOMO^H \leq HOMO^{TD2} \qquad (3)$$

$$HOMO^{TD1} - HOMO^{TD2} > 0.03\ eV \qquad (4)$$

$$LUMO^H \geq LUMO^{TD2} \qquad (6)$$

$$LUMO^{TD2} - LUMO^{TD1} > 0.05\ eV \qquad (7)$$

According to another aspect, the present disclosure provides an organic light emitting device that comprises a substrate and the OLED disposed over the substrate, as described above.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Reference will now be made in detail to aspects of the disclosure, examples of which are illustrated in the accompanying drawings.

[Organic Light Emitting Device]

Figure 1:
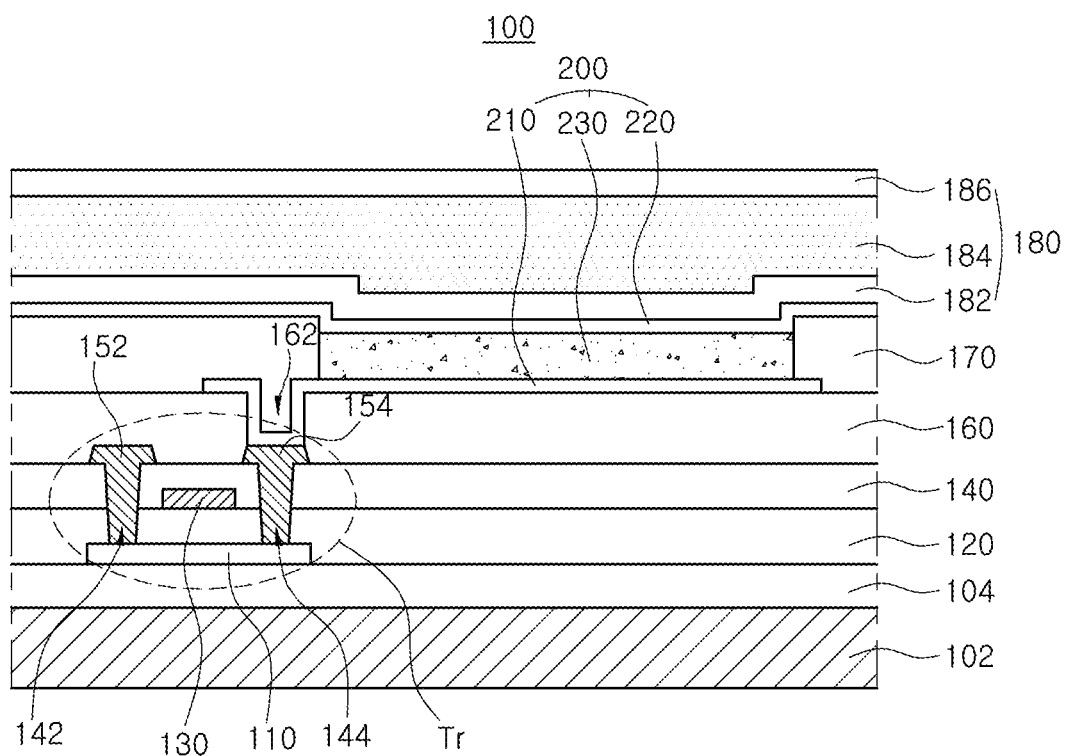
FIG. 1 is a schematic cross-sectional view illustrating an organic light emitting display device of the present disclosure.

An organic light emitting diode of the present disclosure includes a plurality of delayed fluorescent materials in an emitting material layer so as to enhance its luminous efficiency, its life span and its color purity. The organic light emitting diode of the present disclosure may be applied to an organic light emitting device such as an organic light emitting display device and an organic light emitting illumination device. A display device including the organic light emitting diode will be explained. FIG. 1 is a schematic cross-sectional view of an organic light emitting display device of the present disclosure.

As illustrated in FIG. 1, the organic light emitting display device 100 includes a substrate 102, a thin-film transistor Tr on the substrate 102, and an organic light emitting diode 200 connected to the thin film transistor Tr.

The substrate 102 may include, but are not limited to, glass, thin flexible material and/or polymer plastics. For example, the flexible material may be selected from the group, but are not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the organic light emitting diode 200 are arranged, form an array substrate.

A buffer layer 104 may be disposed over the substrate 102, and the thin film transistor Tr is disposed over the buffer layer 104. The buffer layer 104 may be omitted.

A semiconductor layer 110 is disposed over the buffer layer 104. In one exemplary embodiment, the semiconductor layer 110 may include, but are not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include, but are not limited to, polycrystalline silicon. In this case, opposite edges of the semiconductor layer 110 may be doped with impurities.

A gate insulating layer 120 formed of an insulating material is disposed on the semiconductor layer 110. The gate insulating layer 120 may include, but are not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 1, the gate insulating layer 120 may be patterned identically as the gate electrode 130.

An interlayer insulating layer 140 formed of an insulating material is disposed on the gate electrode 130 with covering over an entire surface of the substrate 102. The interlayer insulating layer 140 may include, but are not limited to, an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 in FIG. 1. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are formed of a conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 1 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

A gate line and a data line, which cross each other to define a pixel region, and a switching element, which is connected to the gate line and the data line is, may be further formed in the pixel region of FIG. 1. The switching element is connected to the thin film transistor Tr, which is a driving element. Besides, a power line is spaced apart in parallel from the gate line or the data line, and the thin film transistor Tr may further include a storage capacitor configured to constantly keep a voltage of the gate electrode for one frame.

In addition, the organic light emitting display device 100 may include a color filter for absorbing a part of the light emitted from the organic light emitting diode 200. For example, the color filter may absorb a light of specific wavelength such as red (R), green (G) or blue (B). In this case, the organic light emitting display device 100 can implement full-color through the color filter.

For example, when the organic light emitting display device 100 is a bottom-emission type, the color filter may be disposed on the interlayer insulating layer 140 with corresponding to the organic light emitting diode 200. Alternatively, when the organic light emitting display device 100 is a top-emission type, the color filter may be disposed over the organic light emitting diode 200, that is, a second electrode 220.

A passivation layer 160 is disposed on the source and drain electrodes 152 and 154 over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 154, it may be spaced apart from the second semiconductor layer contact hole 154.

The organic light emitting diode 200 includes a first electrode 210 that is disposed on the passivation layer 160 and connected to the drain electrode 154 of the thin film transistor Tr. The organic light emitting diode 200 further includes an emitting unit 230 as an emission layer and a second electrode 220 each of which is disposed sequentially on the first electrode 210.

The first electrode 210 is disposed in each pixel region. The first electrode 210 may be an anode and include a conductive material having a relatively high work function value. For example, the first electrode 210 may include, but are not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the likes.

In one exemplary embodiment, when the organic light emitting display device 100 is a top-emission type, a reflective electrode or a reflective layer may be disposed under the first electrode 210. For example, the reflective electrode or the reflective layer may include, but are not limited to, aluminum-palladium-copper (APC) alloy.

In addition, a bank layer 170 is disposed on the passivation layer 160 in order to cover edges of the first electrode 210. The bank layer 170 exposes a center of the first electrode 210.

An emitting unit 230 is disposed on the first electrode 210. In one exemplary embodiment, the emitting unit 230 may have a mono-layered structure of an emitting material layer. Alternatively, the emitting unit 230 may have a multiple-layered structure of a hole injection layer, a hole transport layer, an electron blocking layer, an emitting material layer, a hole blocking layer, an electron transport layer and/or an electron injection layer (See, FIGS. 2, 8, 10 and 12). In one embodiment, the organic light emitting diode 200 may have one emitting unit 230. Alternatively, the organic light emitting diode 200 may have multiple emitting units 230 to form a tandem structure.

The second electrode 220 is disposed over the substrate 102 above which the emitting unit 230 is disposed. The second electrode 220 may be disposed over a whole display area and may include a conductive material with a relatively low work function value compared to the first electrode 210. The second electrode 220 may be a cathode. For example, the second electrode 220 may include, but are not limited to, aluminum (Al), magnesium (Mg), calcium (Ca), silver (Ag), alloy thereof or combination thereof such as aluminum-magnesium alloy (Al—Mg).

In addition, an encapsulation film 180 may be disposed over the second electrode 220 in order to prevent outer moisture from penetrating into the organic light emitting diode 200. The encapsulation film 180 may have, but are not limited to, a laminated structure of a first inorganic insulating film 182, an organic insulating film 184 and a second inorganic insulating film 186.

[Organic Light Emitting Diode]

Figure 2:
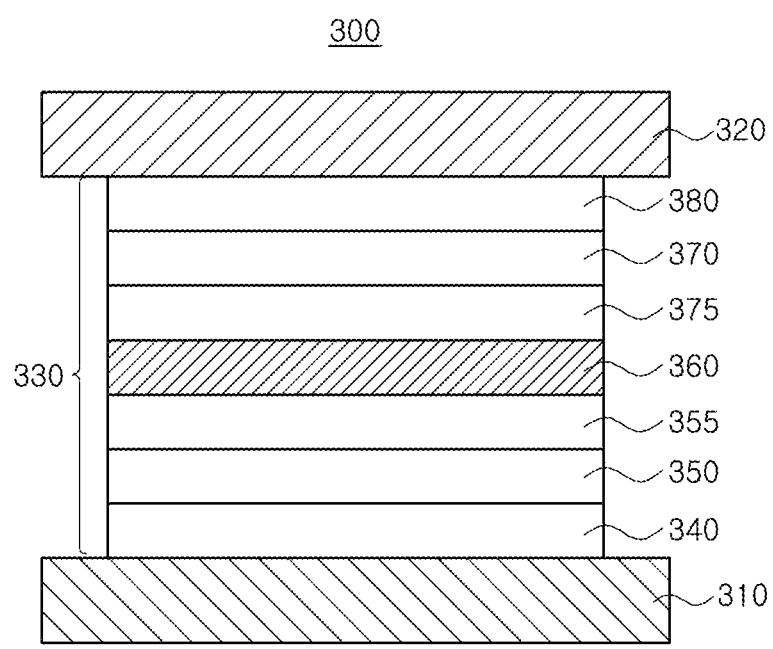
FIG. 2 is a schematic cross-sectional view illustrating an organic light emitting diode in accordance with an exemplary embodiment of the present disclosure.

FIG. 2 is a schematic cross-sectional view illustrating an organic light emitting diode in accordance with an exemplary embodiment of the present disclosure. As illustrated in FIG. 2, the organic light emitting diode (OLED) 300 in accordance with the first embodiment of the present disclosure includes first and second electrodes 310 and 320 facing each other, an emitting unit 330 as an emission layer disposed between the first and second electrodes 310 and 320. In one exemplary embodiment, the emitting unit 330 include a hole injection layer HIL 340, a hole transport layer HTL 350, an emitting material layer EML 360, an electron transport layer ETL 370 and an electron injection layer EIL 380 each of which is laminated sequentially from the first electrode 310. Alternatively, the emitting unit 330 may further comprise a first exciton blocking layer, i.e. an electron blocking layer (EBL) 355 disposed between the HTL 350 and the EML 360 and/or a second exciton blocking layer, i.e. a hole blocking layer (HBL) 375 disposed between the EML 360 and the ETL 370.

The first electrode 310 may be an anode that provides a hole into the EML 360. The first electrode 310 may include, but are not limited to, a conductive material having a relatively high work function value, for example, a transparent conductive oxide (TCO). In an exemplary embodiment, the first electrode 310 may include, but are not limited to, ITO, IZO, ITZO, SnO, ZnO, ICO, AZO, and the like.

The second electrode 320 may be a cathode that provides an electron into the EML 360. The second electrode 320 may include, but are not limited to, a conductive material having a relatively low work function values, i.e., a highly reflective material such as Al, Mg, Ca, Ag, alloy thereof, combination thereof, and the like.

The HIL 340 is disposed between the first electrode 310 and the HTL 350 and improves an interface property between the inorganic first electrode 310 and the organic HTL 350. In one exemplary embodiment, the HIL 340 may include, but are not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiophene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 340 may be omitted in compliance with a structure of the OLED 300.

The HTL 350 is disposed adjacently to the EML 360 between the first electrode 310 and the EML 360. In one exemplary embodiment, the HTL 350 may include, but are not limited to, N,N'-Diphenyl-N,N'-bis(3-methylphenyl)-1,1'-biphenyl-4,4'-diamine (TPD), NPB, 4,4'-bis(N-carbazolyl)-1,1'-biphenyl (CBP), Poly[N,N'-bis(4-butylphenyl)-N,N'-bis(phenyl)-benzidine] (Poly-TPD), Poly [(9,9-dioctylfluorenyl-2,7-diyl)-co-(4,4'-(N-(4-sec-butylphenyl) diphenylamine))] (TFB), Di-[4-(N,N-di-p-tolyl-amino)-phenyl]cyclohexane (TAPC), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The EML 360 may include a host doped with a plurality of delayed fluorescent materials. In an exemplary embodiment, the EML 360 may emit blue light, but are not limited thereto. As an example, the EML 360 may include a host (first host; H), a first delayed fluorescent dopant (TD1) and a second delayed fluorescent dopant (TD2). When the EML 360 includes the delayed fluorescent material, it is possible to fabricate the OLED 300 further enhancing its luminous efficiency.

Organic Light Emitting Diode (OLED) emits light as holes injected from the anode and electrons injected from the cathode are combined to form excitons in EML and then unstable excited state excitons return to a stable ground state. When electrons recombine with holes to form exciton, singlet excitons of a paired spin and triplet excitons of an unpaired spin are produced by a ratio of 1:3 by spin arrangements in theory. Only the singlet exciton among the excitons can be involved in emission process within the common fluorescent materials. Accordingly, the OLED may exhibit luminous efficiency up to 5% when the common fluorescent material is used as a luminous material.

In contrast, phosphorescent materials use different luminous mechanism of converting singlet excitons as well as triplet excitons into light. The phosphorescent materials can convert singlet excitons into triplet excitons through inter-system crossing (ISC). Therefore, it is possible to enhance luminous efficiency when the OLED uses the phosphorescent materials, which use both the singlet excitons and the triplet excitons during the luminous process, as a luminous material compared to the fluorescent materials. However, prior art blue phosphorescent materials exhibits too low color purity to apply with the display device and exhibit very short luminous life span, and therefore, they have not been used in commercial display devices.

Recently, a delayed fluorescent material, which can solve the problems accompanied by the prior art fluorescent and/or phosphorescent materials, has been developed. Representative delayed fluorescent material is a thermally-activated delayed fluorescent (TADF) material. Since the delayed fluorescent material generally has both an electron donor moiety and an electron acceptor moiety within its molecular structure, it can be converted to an intramolecular charge transfer (ICT) state. In case of using the delayed fluorescent material as a dopant, it is possible to use both the excitons of singlet energy level $S_1$ and the excitons of triplet energy level $T_1$ during the emission process.

The luminous mechanism of the delayed fluorescent material will be explained with referring to FIG. 3, which is a schematic diagram illustrating a luminous mechanism of a delayed fluorescent material and illustrates a state of exciton energy loss by converting an excited state triplet exciton to a hot triplet exciton.

Figure 3:
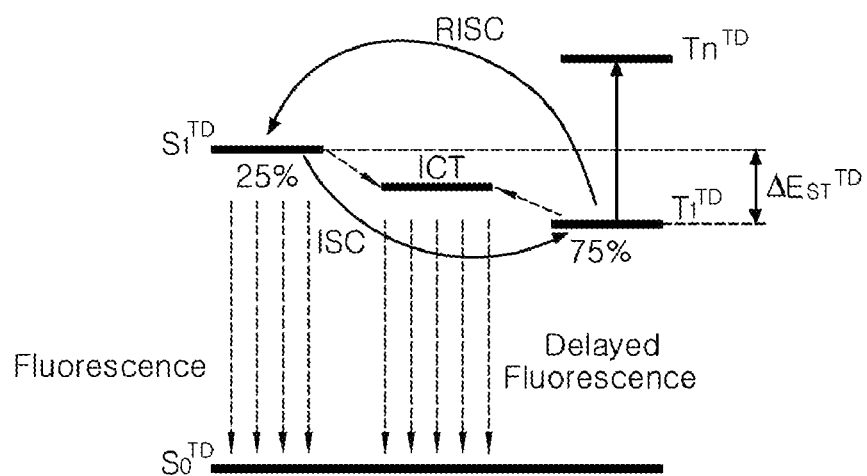
FIG. 3 is a schematic diagram illustrating a luminous mechanism of a delayed fluorescent material and illustrates a state of exciton energy loss by converting an excited state triplet exciton to a hot triplet exciton.

As illustrated in FIG. 3, the excitons of singlet energy level $S_1^{TD}$ as well as the excitons of triplet energy level $T_1^{TD}$ in the delayed fluorescent material can move to an intermediate energy level state, i.e. ICT state, and then the intermediate stated excitons can be transferred to a ground state ($S_0^{TD}$; $S_1^{TD} \rightarrow ICT \leftarrow T_1^{TD}$). Since the excitons of singlet energy level $S_1^{TD}$ as well as the excitons of triplet energy level $T_1^{TD}$ in the delayed fluorescent material is involved in the emission process, the delayed fluorescent material can improve luminous efficiency.

Since both the Highest Occupied Molecular Orbital (HOMO) and the Lowest Unoccupied Molecular orbital (LUMO) are widely distributed over the whole molecule within the common fluorescent material, it is not possible to inter-convert exciton energies between the singlet energy level and the triplet energy level within the common fluorescent material (selection rule). In contrast, since the delayed fluorescent material, which can be converted to ICT state, has little orbital overlaps between HOMO and LUMO, there is little interaction between the HOMO state molecular orbital and the LUMO state molecular orbital. As a result, the changes of spin states of electrons do not have an influence on other electrons, and a new charge transfer band (CT band) that does not follow the selection rule is formed within the delayed fluorescent material.

In other words, since the delayed fluorescent material has the electron acceptor moiety spacing apart from the electron donor moiety within the molecule, it exists as a polarized state having a large dipole moment within the molecule. As the interaction between HOMO molecular orbital and LUMO molecular orbital becomes little in the state where the dipole moment is polarized, the triplet energy level excitons as well as the singlet energy level excitons can be converted to ICT state. Accordingly, the excitons of triplet energy level $T_1^{TD}$ as well as the excitons of singlet energy level $S_1^{TD}$ can be involved in the emission process.

In case of driving an organic light emitting diode that includes the delayed fluorescent material, 25% excitons of singlet energy level $S_1^{TD}$ and 75% excitons of triplet energy level $T_1^{TD}$ are converted to ICT state by heat or electrical field, and then the converted excitons transfer to the ground state $S_0$ with luminescence. Therefore, the delayed fluorescent material may have 100% internal quantum efficiency in theory.

The delayed fluorescent material must has an energy level bandgap $\Delta E_{ST}^{TD}$ equal to or less than about 0.3 eV, for example, from about 0.05 to about 0.3 eV, between the singlet energy level $S_1^{TD}$ and the triplet energy level $T_1^{TD}$ so that exciton energy in both the singlet energy level $S_1^{TD}$ and the triplet energy level $T_1^{TD}$ can be transferred to the ICT state. The material having little energy level bandgap between the singlet energy level $S_1^{TD}$ and the triplet energy level $T_1^{TD}$ can exhibit common fluorescence with Inter system Crossing (ISC) in which the excitons of singlet energy level $S_1^{TD}$ can be transferred to the excitons of triplet energy level $T_1^{TD}$, as well as delayed fluorescence with Reverser Inter System Crossing (RISC) in which the excitons of triplet energy level $T_1^{TD}$ can be transferred upwardly to the excitons of singlet energy level $S_1^{TD}$, and then the exciton of singlet energy level $S_1^{TD}$ transferred from the triplet energy level $T_1^{TD}$ can be transferred to the ground state $S_0^{TD}$.

However, the delayed fluorescent material has low luminous life span owing to using the triplet exciton energy as well as the singlet exciton energy. One of the factors that the delayed fluorescent material has a low luminescent life span is that RISC mechanism where the triplet exciton energy generated at the lowest energy level $T_1^{TD}$ among the triplet energy levels in the delayed fluorescent material is transferred to the ICS state or the singlet energy level is occurred slowly. Accordingly, the triplet excitons of the delayed fluorescent material stay at the lowest triplet energy level $T_1^{TD}$ among the triplet energy levels for a long time. Due to the couplings between the remained triplet excitons at the lowest triplet energy level $T_1^{TD}$, the remained triplet excitons are converted into triplex excitons having triplet energy levels $T_n^{TD}$ ($T_2^{TD}$, $T_3^{TD}$, $T_4^{TD}$ . . . ) higher than the lowest triplet energy level $T_1^{TD}$.

As used herein, the triplet energy levels ($T_2$, $T_3$, $T_4$ . . . ) higher than the lowest triplet level $T_1$ among the excited state triplet energy level are collectively referred to as "$T_n$". Further, the triplet energy level $T_n$ higher than the lowest triplet energy level $T_1$ among the excited state triplet energy level is referred to as a hot triplet energy level. Moreover, the exciton at the hot triplet energy level is referred to as a hot triplet exciton.

Figure 4:
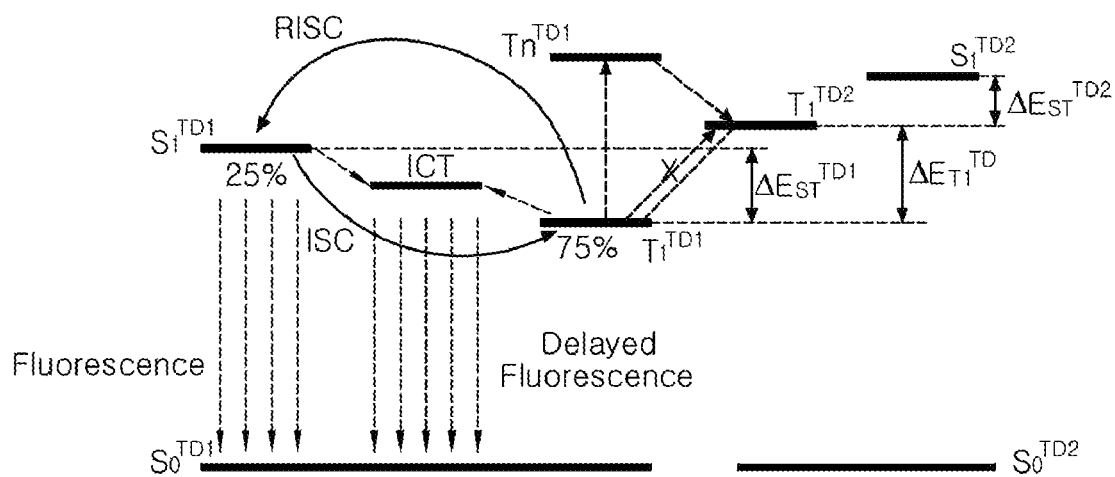
FIG. 4 is a schematic diagram illustrating luminous mechanism in case of using a plurality of delayed fluorescent materials having different excited state triplet energy levels in accordance with an exemplary embodiment of the present disclosure.

The hot triplet exciton has higher energy than the exciton at the excited state triplet energy level $T_1^{TD}$ which is the lowest energy level among the excited state triplet energy levels. Since the hot triplet exciton can destroy other molecular bonds and are unstable, it can reduce the luminescence life span of the delayed fluorescent material. In other words, the hot triplet exciton owing to triplet-triplet annihilation is one of the causes of the life span reduction of the delayed fluorescent material. On the other hand, the EML 360 in the OLED 300 includes first and second delayed fluorescent dopants whose triplet energy levels are adjusted. FIG. 4 is a schematic diagram illustrating luminous mechanism in case of using a plurality of delayed fluorescent materials having different excited state triplet energy levels in accordance with an exemplary embodiment of the present disclosure.

As illustrated in FIGS. 2 and 4, the EML 360 includes a first delayed fluorescent dopant (TD1) and a second delayed fluorescent dopant (TD2) as a delayed fluorescent material. A hot triplet exciton $T_n^{TD1}$ is generated by high temperature couplings between the excitons at the lowest excited state triplet energy level $T_1^{TD1}$ of the first delayed fluorescent dopant by the luminescence mechanism of the first delayed fluorescent dopant. The unstable hot triplet exciton $T_n^{TD1}$ is transferred to an excited state triplet energy level $T_1^{TD2}$ of the second delayed fluorescent dopant, and then the transferred exciton at the excited state triplet energy level $T_1^{TD2}$ of the second delayed fluorescent dopant is transferred again to the lowest excited state triplet energy level $T_1^{TD1}$ of the first delayed fluorescent dopant. Accordingly, the exciton energy converted to the hot triplet energy level $T_n^{TD1}$ of the first delayed fluorescent dopant where substantial luminescence is occurred is not lost by triplet-triplet annihilation, but the converted exciton energy can be transferred back to the lowest excited state triplet energy level $T_1T_{D1}$ by RISC mechanism.

The second delayed fluorescent dopant (TD2) can remove the hot triplet exciton generated by the triplet-triplet annihilation of the first delayed fluorescent dopant (TD1) to prevent the degradation of the luminescent life span due to the hot triplet exciton. In other words, the second delayed fluorescent dopant (TD2) absorbs the unstable hot triplet exciton generated in the luminescence process of the first delayed fluorescent dopant (TD1), thereby increasing the luminescence life span of the first delayed fluorescent dopant (TD1).

In this case, an energy level bandgap $\Delta E_{T1}^{TD}$ between the lowest excited state triplet energy level $T_1^{TD1}$ of the first delayed fluorescent dopant (TD1) and the excited state triplet energy level $T_1^{TD2}$ of the second delayed fluorescent dopant (TD2) is important. As an example, the second delayed fluorescent dopant (TD2) should have the excited state triplet energy level $T_1^{TD2}$ such that the triplet exciton of the lowest excited state triplet energy level $T_1^{TD1}$ which contributes to the luminescence of the first delayed fluorescent dopant (TD1), is not quenched. In addition, since the excited state triplet energy level $T_1^{TD2}$ of the second delayed fluorescent dopant must absorb the hot triplet excitons generated at the first delayed fluorescent dopant (TD1) through quenching mechanism, the excited state triplet energy level $T_1^{TD2}$ of the second delayed fluorescent dopant should be lower than the hot triplet energy level $T_n^{TD1}$ generated in the luminescent mechanism process of the first delayed fluorescent dopant (TD1).

The hot triplet exciton at the hot triplet energy level $T_n^{TD1}$ is quenched to the excited state triplet energy level $T_1^{TD2}$ of the second delayed fluorescent dopant (TD2). Then, the quenched exciton at the excited state triplet energy level $T_1^{TD2}$ of the second delayed fluorescent dopant (TD2) is quenched again to the lowest excited state triplet energy level $T_1^{TD1}$, which is lower than the excited state triplet energy level $T_1^{TD2}$, of the first delayed fluorescent dopant (TD1).

Such quenching process is occurred rapidly. Since the triplet exciton stays very short at the excited state triplet energy level $T_1^{TD2}$ of the second delayed fluorescent dopant (TD2) during the quenching process, there is rare possibility that a hot triplet exciton is generated in the second delayed fluorescent dopant (TD2).

Accordingly, the second delayed fluorescent dopant (TD2) should have the excited state triplet energy level $T_1^{TD2}$ that can absorb the hot triplet exciton at the hot triplet energy level $T_n^{TD1}$, which is generated by triplet-triplet annihilation of the first delayed fluorescent dopant (TD1), through an initial quenching mechanism and can transfer again the absorbed triplet exciton to the lowest excited state triplet energy level $T_1^{TD1}$ of the first delayed fluorescent dopant through a sequential quenching mechanism. In addition, the excited state triplet energy level $T_1^{TD2}$ of the second delayed fluorescent dopant (TD2) should be adjusted so that it cannot directly absorb the triplet exciton generated at the lowest excited state triplet energy level $T_1^{TD1}$ of the first delayed fluorescent dopant (TD1). In one exemplary embodiment, the excited state triplet energy level $T_1^{TD1}$ of the first delayed fluorescent dopant (TD1) and the excited state triplet energy level $T_1^{TD2}$ of the second dopant (TD2) satisfy the following relationship in Equation (1):

$$0.1 \text{ eV} \leq T_1^{TD2} - T_1^{TD1} \leq 0.5 \text{ eV} \tag{1}$$

When the energy level bandgap $\Delta E_{T1}^{TD}$ between the excited state triplet energy level $T_1^{TD2}$ of the second delayed fluorescent dopant (TD2) and the excited state triplet energy level $T_1^{TD1}$ of the first delayed fluorescent dopant (TD1) is less than 0.1 eV, at least a part of the triplet exciton generated at the lowest excited state triplet energy level $T_1^{TD1}$ of the first delayed fluorescent dopant (TD1) is directly transferred to the excited state triplet energy level $T_1^{TD2}$ of the second delayed fluorescent dopant, and then is lost by a triplet quenching. As the amount of exciton converted to the ICT state from the lowest excited state triplet energy level $T_1^{TD1}$ of the first delayed fluorescent dopant is reduced, the luminous efficiency of the luminous materials are deteriorated. In addition, light emissions are occurred both in the first delayed fluorescent dopant (TD1) and in the second delayed fluorescent dopant (TD2) that absorbs the at least a part of the quenched triplet exciton from the first delayed fluorescent dopant (TD1). As the second delayed fluorescent dopant (TD2) as well as the first delayed fluorescent dopant (TD1) emits light simultaneously, two color lights having different emission wavelengths from each other are emitted. As a result, the whole emitted light has wide FWHM (full-width at half maximum) and the color purity can be reduced. Moreover, since the hot triplet exciton is not absorbed by the second delayed fluorescent dopant, the first delayed fluorescent dopant shows reduced luminous life span.

On the contrary, when the energy level bandgap $\Delta E_{T1}^{TD}$ between the excited state triplet energy level $T_1^{TD2}$ of the second delayed fluorescent dopant (TD2) and the excited state triplet energy level $T_1^{TD1}$ of the first delayed fluorescent dopant (TD1) is more than 0.5 eV, the second delayed fluorescent dopant (TD2) may not absorb the hot triplet exciton at the hot triplet energy level $T_n^{TD1}$, which is generated by triplet-triplet annihilation of the first delayed fluorescent dopant, by the exciton quenching mechanism.

In another exemplary embodiment, the excited triplet energy level $T_1^{TD1}$ of the first delayed fluorescent dopant (TD1) and the excited state triplet energy level $T_1^{TD2}$ of the second delayed fluorescent dopant (TD2) may satisfy the following relationship in Equation (2):

$$0.1 \text{ eV} \leq T_1^{TD2} - T_1^{TD1} \leq 0.3 \text{ eV} \tag{2}$$

Figure 5:
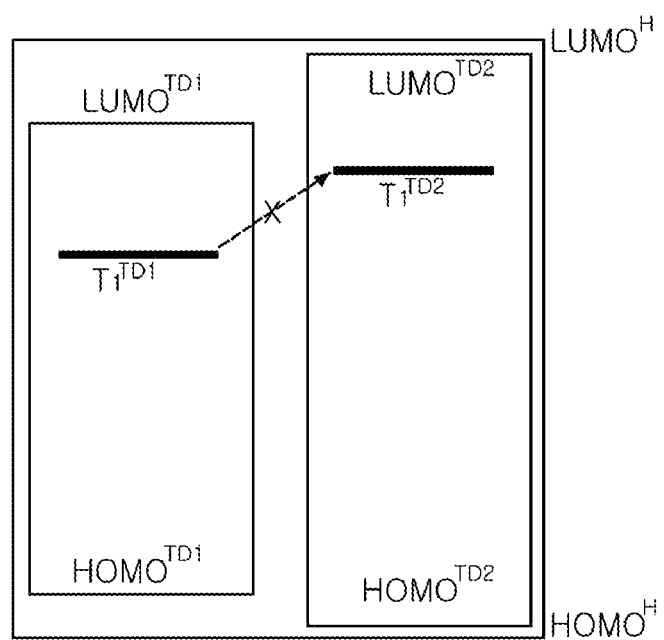
FIG. 5 is a schematic diagram illustrating HOMO and LUMO energy level relationships among luminous materials in accordance with an exemplary embodiment of the present disclosure.

Moreover, when the EML 360 includes the luminous materials such as the first host, the first delayed fluorescent dopant and the second delayed fluorescent dopant, highest occupied molecular orbital (HOMO) energy levels and/or lowest unoccupied molecular orbital (LUMO) energy levels among those luminous materials are considered as another important factor to realize efficient luminescence in the EML 360. FIG. 5 is a schematic diagram illustrating HOMO and LUMO energy level relationships among luminous materials in accordance with an exemplary embodiment of the present disclosure.

As illustrated schematically in FIG. 5, a HOMO energy level HOMO$^H$ of the first host in the EML 360 (See, FIG. 2) is equal to or deeper (lower) than a HOMO energy level HOMO$^{TD2}$ of the second delayed fluorescent dopant. In other words, the HOMO energy level HOMO$^H$ of the first host and the HOMO energy level HOMO$^{TD2}$ of the second delayed fluorescent dopant should satisfy the following relationship in Equation (3):

$$\text{HOMO}^H \leq \text{HOMO}^{TD2} \tag{3}$$

In addition, the second delayed fluorescent dopant should not interfere with the luminescence mechanism of the first delayed fluorescent dopant. With regard such a purpose, a HOMO energy level HOMO$^{TD1}$ of the first delayed fluorescent dopant is shallower (or higher) than the HOMO energy level HOMO$^{TD2}$ of the second delayed fluorescent dopant. As an example, the HOMO energy level HOMO$^{TD1}$ of the first delayed fluorescent dopant and the HOMO energy level HOMO$^{TD2}$ of the second delayed fluorescent dopant satisfy the following relationship in Equation (4):

$$\text{HOMO}^{TD1} - \text{HOMO}^{TD2} > 0.03 \text{ eV} \tag{4}$$

When the HOMO energy levels of the first host, the first delayed fluorescent dopant and the second delayed fluorescent dopant satisfy the relationships in Equations (3) and (4), the holes injected into the first host can be injected into the first delayed fluorescent dopant via the second delayed fluorescent dopant. Accordingly, the holes are recombined with electrons at the first delayed fluorescent dopant irrespective of the second delayed fluorescent dopant so that light emission can be occurred at the first delayed fluorescent dopant. As an example, the HOMO energy level HOMO$^H$ of the first host and/or the HOMO energy level HOMO$^{TD2}$ of the second delayed fluorescent dopant may be deeper than the HOMO energy level HOMO$^{TD1}$ of the first delayed fluorescent dopant by at least about 0.1 eV.

On the contrary, when the HOMO energy level HOMO$^{TD2}$ of the second delayed fluorescent dopant is equal to or shallower (or higher) than the HOMO energy level HOMO$^{TD1}$ of the first delayed fluorescent dopant, the holes injected via the first host is trapped at the second delayed fluorescent dopant. Accordingly, as an excited complex, i.e. exciplex is formed between the first delayed fluorescent dopant absorbing electron excitons and the second delayed fluorescent dopant trapping holes, ultimate light emission peak is shifted toward longer wavelength ranges, and life span of the delayed fluorescent dopants are reduced.

In another exemplary embodiment, the HOMO energy level HOMO$^{TD1}$ of the first delayed fluorescent dopant and the HOMO energy level HOMO$^{TD2}$ of the second delayed fluorescent dopant may satisfy the following relationship in Equation (5):

$$0.04 \text{ eV} \leq \text{HOMO}^{TD1} - \text{HOMO}^{TD2} < 1.0 \text{ eV} \tag{5}$$

When the HOMO energy levels HOMO$^{TD1}$ and HOMO$^{TD2}$ of the first and second delayed fluorescent dopants satisfy the relationship in Equation (5), holes injected from the first host can be transferred to the first delayed fluorescent dopant rapidly without trapping at the second delayed fluorescent dopant.

Moreover, a LUMO energy level LUMO$^H$ of the first host in the EML 360 is equal to or shallower than a LUMO energy level LUMO$^{TD2}$ of the second delayed fluorescent dopant. In other words, the LUMO energy level LUMO$^H$ of the first host and the LUMO energy level LUMO$^{TD2}$ of the second delayed fluorescent dopant satisfy the following relationship in Equation (6):

$$\text{LUMO}^H \geq \text{LUMO}^{TD2} \tag{6}$$

In addition, the second delayed fluorescent dopant should not interfere with the luminescence mechanism of the first delayed fluorescent dopant. With regard to such a purpose, a LUMO energy level LUMO$^{TD1}$ of the first delayed fluorescent dopant is deeper than the LUMO energy level LUMO$^{TD2}$ of the second delayed fluorescent dopant. As an example, the LUMO energy level LUMO$^{TD1}$ of the first delayed fluorescent dopant and the LUMO energy level LUMO$^{TD2}$ of the second delayed fluorescent dopant satisfy the following relationship in Equation (7):

$$\text{LUMO}^{TD2} - \text{LUMO}^{TD1} > 0.05 \text{ eV} \tag{7}$$

When the LUMO energy levels of the first host, the first and second delayed fluorescent dopants satisfy the relationships in Equations (6) and (7), electrons injected to the first host can be injected into the first delayed fluorescent dopant via the second delayed fluorescent dopant. Accordingly, the electrons are recombined with holes at the first delayed fluorescent dopant irrespective of the second delayed fluorescent dopant so that light emission can be occurred at the first delayed fluorescent dopant. As an example, the LUMO energy level LUMO$^H$ of the first host and/or the LUMO energy level $LUMO^{TD2}$ of the second delayed fluorescent dopant may be shallower than the LUMO energy level $LUMO^{TD1}$ of the first delayed fluorescent dopant by at least about 0.1 eV.

On the contrary, when the LUMO energy level $LUMO^{TD2}$ of the second delayed fluorescent dopant is equal to or deeper (or lower) than the LUMO energy level $LUMO^{TD1}$ of the first delayed fluorescent dopant, the electrons injected via the first host is trapped at the second delayed fluorescent dopant. Accordingly, as an exciplex is formed between the first delayed fluorescent dopant absorbing hole excitons and the second delayed fluorescent dopant trapping electrons, ultimate light emission peak is shifted toward longer wavelength ranges, and life span of the delayed fluorescent dopants are reduced.

In still another exemplary embodiment, the LUMO energy level $LUMO^{TD1}$ of the first delayed fluorescent dopant and the LUMO energy level $LUMO^{TD2}$ of the second delayed fluorescent dopant may satisfy the following relationship in Equation (8):

$$0.05 \text{ eV} < LUMO^{TD2} - LUMO^{TD1} < 1.0 \text{ eV} \qquad (8)$$

When the LUMO energy levels $LUMO^{TD1}$ and $LUMO^{TD2}$ of the first and second delayed fluorescent dopants satisfy the relationship in Equation (8), electrons injected from the first host can be transferred to the first delayed fluorescent dopant rapidly without trapping at the second delayed fluorescent dopant.

In one exemplary embodiment, the first delayed fluorescent dopant (TD1) may have a molecular structure in which an electron acceptor moiety and an electron donor moiety are connected via a proper linker so as to realize a delayed fluorescence. As an example, the first delayed fluorescent dopant (TD1) may an organic compound having the lowest excited state triplet energy level $T_1^{TD1}$ more than 2.6 eV. For example, the first delayed fluorescent dopant (TD1) may be an organic compound in which an electron donor moiety and an electron acceptor moiety are linked with each other at para position via a phenylene ring which may act as a linker.

In addition, the second delayed fluorescent dopant must have the excited state triplet energy level $T_1^{TD2}$ higher than the excited state triplet energy level $T_1^{TD1}$ of the first delayed fluorescent dopant so that it can absorb the unstable hot triplet exciton generated at the first delayed fluorescent dopant and can minimize or prevent the triplet exciton annihilation at the first delayed fluorescent dopant.

In one exemplary embodiment, the second delayed fluorescent dopant may be an organic compound in which an electron donor moiety and an electron acceptor moiety are connected with each other at ortho position via a phenylene linker. In this case, the organic compound may have a largely twisted molecular conformation owing to a steric hindrance between those moieties. As an example, the first delayed fluorescent dopant may include, but are not limited to, an organic compound having the following structure of Chemical Formula 1 and the second delayed fluorescent dopant may include, but are not limited to, an organic compound having the following structure of Chemical Formula 2:

Chemical Formula 1

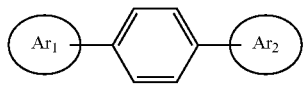

-continued

Chemical Formula 2

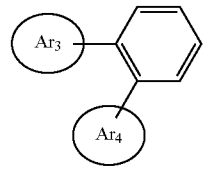

Each of $Ar_1$ in Chemical Formula 1 and $Ar_3$ in Chemical Formula 2 is independently a moiety having the following structure of Chemical Formula 3. Each of $Ar_2$ in Chemical Formula 1 and $Ar_4$ in Chemical Formula 2 is independently a moiety having the following structure of Chemical Formula 4, and Chemical Formula 1 and Chemical Formula 2 are connected to Chemical Formula 3 and Chemical Formula 4 through the (*-) in Chemical Formula 3 and Chemical Formula 4:

Chemical Formula 3

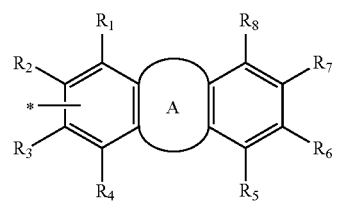

In Chemical Formula 3, each of $R_1$ to $R_8$ is independently protium, deuterium, tritium, linear or branched $C_1\sim C_{10}$ alkyl group, $C_5\sim C_{30}$ aryl group or $C_4\sim C_{30}$ hetero aryl group, or adjacent two groups among $R_1$ to $R_8$ form a $C_5\sim C_{20}$ fused aromatic ring or a $C_4\sim C_{20}$ hetero aromatic ring. A is a fused 5-membered or 6-membered hetero aromatic ring having at least one nitrogen atom within a nucleus, wherein the hetero aromatic ring of A is unsubstituted or substituted with linear or branched $C_1\sim C_{10}$ alkyl group, $C_5\sim C_{30}$ aryl group, $C_4\sim C_{30}$ hetero aryl group and combination thereof, or forms a spiro structure.

Chemical Formula 4

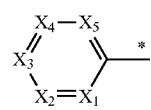

In Chemical Formula 4, each of $X_1$ to $X_5$ is independently $CR_{11}$ or N, wherein at least one of $X_1$ to $X_5$ is N, wherein $R_{11}$ is protium, deuterium, tritium, cyano group, nitro group, halogen, $C_1\sim C_{10}$ alkyl halide, $C_5\sim C_{30}$ aryl group or $C_4\sim C_{30}$ hetero aryl group. In Chemical Formulae 3 and 4.

Each of $Ar_1$ in Chemical Formula 1 and $Ar_3$ in Chemical Formula 2 independently acts as an electron donor, and each of $Ar_2$ in Chemical Formula 1 and $Ar_4$ in Chemical Formula 2 independently acts as an electron acceptor. As one example, Chemical Formula 3 is one of the following moieties:

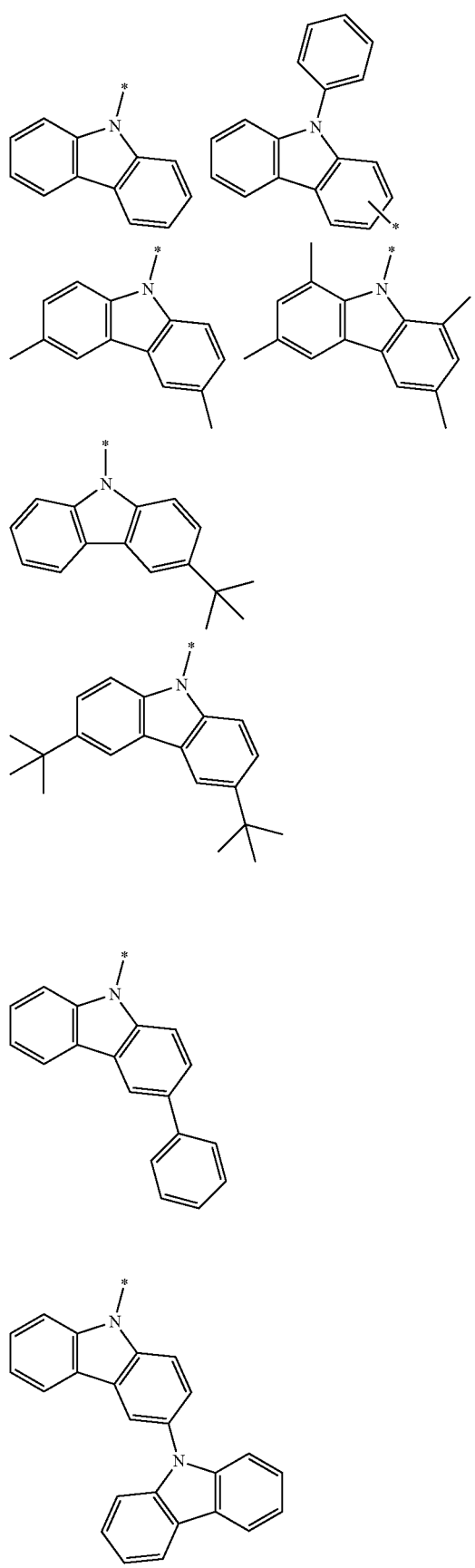
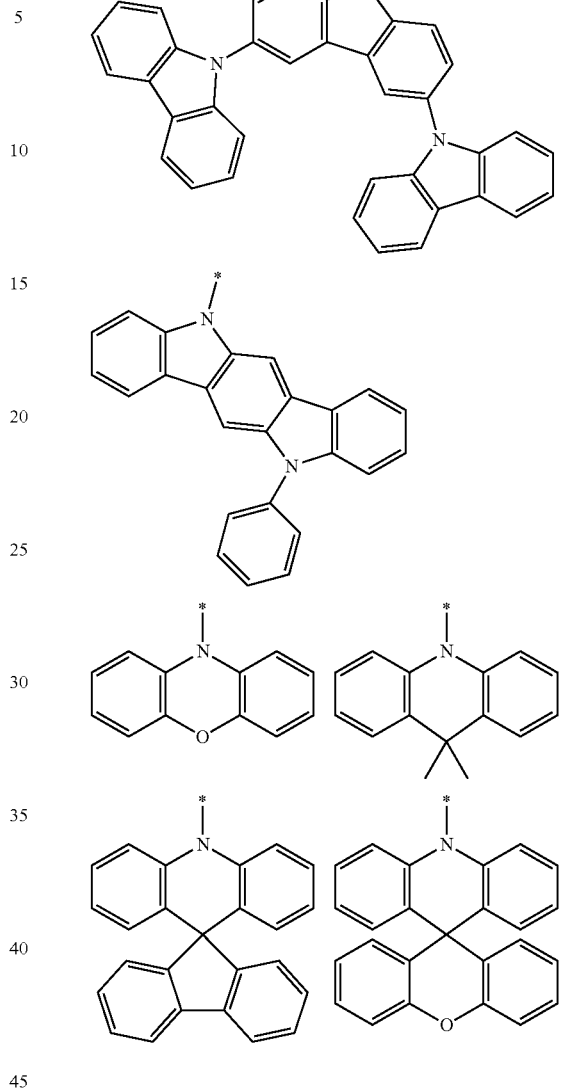
In addition, Chemical Formula 4 is any one of the following moieties:
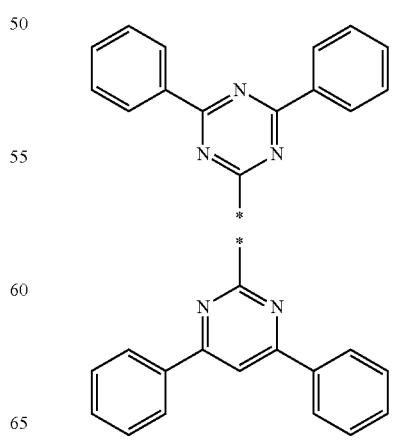

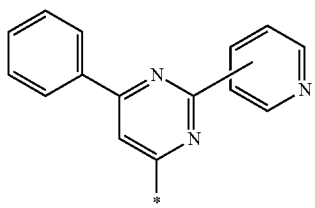
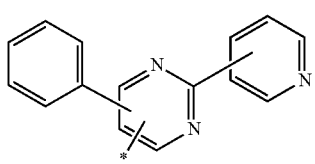
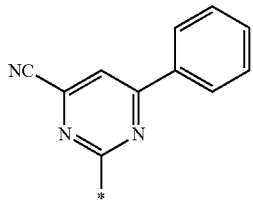
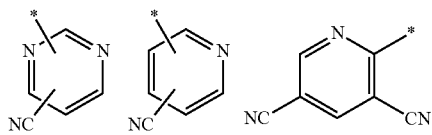
Particularly, the first delayed fluorescent dopant may include anyone having the following structure of Chemical Formula 5.
[Chemical Formula 5]
Compound 1
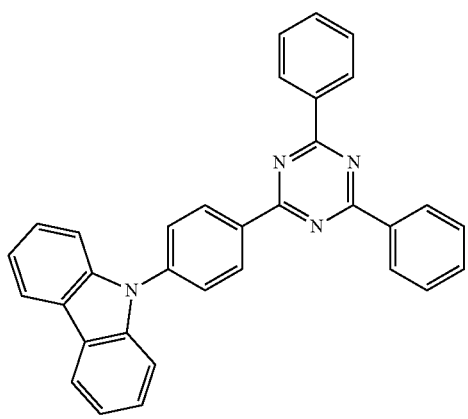
Compound 2
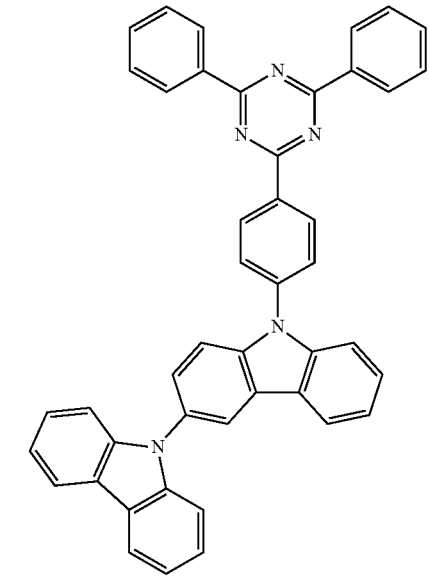
Compound 3
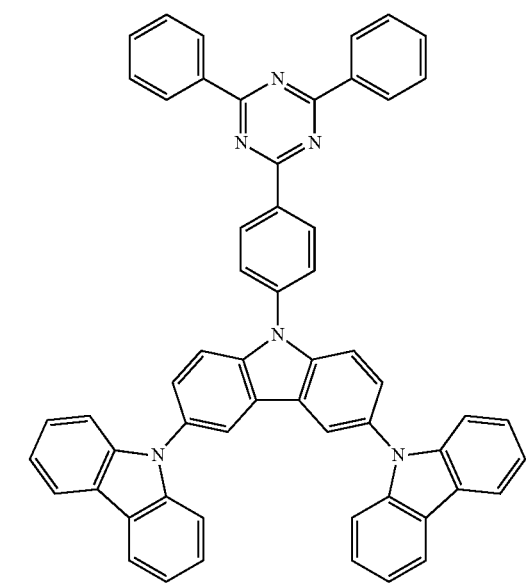
Compound 4
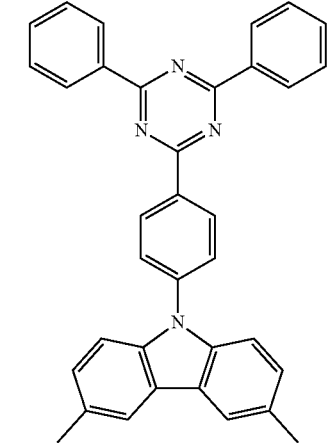

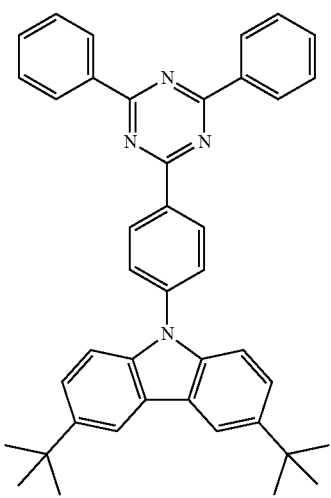
Compound 5
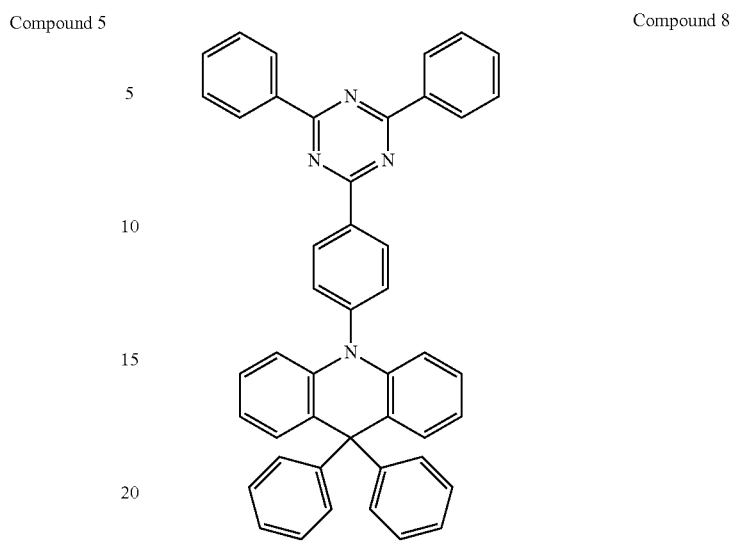
Compound 6
Compound 7
Compound 8
Compound 9
Compound 10

Compound 11
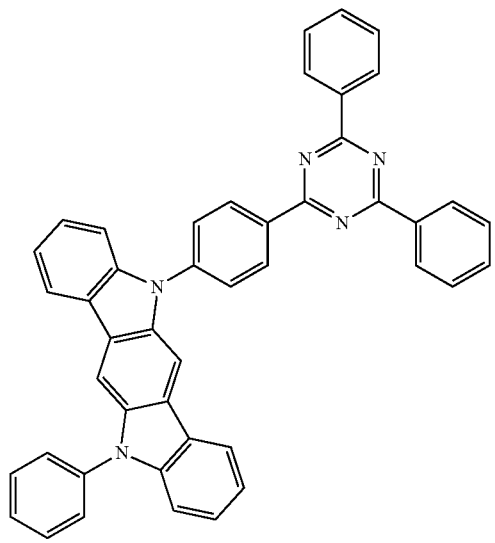
Compound 12
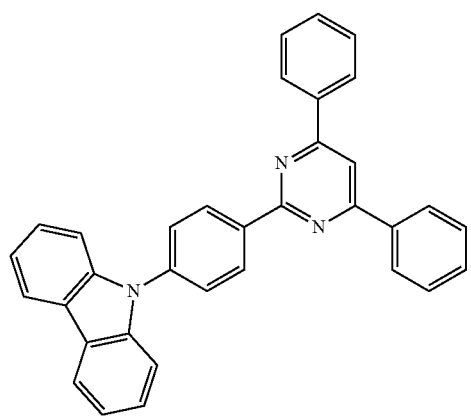
Compound 13
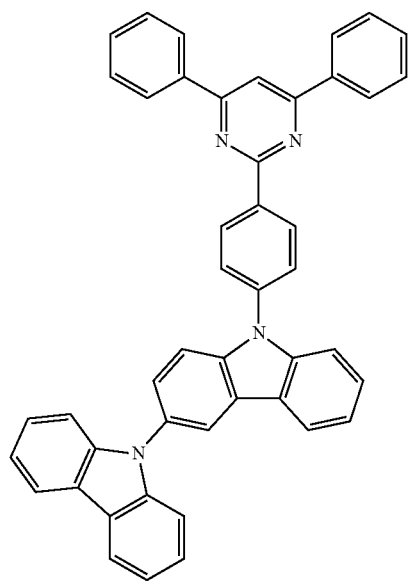
Compound 14
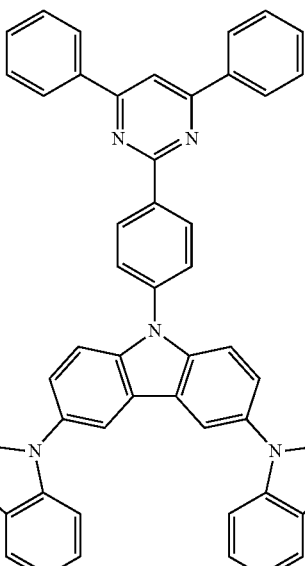
Compound 15
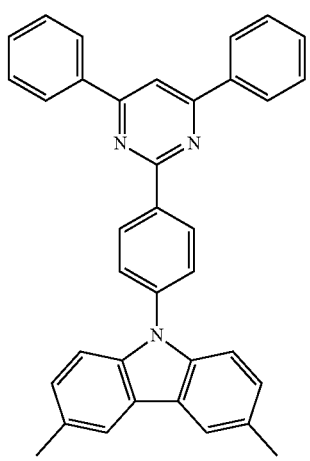
Compound 16
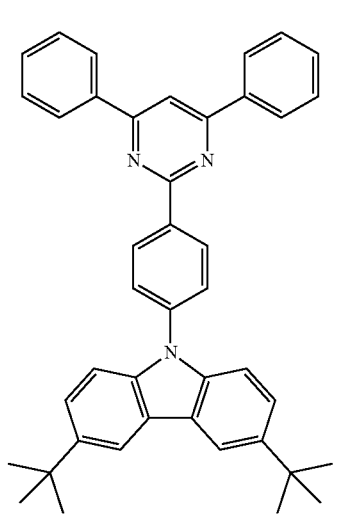

Compound 17
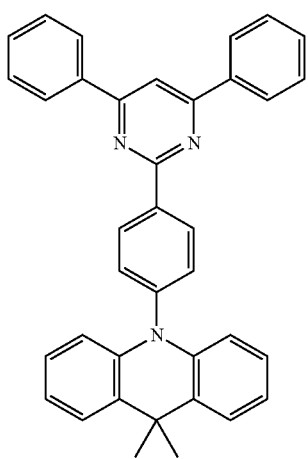
Compound 18
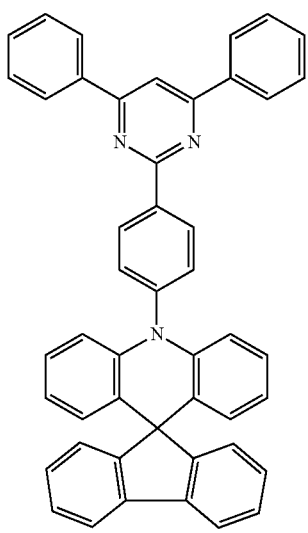
Compound 19
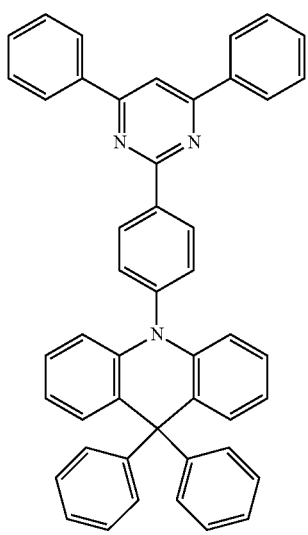
Compound 20
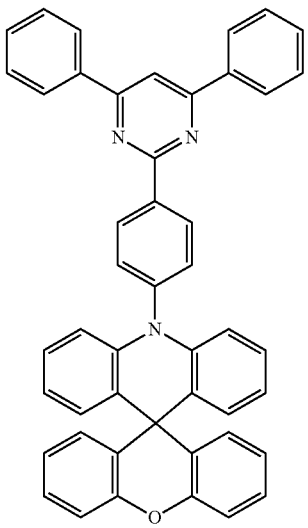
Compound 21
Compound 22
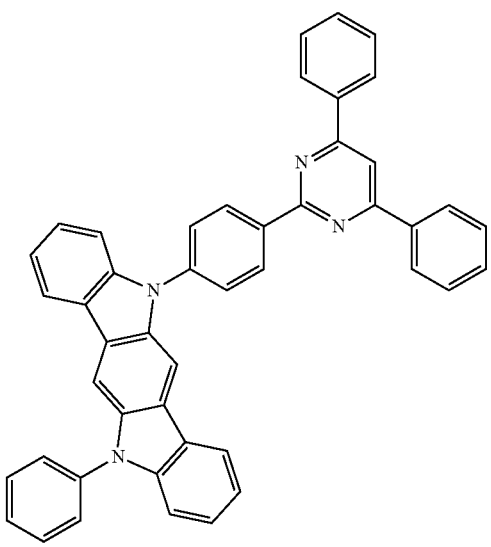

-continued
Compound 23
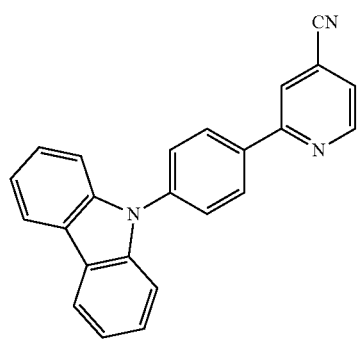
Compound 24
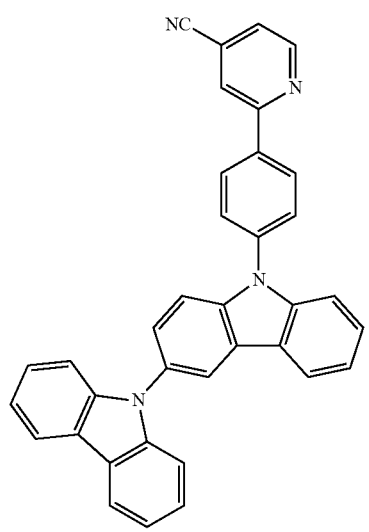
Compound 25
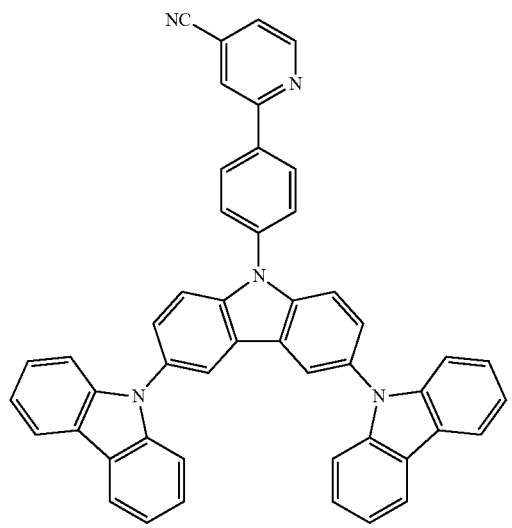
-continued
Compound 26
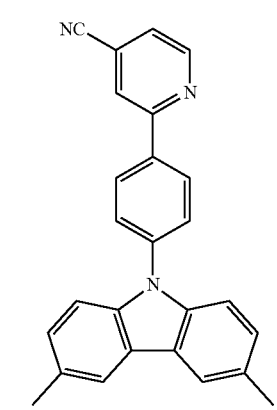
Compound 27
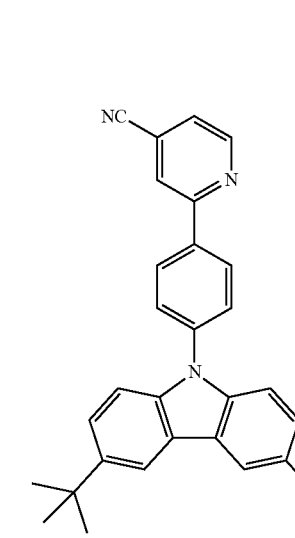
Compound 28
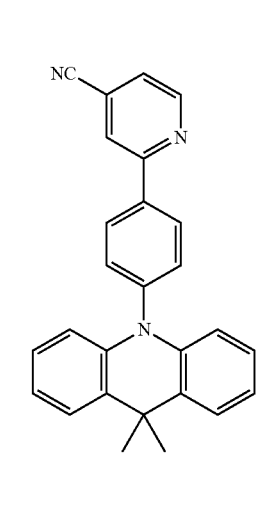

Compound 29
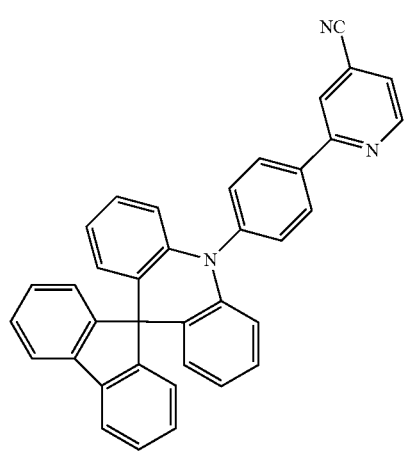
Compound 30
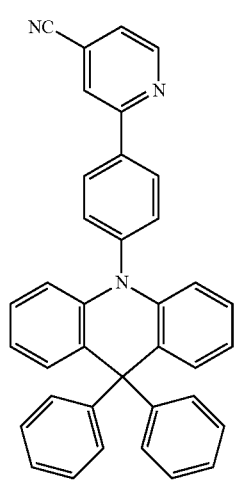
Compound 31
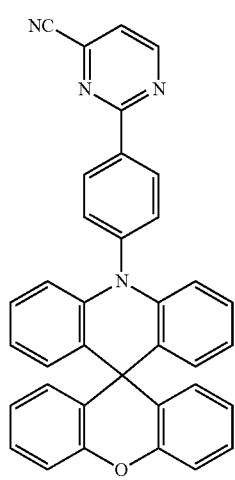
Compound 32
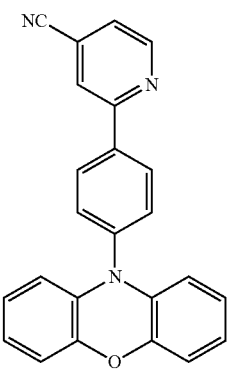
Compound 33
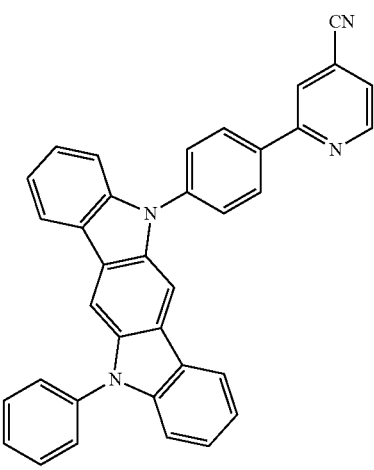
Compound 34
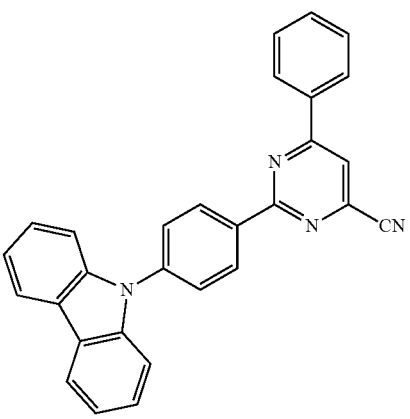

Compound 35
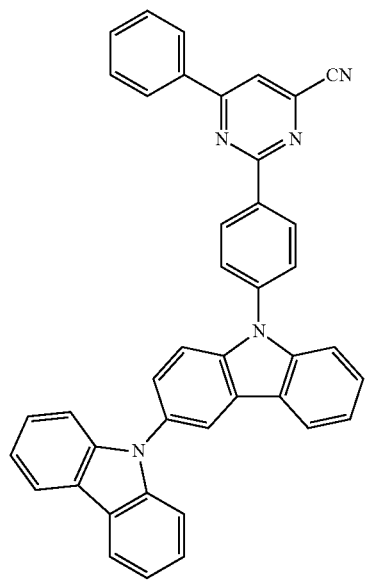
Compound 36
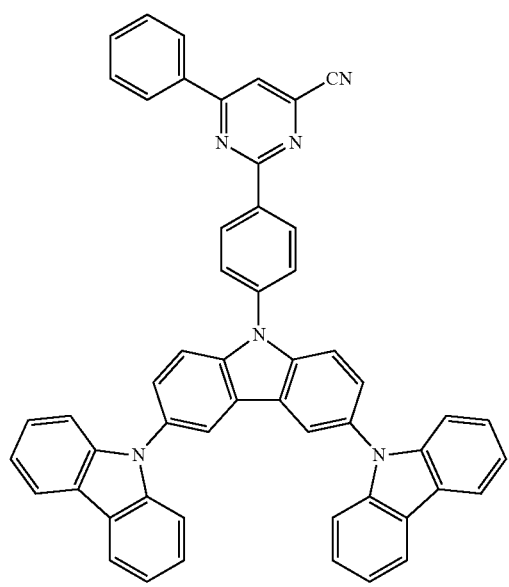
Compound 37
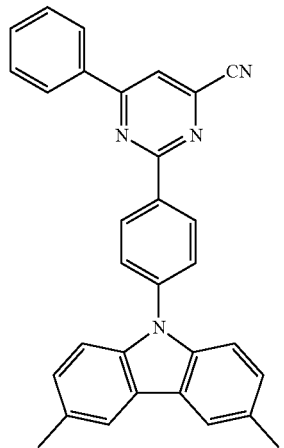
Compound 38
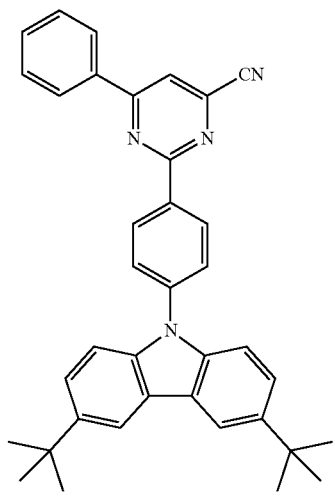
Compound 39
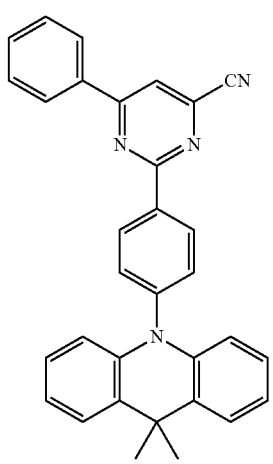
Compound 40
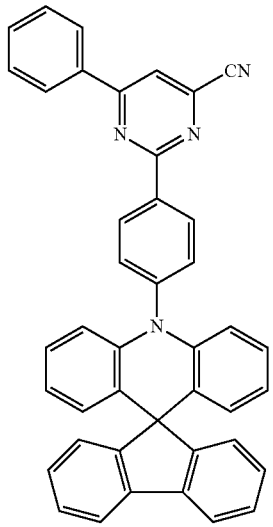

-continued
Compound 41
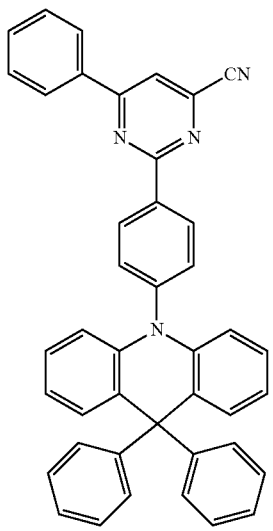
Compound 42
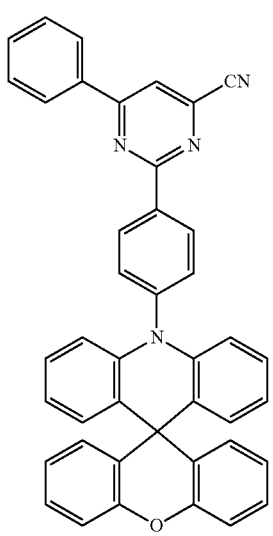
Compound 43
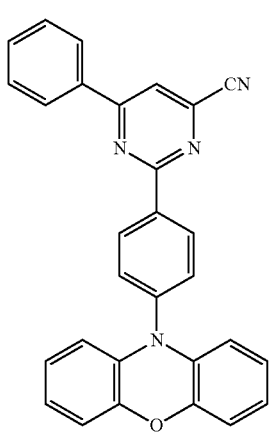
-continued
Compound 44
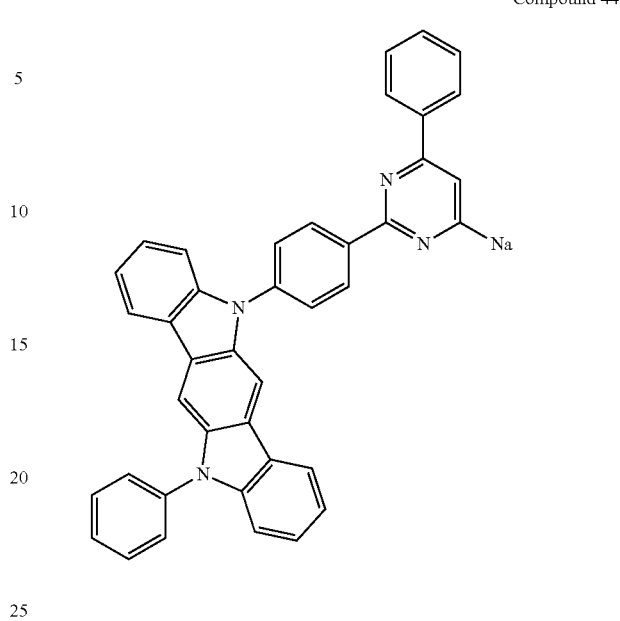
Compound 45
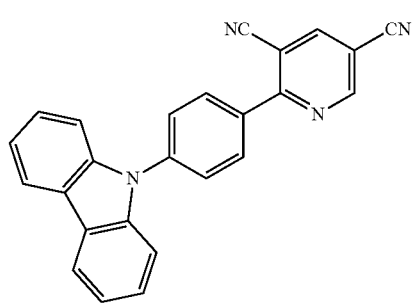
Compound 46
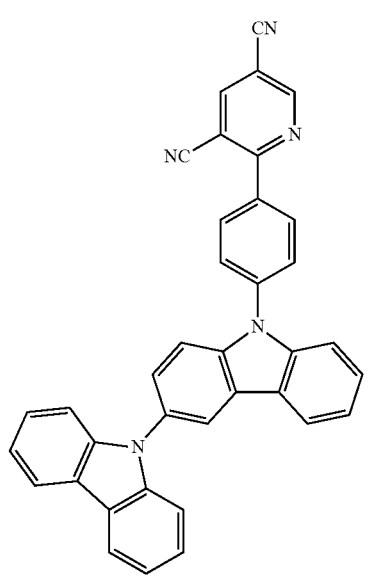

-continued
Compound 47
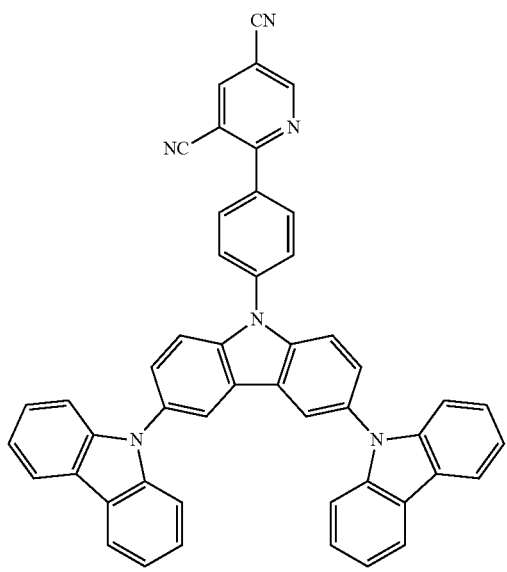
Compound 48
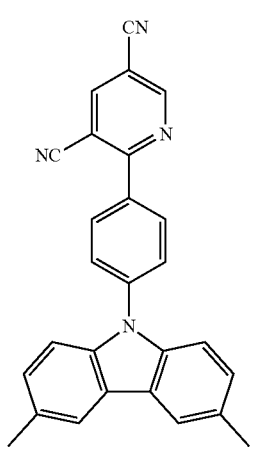
Compound 49
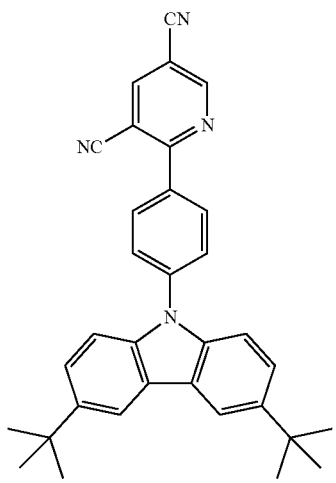
-continued
Compound 50
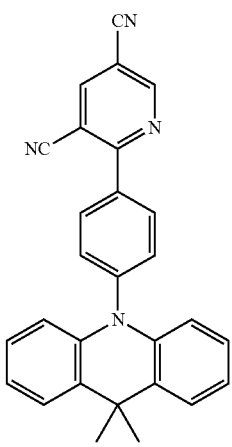
Compound 51
Compound 52

Compound 53
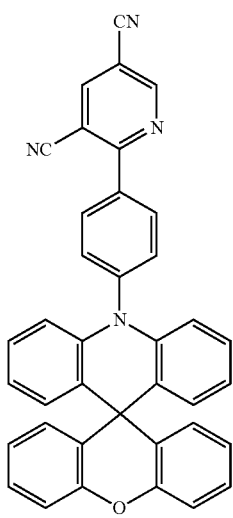
Compound 54
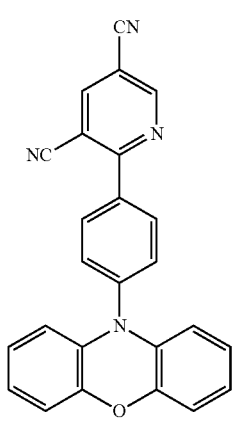
Compound 55
Compound 56
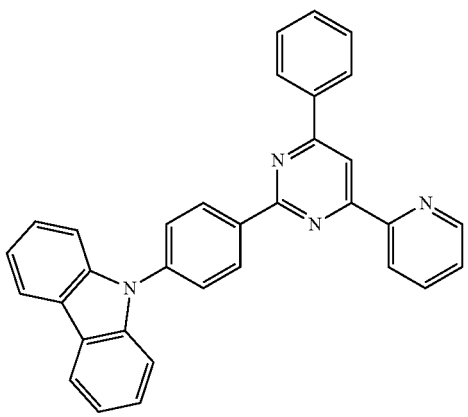
Compound 57
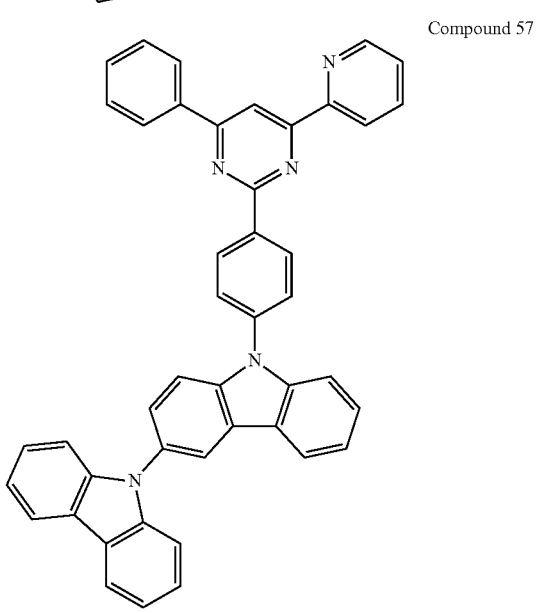
Compound 58
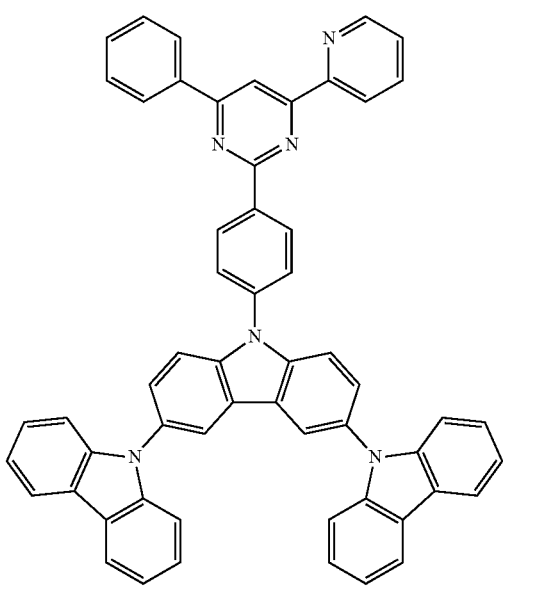

Compound 59
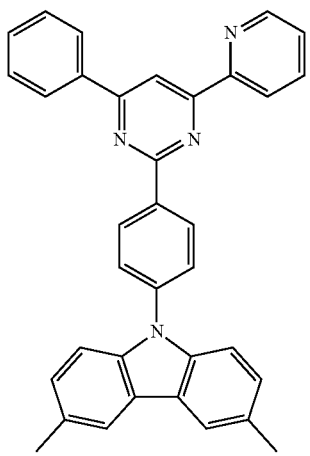
Compound 60
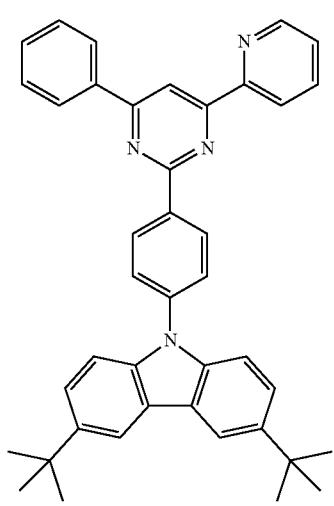
Compound 61
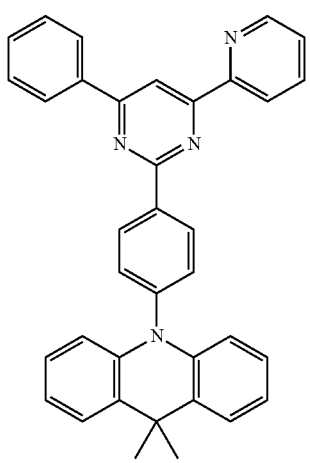
Compound 62
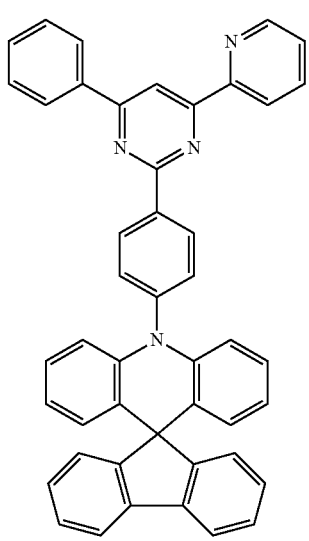
Compound 63
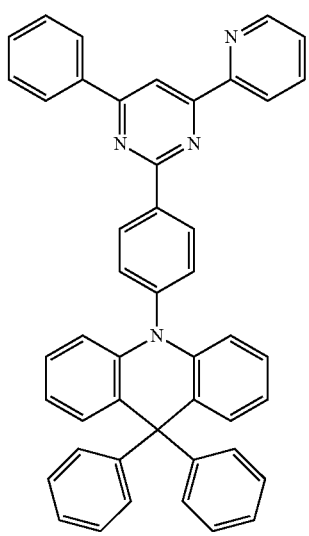
Compound 64
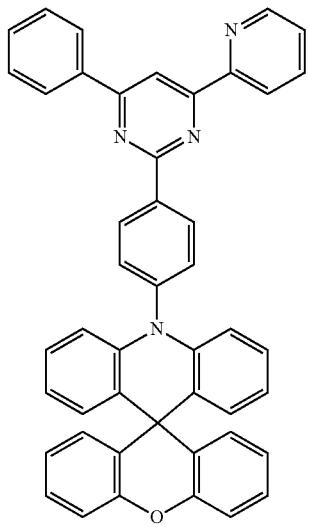

Compound 65
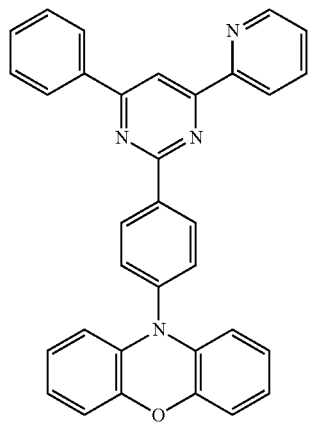
Compound 66
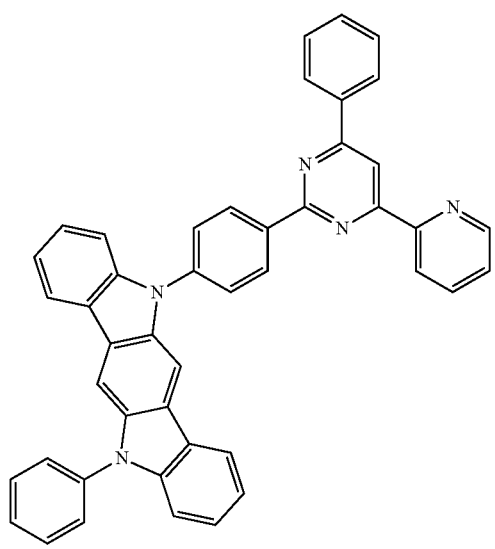
Compound 67
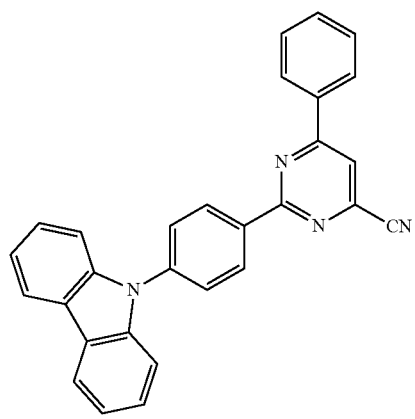
Compound 68
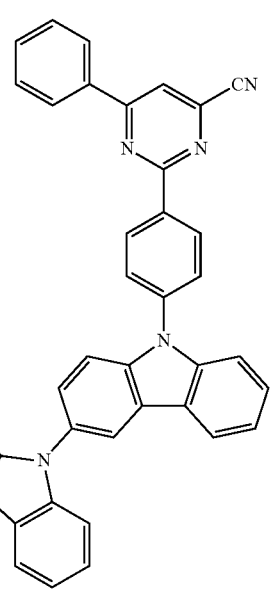
Compound 69
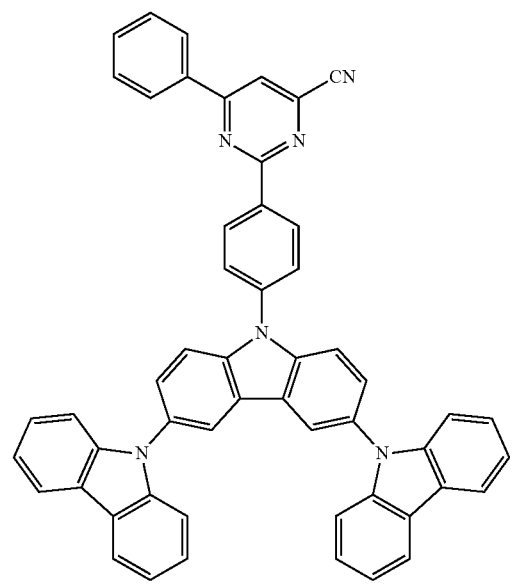
Compound 70
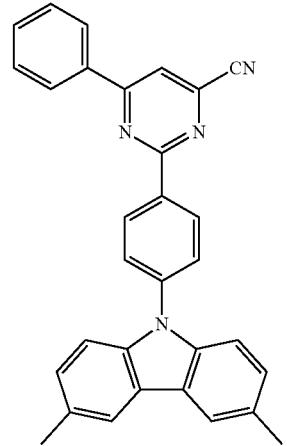

-continued
Compound 71
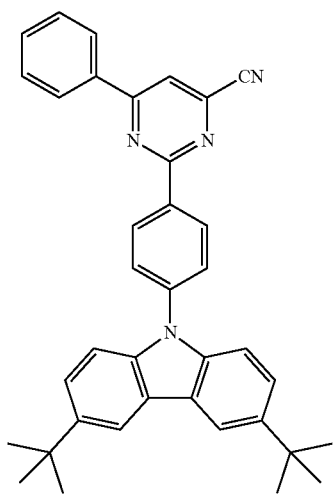
Compound 72
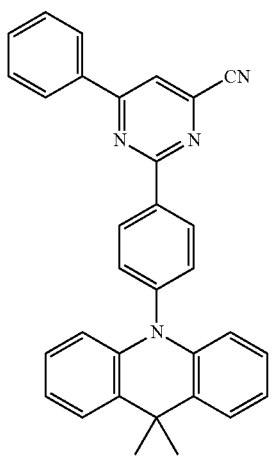
Compound 73
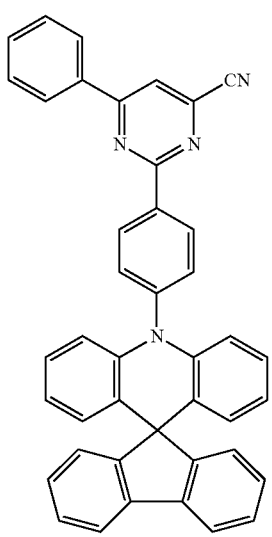
Compound 74
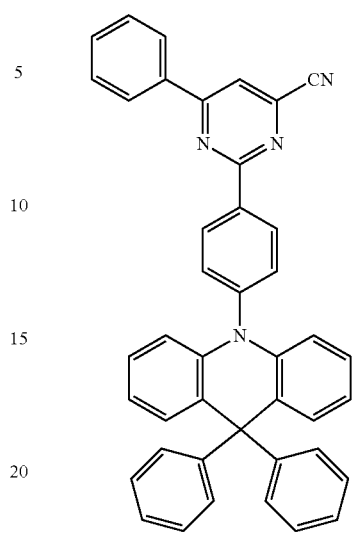
Compound 75
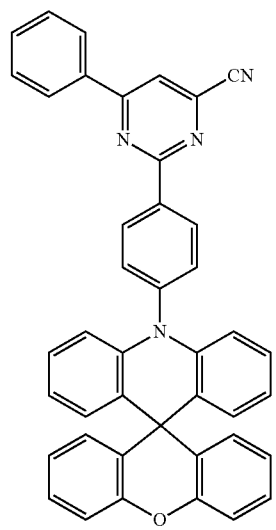
Compound 76
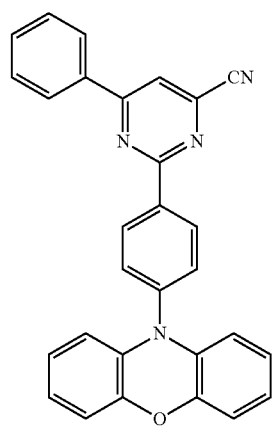

Compound 77
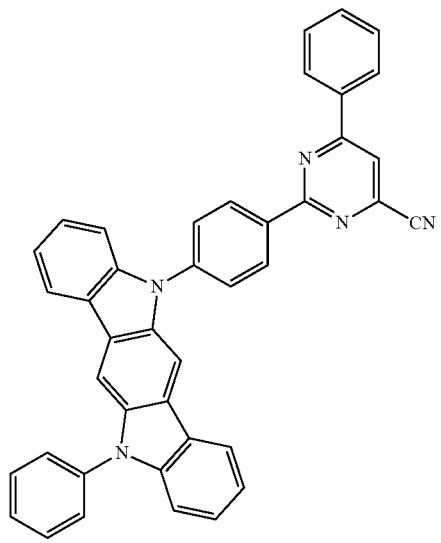
Compound 78
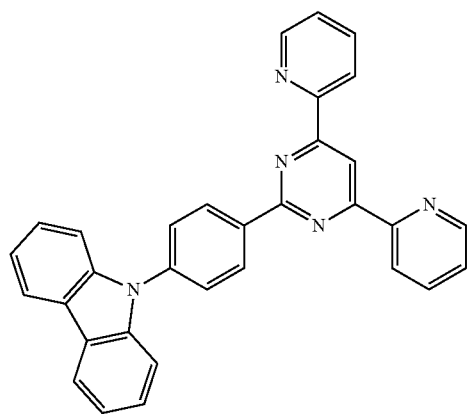
Compound 79
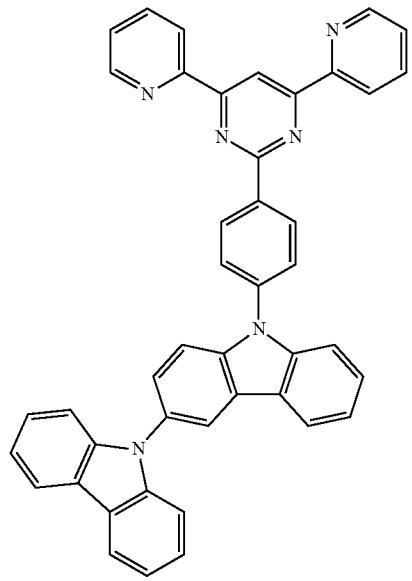
Compound 80
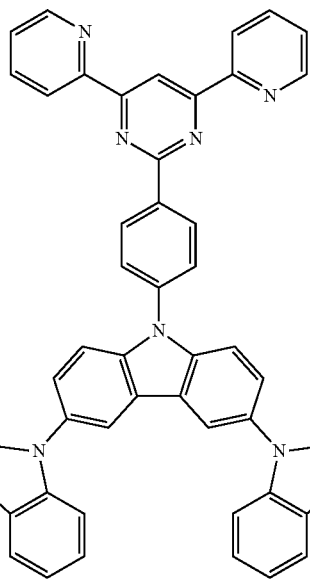
Compound 81
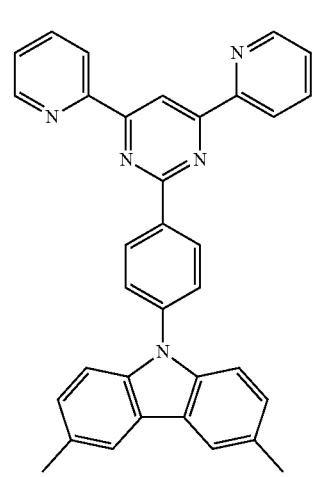
Compound 82
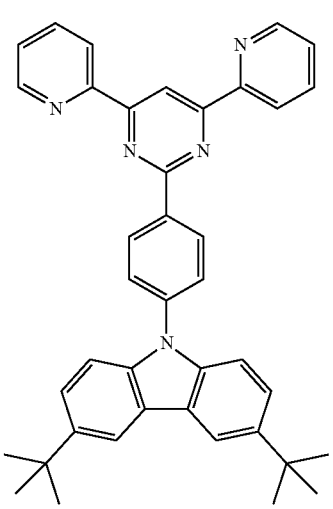

Compound 83
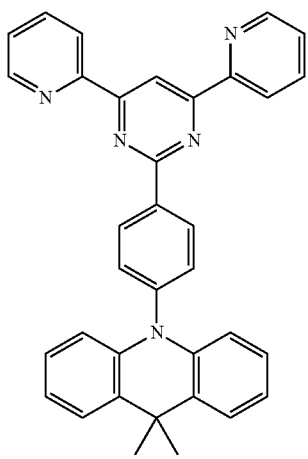
Compound 84
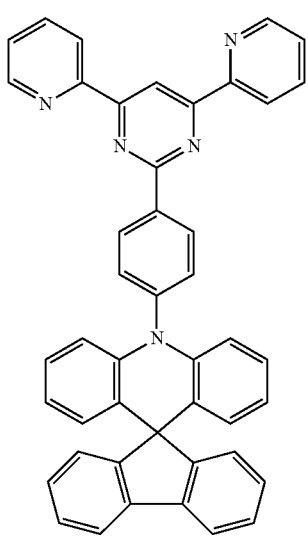
Compound 85
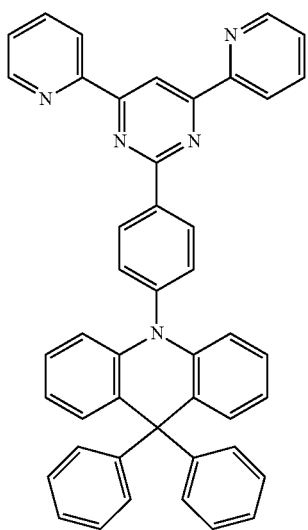
Compound 86
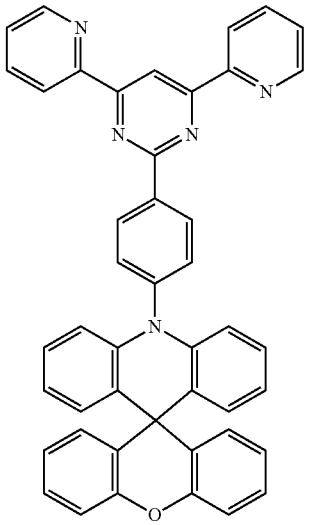
Compound 87
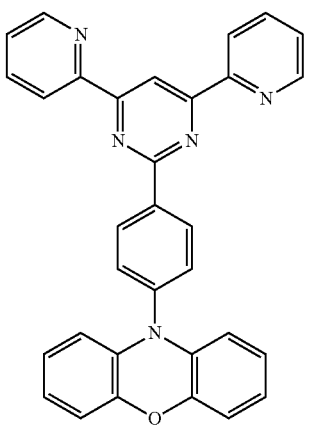
Compound 88
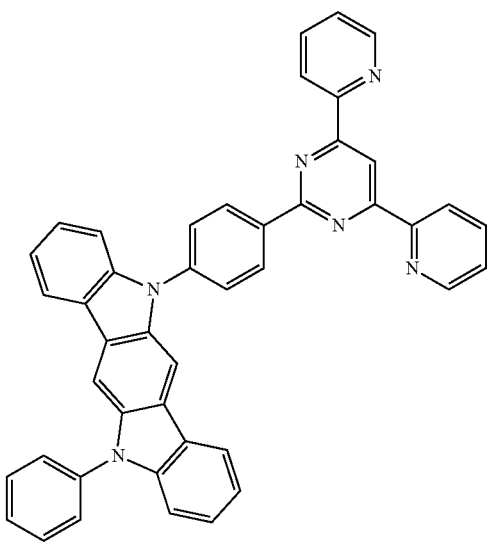
The second delayed fluorescent dopant may include anyone having the following structure of Chemical Formula 6.

Chemical Formula 6
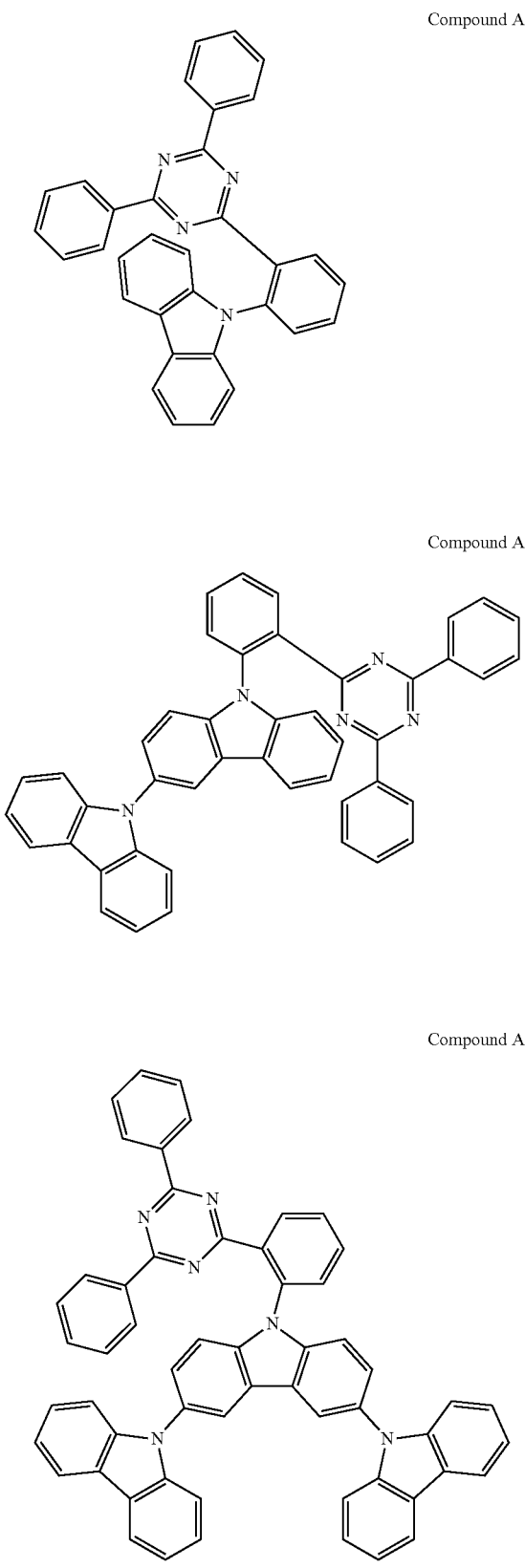
Compound A-1
Compound A-2
Compound A-3
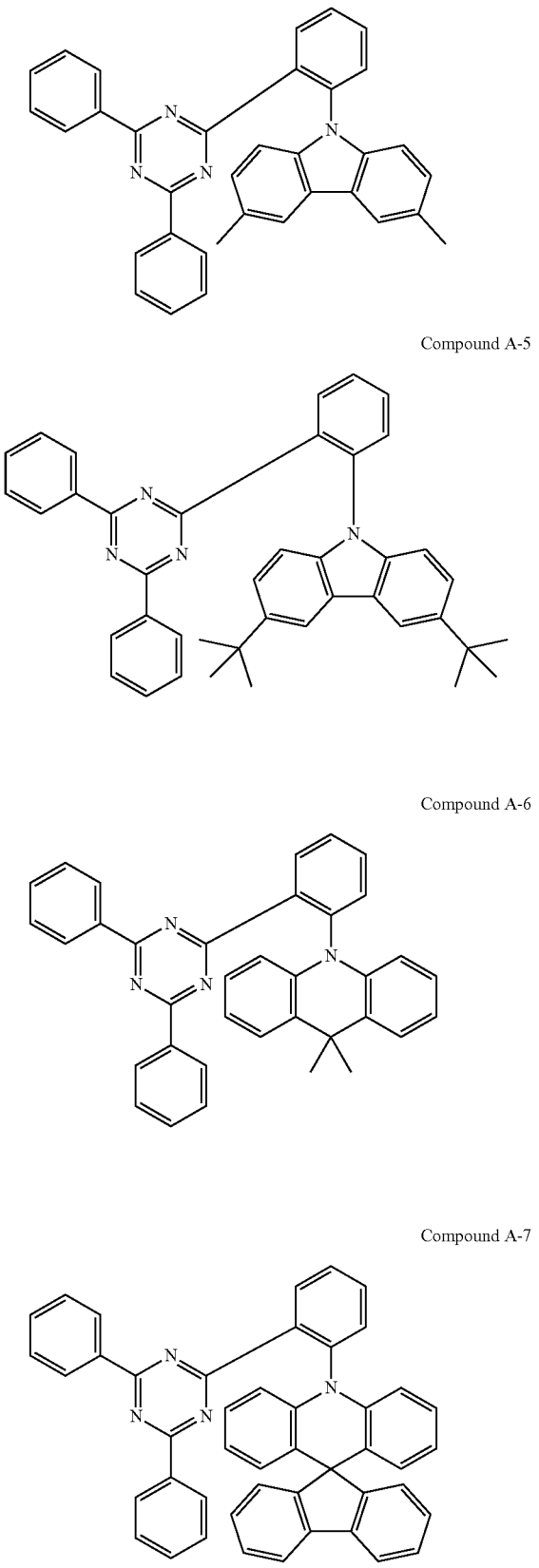
Compound A-4
Compound A-5
Compound A-6
Compound A-7

Compound A-8
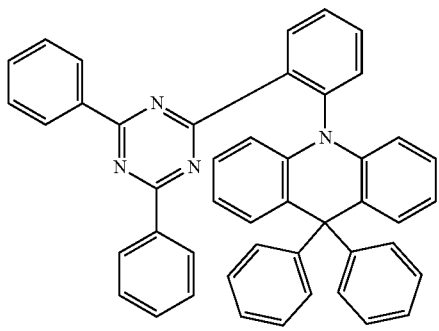
Compound A-9
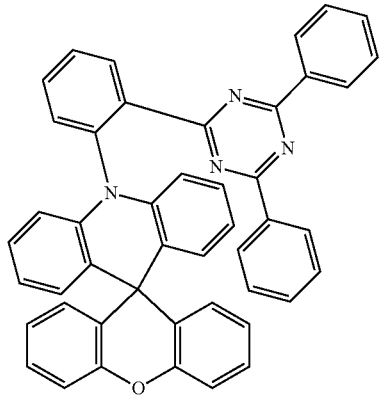
Compound A-10
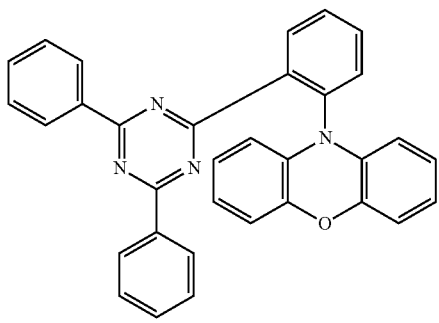
Compound A-11
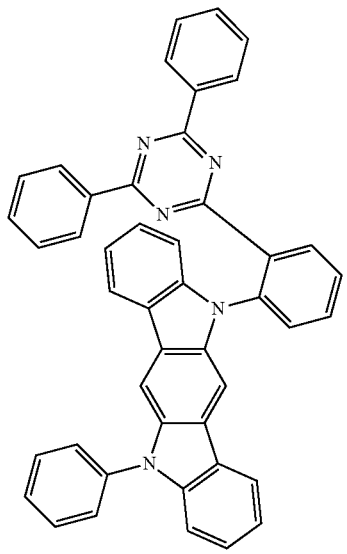
Compound A-12
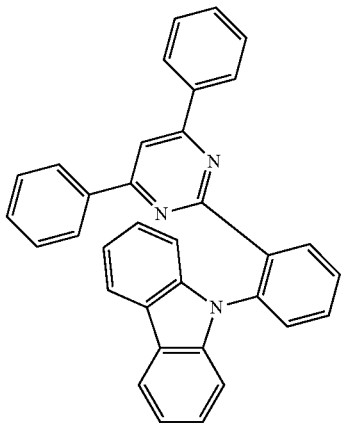
Compound A-13
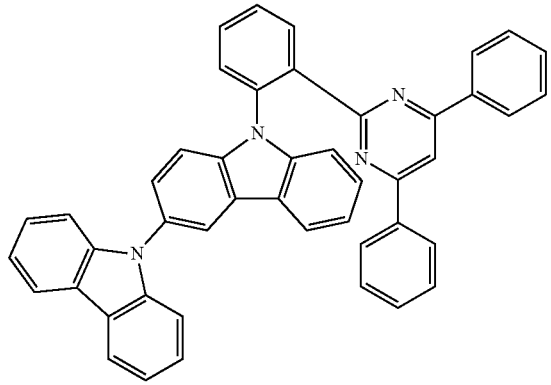
Compound A-14
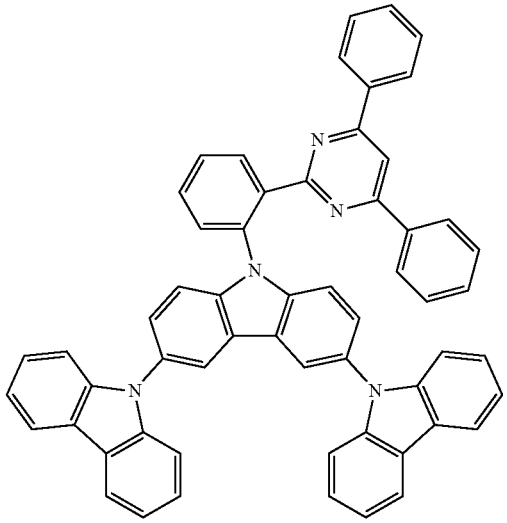

Compound A-15
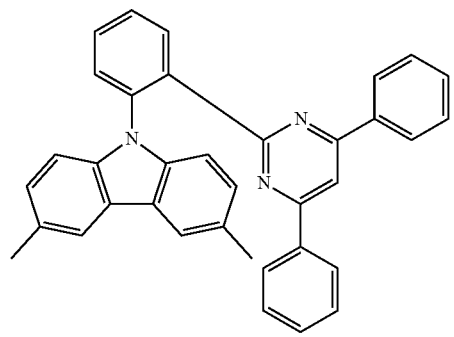
Compound A-16
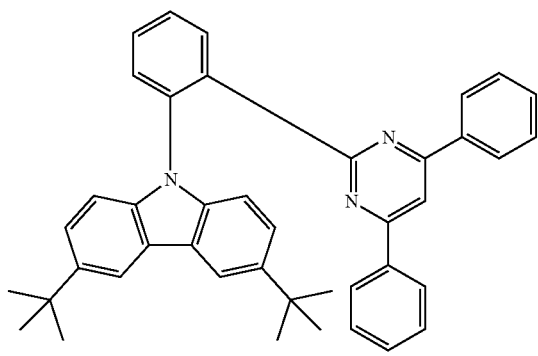
Compound A-17
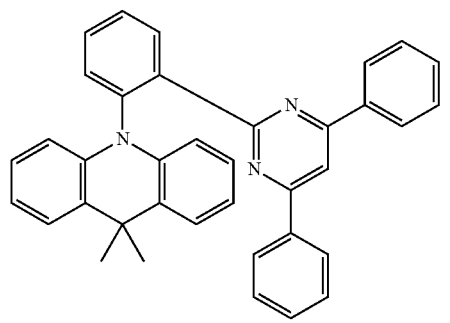
Compound A-18
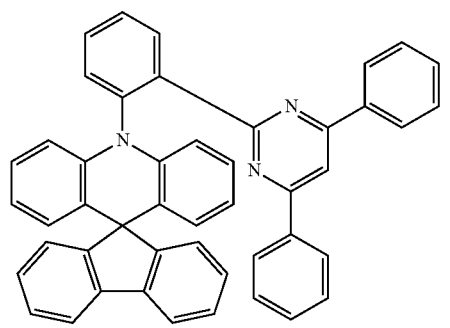
Compound A-19
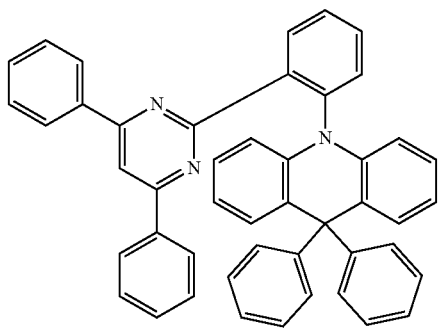
Compound A-20
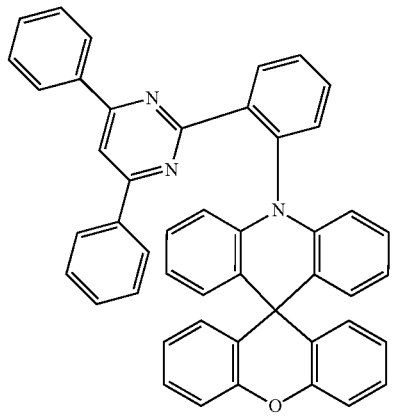
Compound A-21
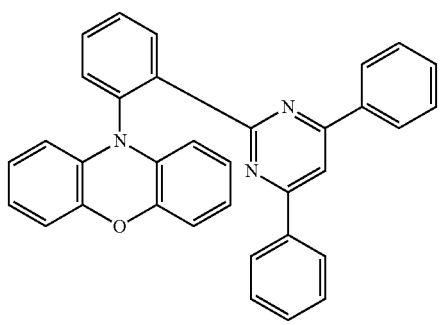

Compound A-22
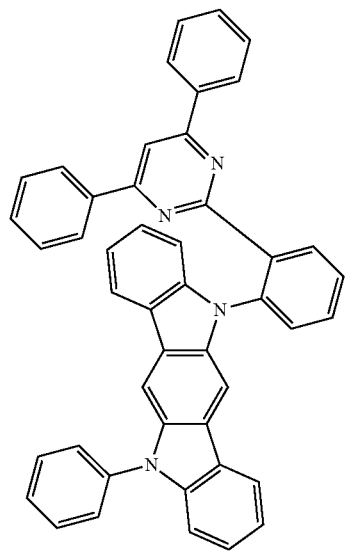
Compound A-23
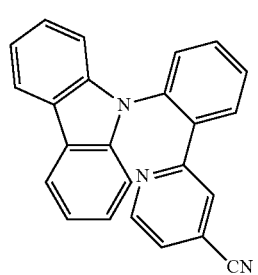
Compound A-24
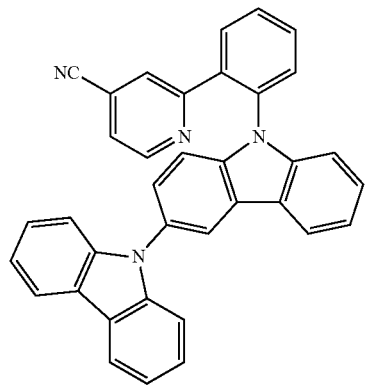
Compound A-25
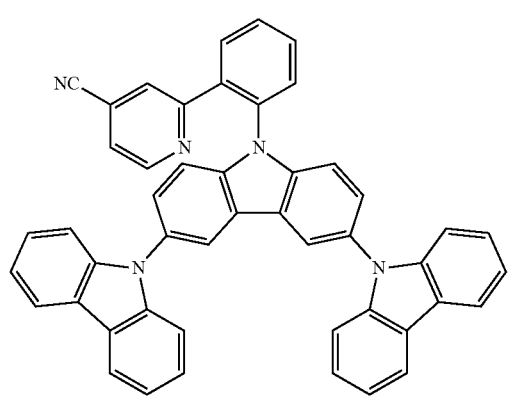
Compound A-26
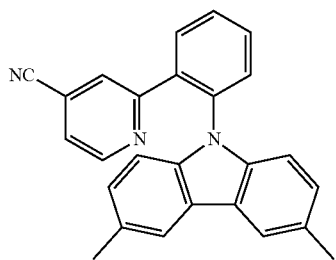
Compound A-27
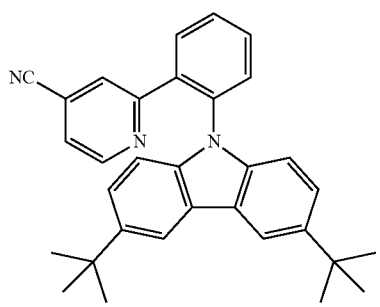
Compound A-28
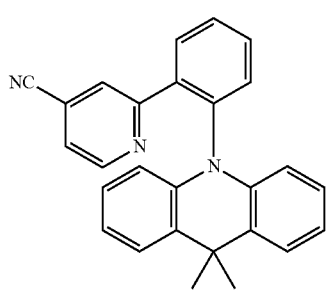
Compound A-29
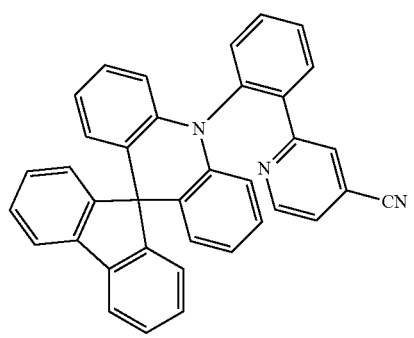
Compound A-30
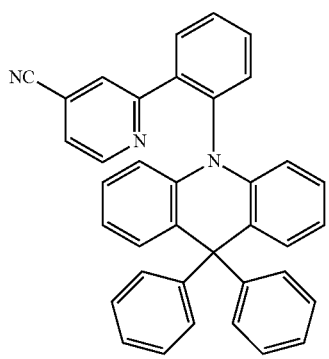

Compound A-31
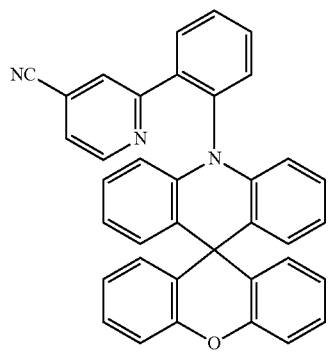
Compound A-32
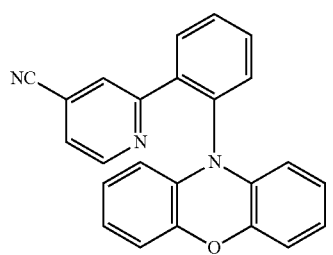
Compound A-33
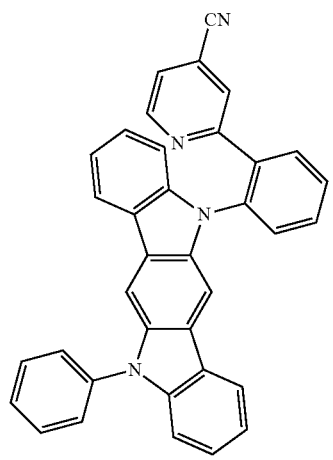
Compound A-34
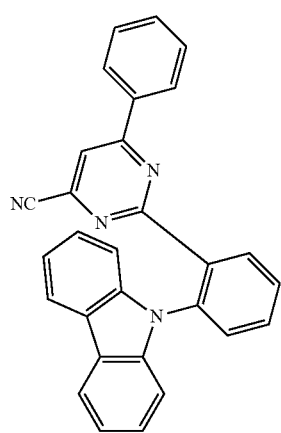
Compound A-35
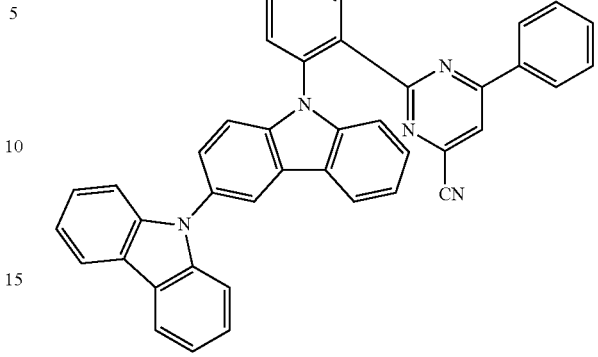
Compound A-36
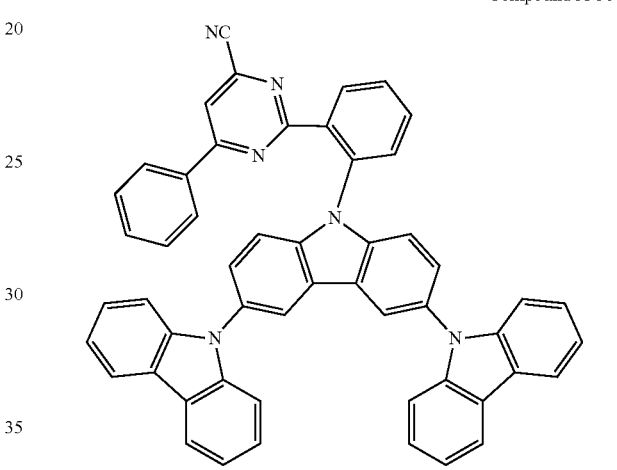
Compound A-37
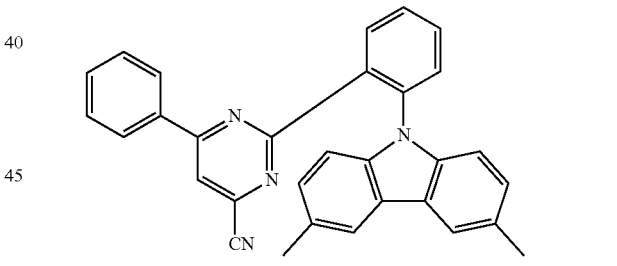
Compound A-38
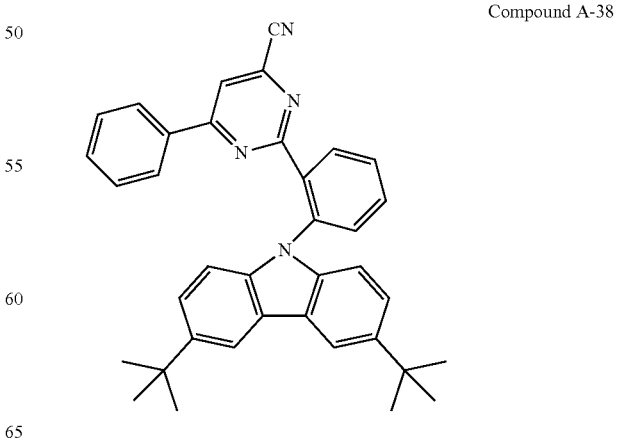

Compound A-39
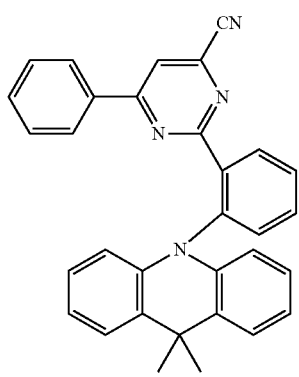
Compound A-40
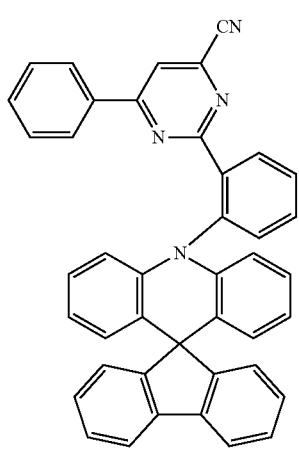
Compound A-41
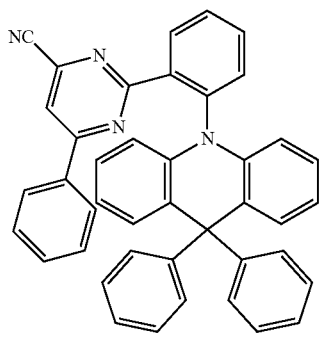
Compound A-42
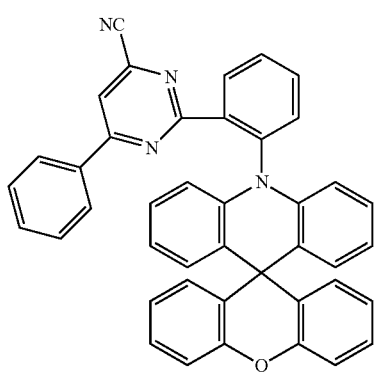
Compound A-43
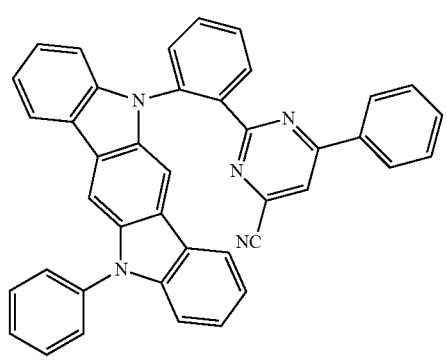
Compound A-44
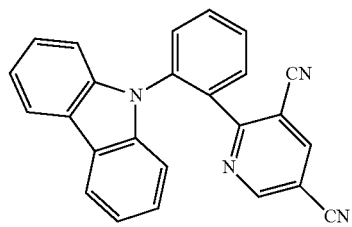
Compound A-45
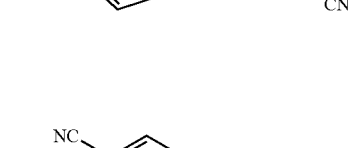
Compound A-46
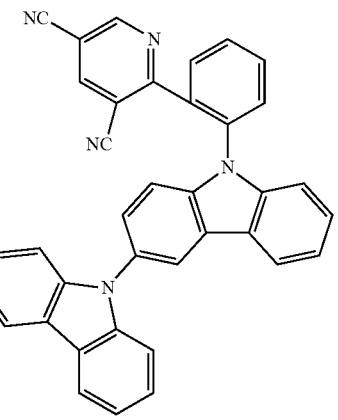

-continued
Compound A-47
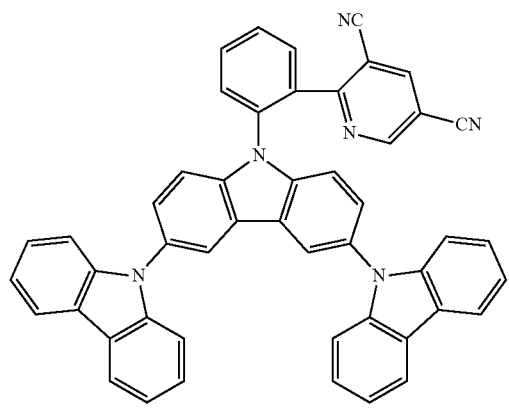
Compound A-48
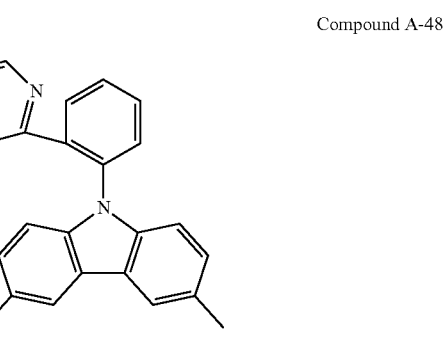
Compound A-49
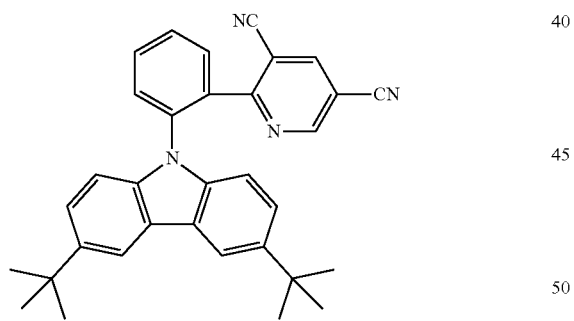
Compound A-50
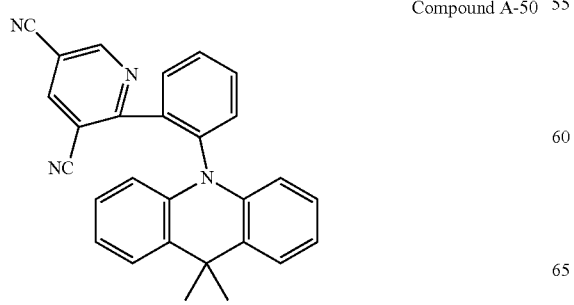
-continued
Compound A-51
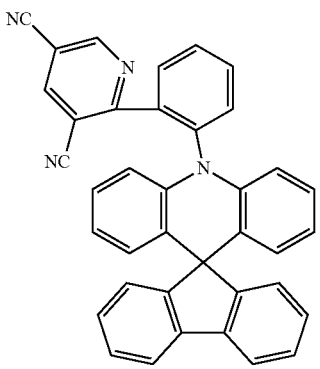
Compound A-52
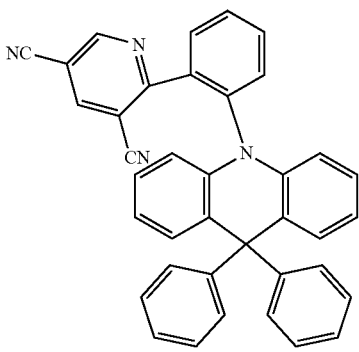
Compound A-53
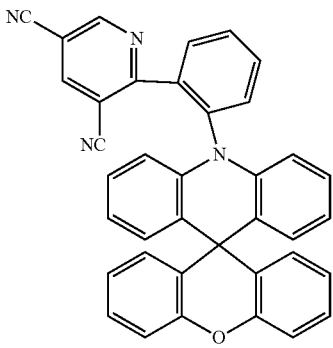
Compound A-54
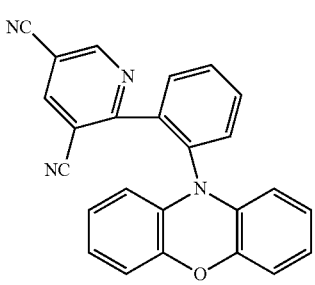

Compound A-55
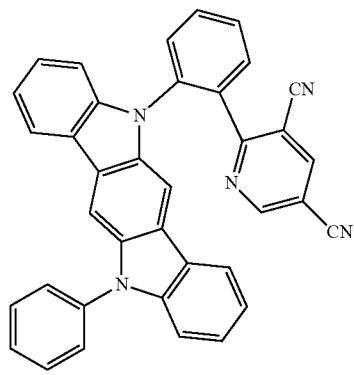
Compound A-58
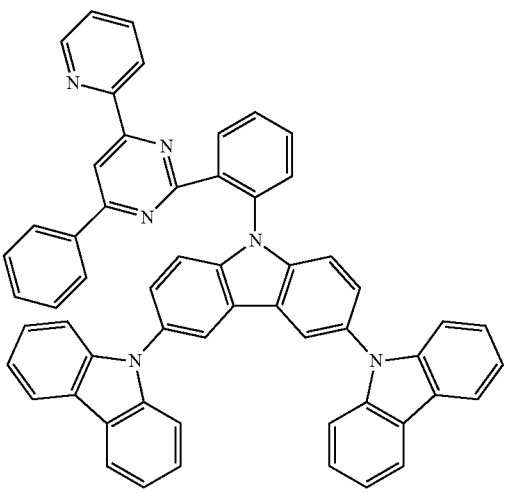
Compound A-56
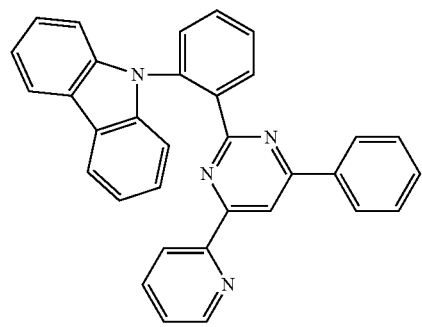
Compound A-59
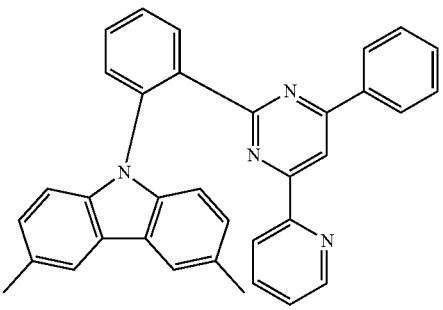
Compound A-60
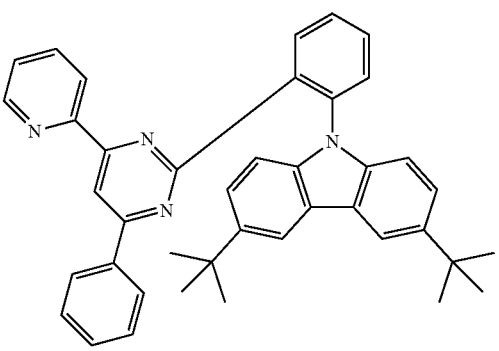
Compound A-57
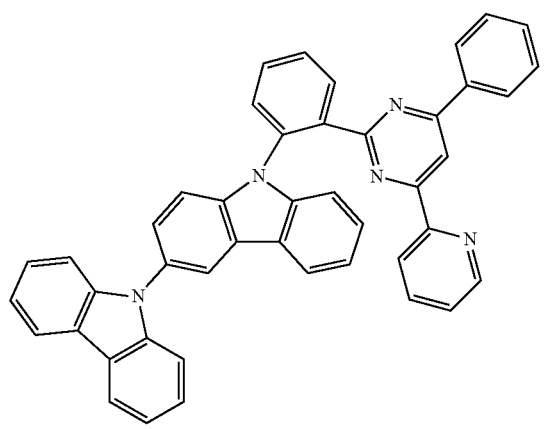
Compound A-61
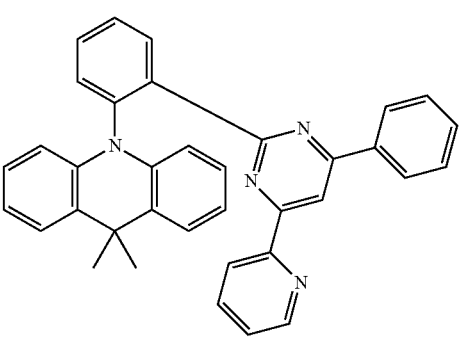

Compound A-62
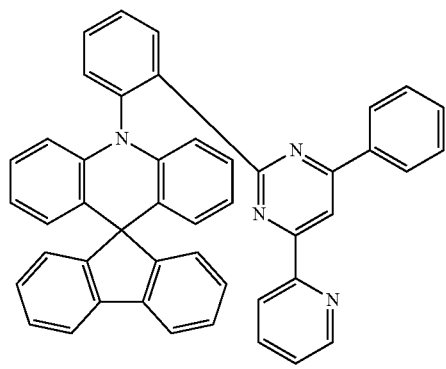
Compound A-63
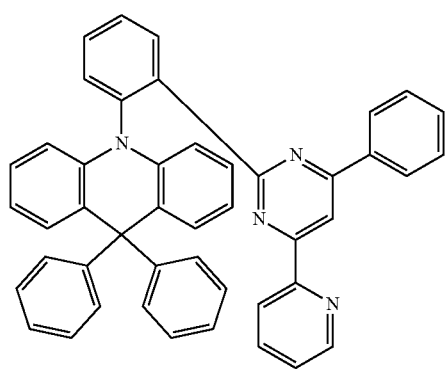
Compound A-64
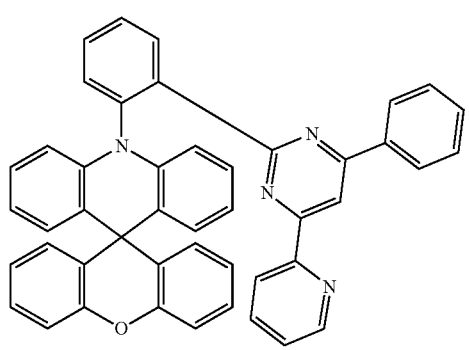
Compound A-65
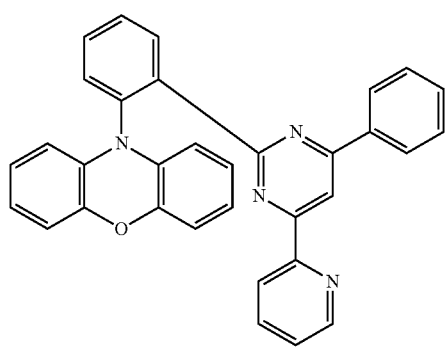
Compound A-66
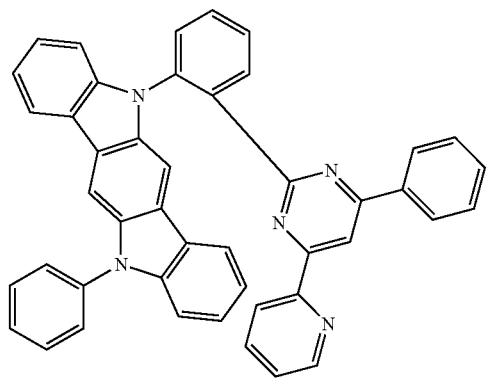
Compound A-67
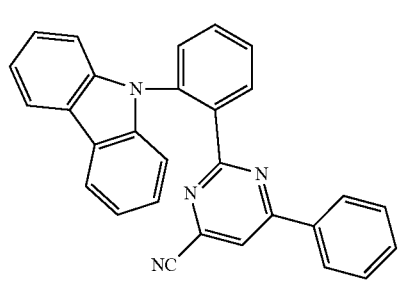
Compound A-68
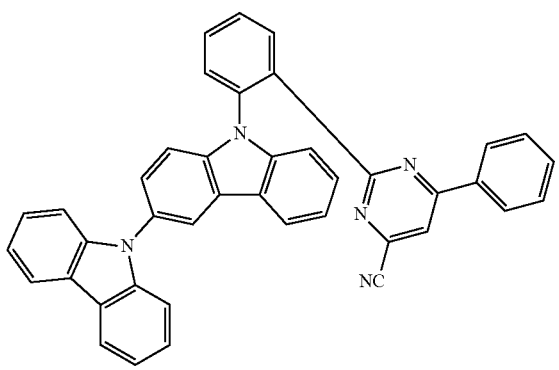
Compound A-69
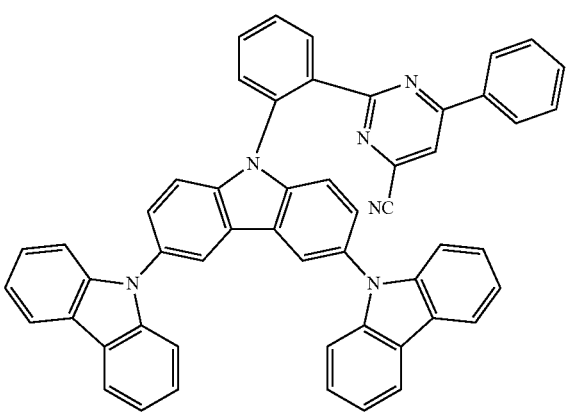

-continued
Compound A-70
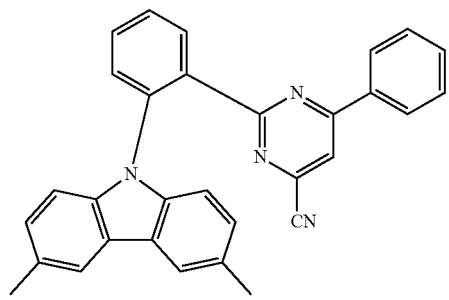
Compound A-74
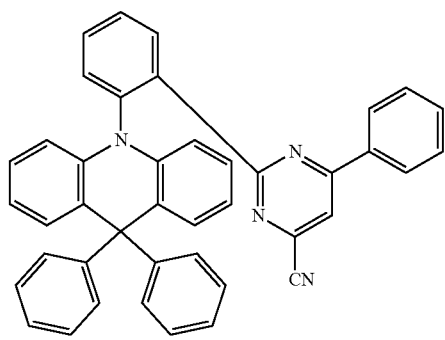
Compound A-71
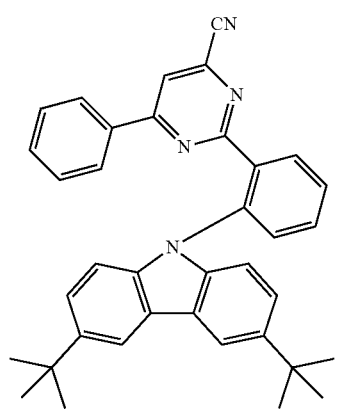
Compound A-75
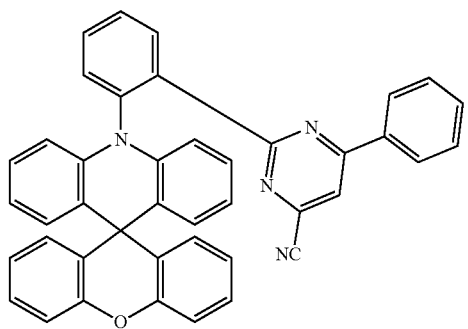
Compound A-72
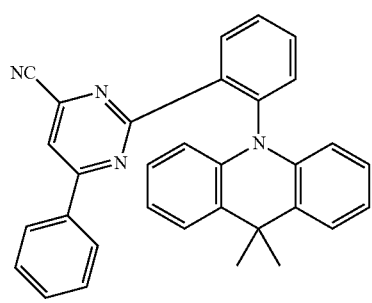
Compound A-76
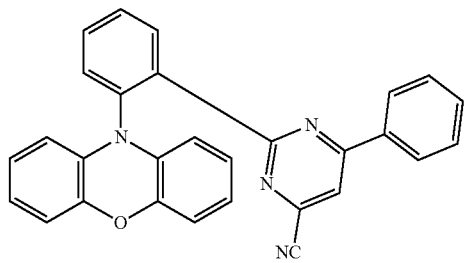
Compound A-73
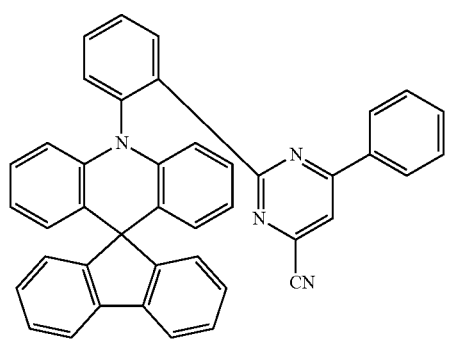
Compound A-77
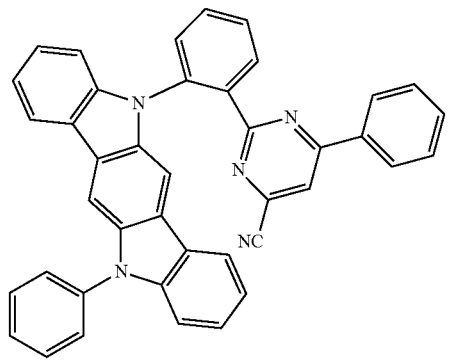

Compound A-78
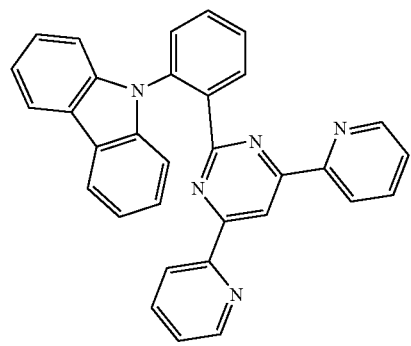
Compound A-79
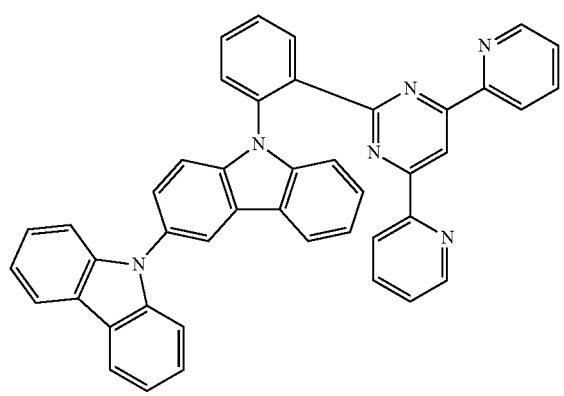
Compound A-80
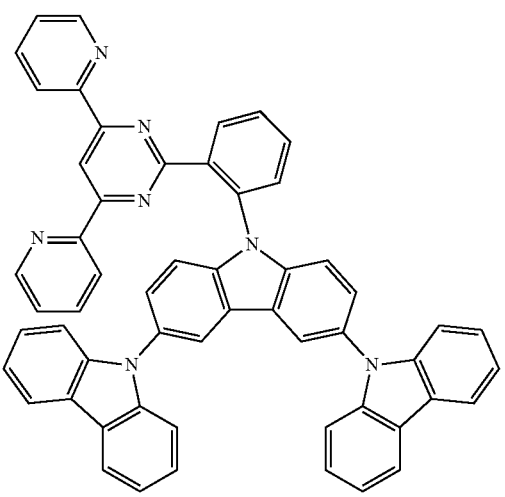
Compound A-81
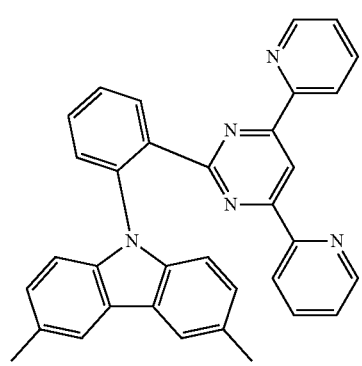
Compound A-82
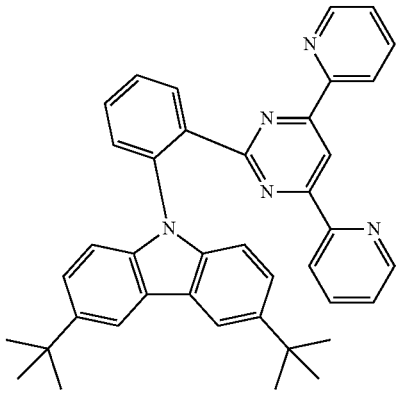
Compound A-83
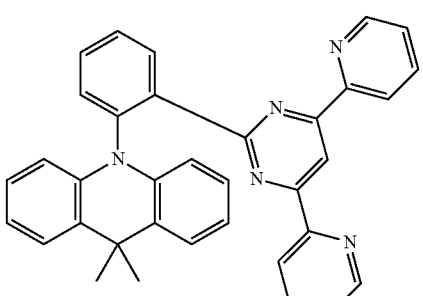
Compound A-84
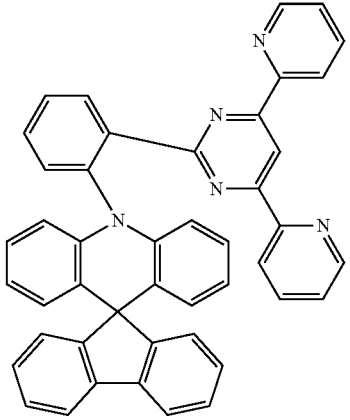
Compound A-85
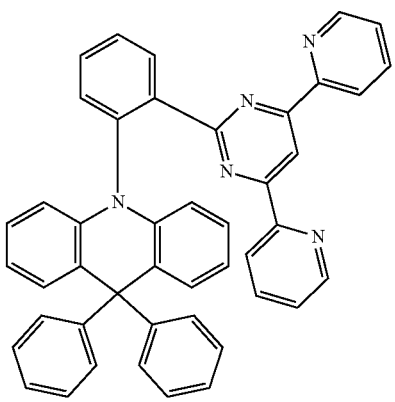

Compound A-86

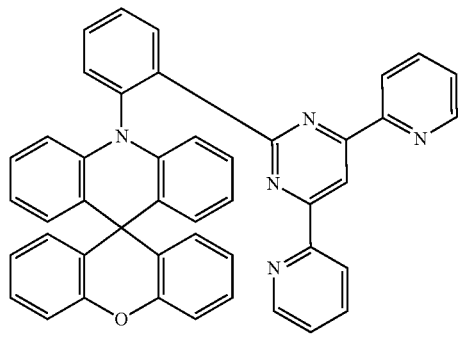

Compound A-87

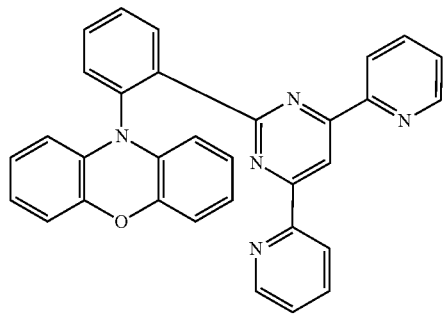

Compound A-88

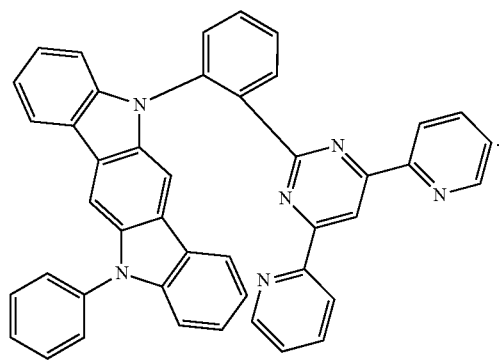

Figure 6:
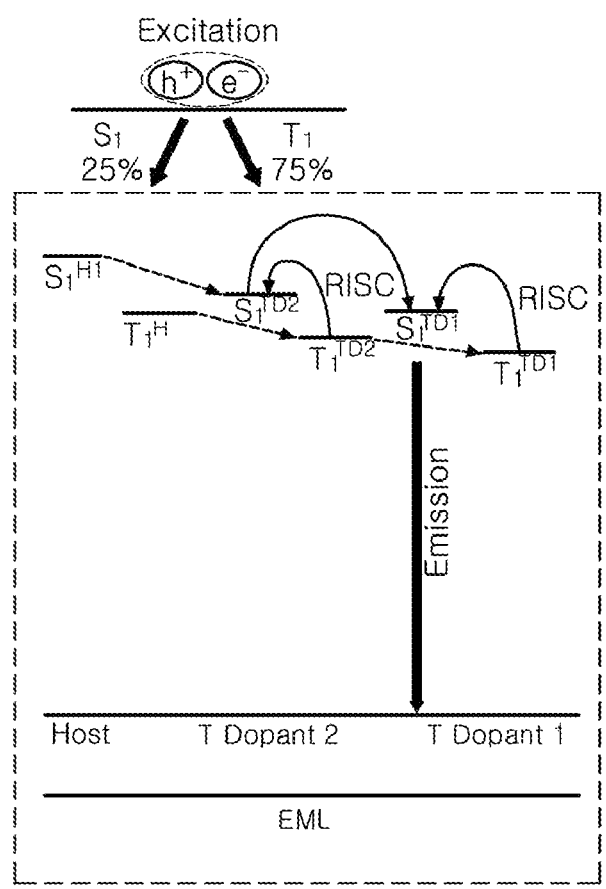
FIG. 6 is a schematic diagram illustrating luminous mechanism by energy level bandgap among luminous materials in accordance with an exemplary embodiment of the present disclosure.

When the EML 360 of the OLED 300 in accordance with a first embodiment of the present disclosure includes the first host, the first and second delayed fluorescent dopants, the relationships of the singlet and triplet energy levels among those materials are explained with referring to FIG. 6.

FIG. 6 is a schematic diagram illustrating luminous mechanism by energy level bandgap among luminous materials in accordance with an exemplary embodiment of the present disclosure. As illustrated in FIG. 6, the exciton energy generated at the first host should be transferred to the first delayed fluorescent dopant via the second delayed fluorescent dopant in order to emit light at the first delayed fluorescent dopant. With regard to such a purpose, each of an excited state singlet energy level $S_1^H$ and an excited state triplet energy level $T_1^H$ of the first host is higher that each of excited state singlet energy levels $S_1^{TD1}$ and $S_1^{TD2}$ and the excited triplet energy levels $T_1^{TD1}$ and $T_1^{TD2}$ of the first and second delayed fluorescent dopants.

As an example, when the excited state triplet energy level $T_1^H$ of the first host is not high enough than the excited state triplet energy level $T_1^{TD1}$ of the first delayed fluorescent dopant, the triplet exciton energy of the first delayed fluorescent dopant may be reversely transferred to the excited state triplet energy level $T_1^H$ of the first host. In this case, the triplet exciton is quenched as a non-emission at the first host where the triplet exciton cannot be emitted so that the triplet exciton energy of the first delayed fluorescent dopant cannot contribute to light emission. As an example, the excited state triplet energy level $T_1^H$ of the first host may be higher than the excited state triplet energy level $T_1^{TD1}$ of the first delayed fluorescent dopant by at least about 0.2 eV.

The first host is not limited to specific materials only if the excited state triplet energy level is higher than the excited state triplet energy levels $T_1^{TD1}$ and $T_1^{TD2}$ of the delayed fluorescent dopants and its HOMO and LUMO energy levels $HOMO^H$ and $LUMO^H$ satisfy the relationships in Equations (3) to (8) compared to the HOMO and LUMO energy levels $HOMO^{TD1}$, $HOMO^{TD2}$, $LUMO^{TD1}$ and $LUMO^{TD2}$ of the delayed fluorescent dopants. As an example, the first host may include, but are not limited to, 9-(3-(9H-carbazol-9-yl)phenyl)-9H-carbazole-3-carbonitrile (mCP-CN), CBP, 3,3'-bis(N-carbazolyl)-1,1'-biphenyl (mCBP), 1,3-Bis(carbazol-9-yl)benzene (mCP), Oxybis(2,1-phenylene))bis(diphenylphosphine oxide (DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5-Di(carbazol-9-yl)[1,1'-biphenyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenyl-phosphine oxide (TPSO1), 9-(9-phenyl-9H-carbazol-6-yl)-9H-carbazole (CCP), 4-(3-(triphenylen-2-yl)phenyl)dibenzo[b,d]thiophene), 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

When the EML 360 includes the first and second delayed fluorescent dopants, the content of the second delayed fluorescent dopant is less than the content of the first delayed fluorescent dopant, but is more than a half of the content of the first delayed fluorescent dopant.

As an example, when the content of the second delayed fluorescent dopant is less than a half of the content of the first delayed fluorescent dopant, a rate of absorbing triplet exciton from the hot triplet exciton energy to the excited state triplet energy level $T_1^{TD2}$ of the second delayed florescent dopant is faster than a rate of quenching the triplex exciton from the excited state triplet energy level $T_1^{TD2}$ of the second delayed fluorescent dopant to the lowest excited state triplet energy level $T_1^{TD1}$ of the first delayed fluorescent dopant. Accordingly, triplet exciton energy is accumulated at the second delayed fluorescent dopant, and the possibility of generating the hot triplet exciton at the second delayed fluorescent is increased so that the luminous life span of the delayed fluorescent dopants may be reduced.

On the contrary, when the content of the second delayed fluorescent dopant is more than the content of the first delayed fluorescent dopant, exciton recombination may be occurred at the second delayed fluorescent dopant. As a result, the second delayed fluorescent dopant as well as the first delayed fluorescent dopant can emit light. When the first and second delayed fluorescent dopants emit light simultaneously, FWHM of the luminescence spectrum becomes wide and color purity of the emitted light can be deteriorated.

As an example, the EML 360 may include, but are not limited to, the first host of about 40 to about 60% by weight, the first delayed fluorescent dopant of about 20 to about 40% by weight and the second delayed fluorescent dopant of about 15 to about 25% by weight.

Referring to FIG. 2, the ETL 370 and the EIL 380 may be laminated sequentially between the EML 360 and the second electrode 320. The ETL 370 includes a material having high electron mobility so as to provide electrons stably with the EML 360 by fast electron transportation.

In one exemplary embodiment, the ETL 370 may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 370 may include, but are not limited to, tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr) and/or tris(phenylquinoxaline) (TPQ).

The EIL 380 is disposed between the second electrode 320 and the ETL 370, and can improve physical properties of the second electrode 320 and therefore, can enhance the life span of the OLED 300. In one exemplary embodiment, the EIL 380 may include, but are not limited to, an alkali halide such as LiF, CsF, NaF, $BaF_2$ and the likes, and/or an organic metal compound such as lithium quinolate, lithium benzoate, sodium stearate, and the like.

When holes are transferred to the second electrode 320 via the EML 360 and/or electrons are transferred to the first electrode 310 via the EML 360, the OLED 300 may have short life span and reduced luminous efficiency. In order to prevent these phenomena, the OLED 300 in accordance with this embodiment of the present disclosure has at least one exciton blocking layer adjacent to the EML 560.

For example, the OLED 300 of the exemplary embodiment includes the EBL 355 between the HTL 350 and the EML 360 so as to control and prevent electron transfers. In one exemplary embodiment, the EBL 355 may include, but are not limited to, TCTA, Tris[4-(diethylamino)phenyl] amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4, 4'-diamine (DNTPD), TDAPB and/or 3,6-bis(N-carbazolyl)-N-phenyl-carbazole.

In addition, the OLED 300 further includes the HBL 375 as a second exciton blocking layer between the EML 360 and the ETL 370 so that holes cannot be transferred from the EML 360 to the ETL 370. In one exemplary embodiment, the HBL 375 may include, but are not limited to, oxadiazole-based compounds, triazole-based compounds, phenanthroline-based compounds, benzoxazole-based compounds, benzothiazole-based compounds, benzimidazole-based compounds, and triazine-based compounds.

For example, the HBL 375 may include a compound having a relatively low HOMO energy level compared to the emitting material in EML 360. The HBL 375 may include, but are not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof.

In the above first embodiment, the EML 360 includes the host and the delayed fluorescent dopants. In another exemplary embodiment, the EML 360 may include the first host, the first and second delayed fluorescent dopants and the first fluorescent dopant (FD).

Due to the bond conformation between the electron acceptor and the electron donor and sterical twists within the delayed fluorescent material, as described above, addition charge transfer transition (CT transition) is caused within the delayed fluorescent material. Since the delayed fluorescent material shows emission spectrum having very broad FWHM caused by the CT transition mechanism in the course of emission, which results in poor color purity. That is, since the delayed fluorescent material emits light by CT luminescence mechanism utilizing triplet exciton energy, it has a very short luminous life span and a limit in terms of color purity caused by its wide FWHM.

A hyper-fluorescence for solving the limitations accompanied by a delayed fluorescent material uses the delayed fluorescent material so as to raise a generation ratio of the singlet exciton in a fluorescent material that can use only singlet exciton energy. Since the delayed fluorescent material can utilize the triplet exciton energy as well as the singlet exciton energy, the fluorescent material can absorb the exciton energy released from the delayed fluorescent material, and then the exciton energy absorbed by the fluorescent material can be utilized in the emission process with generating 100% singlet exciton.

Figure 7:
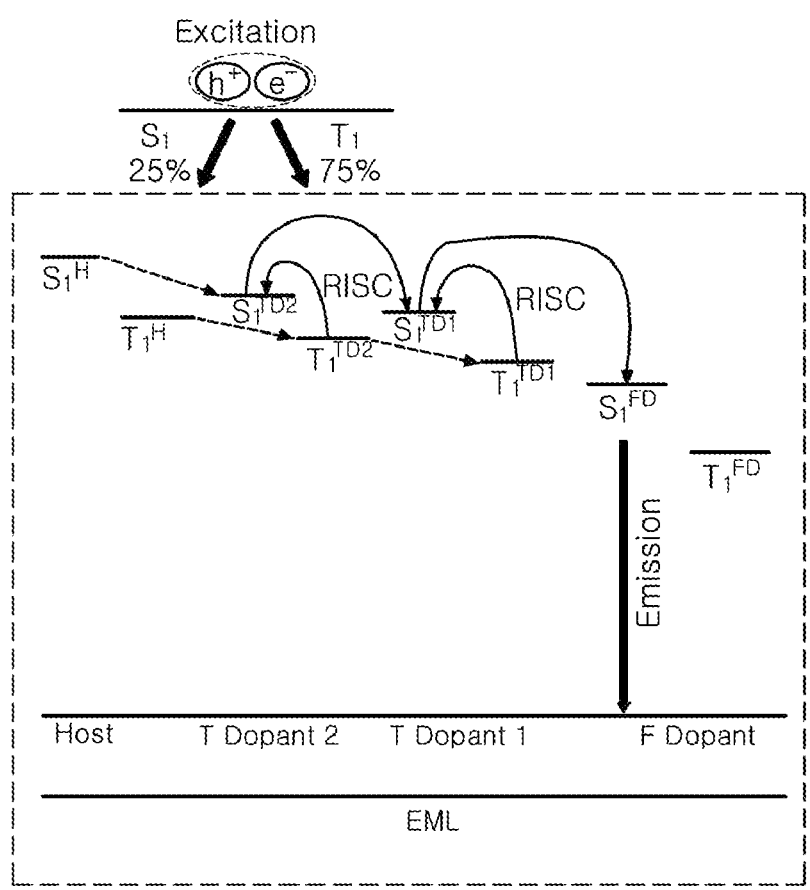
FIG. 7 is a schematic diagram illustrating luminous mechanism by energy level bandgap among luminous materials in accordance with another exemplary embodiment of the present disclosure.

In this case, it is important to adjust energy levels among the luminous materials, the host and the dopants, to transfer efficiently exciton energy among the luminous materials in order to transfer exciton energies efficiently among those luminous materials. FIG. 7 is a schematic diagram illustrating luminous mechanism by energy level bandgap among luminous materials in accordance with another exemplary embodiment of the present disclosure.

As illustrated schematically in FIG. 7, the exciton energy generated in the first host should be transferred rapidly to the first and second delayed fluorescent dopants. In order to implement such energy transfer, each of an excited state singlet energy level $S_1^H$ and an excited state triplet energy level $T_1^H$ of the first host must be higher than excited state singlet energy levels $S_1^{TD1}$ and $S_1^{TD2}$ and excited state triplet energy levels $T_1^{TD1}$ and $T_1^{TD2}$ of the first and second delayed fluorescent dopants, respectively.

In addition, the exciton energy should be transferred from the first delayed fluorescent dopant (TD1), which is converted ICT complex state by RISC mechanism, to the first fluorescent dopant (FD) and the OLED 300 should have enhanced luminous efficiency and high color purity. In order to realize such luminescence properties, each of the excited state singlet energy levels $S_1^{TD1}$ and $S_1^{TD2}$ and the excited state triplet energy levels $T_1^{TD1}$ and $T_1^{TD2}$ of the first and second delayed fluorescent dopants should be higher than each of an excited state singlet energy level $S_1^{FD}$ and an excited state triplet energy level $T_1^{TD}$ of the first fluorescent dopant, respectively.

As an example, the first fluorescent dopant may include a fluorescent material having narrow FWHM. For example, the first fluorescent dopant may be, but are not limited to, blue color fluorescent material having less than about 40 nm of FWHM, such as between about 10 nm to about 40 nm of FWHM. In addition, a fluorescent material, which has an absorption spectrum overlapped largely with an emission spectrum of the first host and/or the first and/or second delayed fluorescent dopants and a wave function overlapped with a wave function of the first host and/or the first and/or second delayed fluorescent dopants, may be used as the first fluorescent dopant.

In this case, excessively generated exciton-exciton quenching or polaron-exciton quenching for forming excitons are minimized so that luminous efficiency may be maximized in the EML 360 and blue emission having high color purity may be realized.

As an example, the first fluorescent dopant may include, but are not limited to, anthracene-based derivatives, tetracene-based derivative, chrysene-based derivatives, phenanthren-based derivatives, pyrene-based derivatives, perylene-based derivatives, stilbene-based derivatives, acridone-based derivatives, coumarin-based derivatives, phenoxazine-based derivatives and phenothiazine-based derivatives.

Particularly, the first fluorescent dopant may include, but are not limited to, 5,6-bis[4-(10-phenyl-9-anthryl)phenyl]-2,2'-bipyridine (PAP2BPy), 5,6-bis[4'-(10-phenyl-9-anthryl)biphenyl-4-yl]-2,2'-bipyridine (PAPP2BPy), N,N'-bis[4-(9-phenyl-9H-fluoren-9-yl)phenyl]-N,N'-diphenyl-pyrene-1,6-diamine (1,6-FLPAPrn), N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), N,9-diphenyl-N-[4-(10-phenyl-9-anthryl)phenyl]-9H-carbazol-3-amine (PCAPA), 2,5,8,11-tetra-tert-butylperylene (TBP), 4-(10-phenyl-9-anthryl)-4'-(9-phenyl-9H-carbazol-3-yl)triphenylamine (PCBAPA), N,9-diphenyl-N-[4-(9,10-diphenyl-2-anthryl)phenyl]-9H-carbazol-3-amine (2PCAPPA), coumarin 30, N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), 9-triphenylanthracen-9-amine (DPhAPhA), N,N'-diphenylquinacridone (DPQd), 5,12-bis(1,1'-biphenyl-4-yl)-6,11-diphenyltetracene (BPT), 2-(2-{2-[4-(dimethylamino)phenyl]ethenyl}-6-methyl-4H-pyran-4-ylidene)propanedinitrile (DCM1), 2-{2-methyl-6-[2-(2,3,6,7-tetrahydro-1H,5H-benzo[ij]quinolizin-9-yl)ethenyl]-4H-pyran-4-ylidene}propanedinitrile (DCM2), N,N,N',N'-tetrakis(4-methylphenyl)tetracene-5,11-diamine (p-mPhTD), 7,14-diphenyl-N,N,N',N'-tetrakis(4-methylphenyl)acenaphtho[1,2-a]fluoranthene-3,10-diamine (p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB) and N,N,N',N'-Tetraphenyl-pyrene-1,6-diamine.

When the EML 360 includes the first and second delayed fluorescent dopants, the content of the second delayed fluorescent dopant is less than the content of the first delayed fluorescent dopant, but is more than a half of the content of the first delayed fluorescent dopant. In addition, the content of the first and/or the second fluorescent dopants may be larger than the content of the first fluorescent dopant. In this case, the exciton energy can be transferred efficiently from the first delayed fluorescent dopant to the first fluorescent dopant. As an example, the EML 360 may include, but are not limited to, the first host of about 40 to about 60% by weight, the first delayed fluorescent dopant of about 20 to about 40% by weight, the second delayed fluorescent dopant of about 15 to about 25% by weight and the first fluorescent dopant of about 1 to about 5% by weight.

In accordance with this exemplary embodiment, the EML 360 further includes the first fluorescent dopant having narrow FWHM in order to prevent color purity being deteriorated in case of the using the first and second delayed fluorescent dopants. The triplet exciton energy of the first delayed fluorescent dopant is converted to singlet exciton energy of its own by RISC mechanism, then the converted singlet exciton energy of the first delayed fluorescent dopant can be transferred to the first fluorescent dopant within the same EML 360 by Dexter energy transfer mechanism, which transfer exciton energies depending upon wave function overlaps among adjacent molecules by inter-molecular electron exchanges and exciton diffusions. As the exciton energy is transferred from the first delayed fluorescent dopant to the first fluorescent dopant, ultimate light emission is occurred as transferred exciton energy at the first fluorescent dopant having narrow FWHM is shifted to the ground state. Accordingly, the OLED 300 can enhance its luminous efficiency and life span and improved its color purity.

Figure 8:
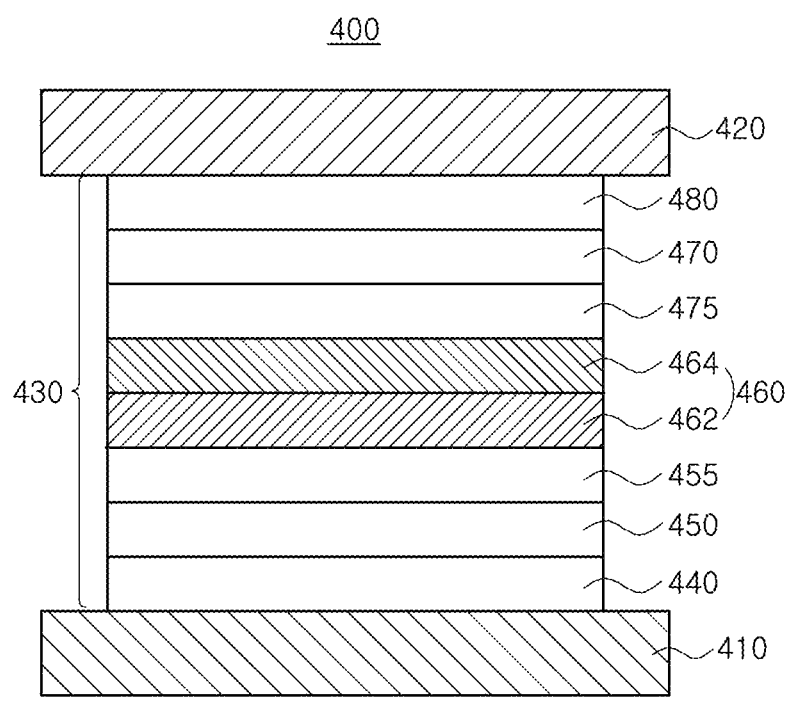
FIG. 8 is a schematic cross-sectional view illustrating an organic light emitting diode in accordance with another exemplary embodiment of the present disclosure.

In the above embodiments, the OLED 300 has a single-layered EML 360. Alternatively, an OLED in accordance with the present disclosure may include a multiple-layered EML. FIG. 8 is a schematic cross-sectional view illustrating an organic light emitting diode in accordance with another exemplary embodiment of the present disclosure.

As illustrated in FIG. 8, the OLED 400 in accordance with an exemplary third embodiment of the present disclosure includes first and second electrodes 410 and 420 facing each other and an emitting unit 430 as an emission layer disposed between the first and second electrodes 410 and 420.

In one exemplary embodiment, the emitting unit 430 includes an HIL 440, an HTL 450, and EML 460, an ETL 470 and an EIL 480 each of which is laminated sequentially over the first electrode 410. Beside, the emitting unit 430 may further include an EBL 455 as a first exciton blocking layer disposed between the HTL 450 and the EML 460, and/or an HBL 475 as a second exciton blocking layer disposed between the EML 460 and the ETL 470.

As described above, the first electrode 410 may be an anode and may include, but are not limited to, a conductive material having a relatively large work function values such as ITO, IZO, SnO, ZnO, ICO, AZO, and the likes. The second electrode 420 may be a cathode and may include, but are not limited to, a conductive material having a relatively small work function values such as Al, Mg, Ca, Ag, alloy thereof or combination thereof.

The HIL 440 is disposed between the first electrode 410 and the HTL 450. The HIL 440 may include, but are not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 440 may be omitted in compliance with the structure of the OLED 400.

The HTL 450 is disposed adjacently to the EML 460 between the first electrode 410 and the EML 460. The HTL 450 may include, but are not limited to, aromatic amine compounds such as TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The EBL 455 may include, but are not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H- fluorene-2-amine, TAPC, MTDATA, mCP, mCBP, CuPc, DNTPD, TDAPB and/or 3,6-bis(N-carbazolyl)-N-phenyl-carbazole.

The EML 460 includes a first EML (EML1) 462 and a second EML (EML2) 464. The EML1 462 is disposed between the EBL 455 and the HBL 475 and the EML2 464 is disposed between the EML1 462 and the HBL 475. The configuration and energy levels among the luminous materials in the EML 460 will be explained in more detail below.

The HBL 475 may include, but are not limited to, oxadiazole-based compounds, triazole-based compounds, phenanthroline-based compounds, benzoxazole-based compounds, benzothiazole-based compounds, benzimidazole-based compounds, and triazine-based compounds. As an example, the HBL 475 may include a compound having a relatively low HOMO energy level compared to the emitting material in EML 460. The HBL 475 may include, but are not limited to, BCP, BAlq, Alq$_3$, PBD, spiro-PBD, Liq, B3PYMPM, DPEPO, 9-(6-(9H-carbazol-9-yl)pyridine-3-yl)-9H-3,9'-bicarbazole and combination thereof.

The ETL 470 is disposed between the EML 460 and the EIL 480. In one exemplary embodiment, the ETL 470 may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the likes. As an example, the ETL 470 may include, but are not limited to, Alq$_3$, PBD, spiro-PBD, Liq, TPBi, BAlq, Bphen, NBphen, BCP, TAZ, NTAZ, TpPyPB, TmPPPyTz, PFNBr and/or TPQ.

The EIL 480 is disposed between the second electrode 420 and the ETL 470. In one exemplary embodiment, the EIL 480 may include, but are not limited to, an alkali halide such as LiF, CsF, NaF, BaF$_2$ and the likes, and/or an organic metal compound such as lithium benzoate, sodium stearate, and the like.

As described above, the EML 460 includes the EML1 462 and the EML2 464. One of the EML1 462 and the EML2 464 includes a first host and the first and second delayed fluorescent dopants, and the other of the EML1 462 and the EML2 464 includes a second host and a first fluorescent dopant. Hereinafter, the EML 460, where the EML1 462 includes the delayed fluorescent materials and the EML2 464 includes the fluorescent dopant, will be explained.

In accordance with an exemplary third embodiment, the EML1 462 includes the first host and the first and second delayed fluorescent dopants. As described above, two delayed fluorescent materials having different triplet energy levels, HOMO energy levels and LUMO energy levels can be applied into an EML to improve its luminous efficiency and its luminescence lifetime. While the delayed fluorescent dopant shows high quantum efficiency, but it has poor color purity due to its wide FWHM.

The EML2 464 includes the second host and the first fluorescent dopant. While the first fluorescent dopant has an advantage in terms of color purity due to its narrow FWHM, but it has a limit in terms of quantum efficiency because its triplet exciton cannot participate in the emitting process.

But, in this exemplary embodiment, the singlet exciton energy and the triplet exciton energy of the first delayed fluorescent dopants in EML1 462 can be transferred to the first fluorescent dopant in the EML2 464 disposed adjacently to the EML1 462 by FRET (Forster resonance energy transfer) mechanism, which transfers energy non-radially through electrical fields by dipole-dipole interactions. Accordingly, the ultimate emission occurs in the first fluorescent dopant within the EML2 464.

Figure 9:
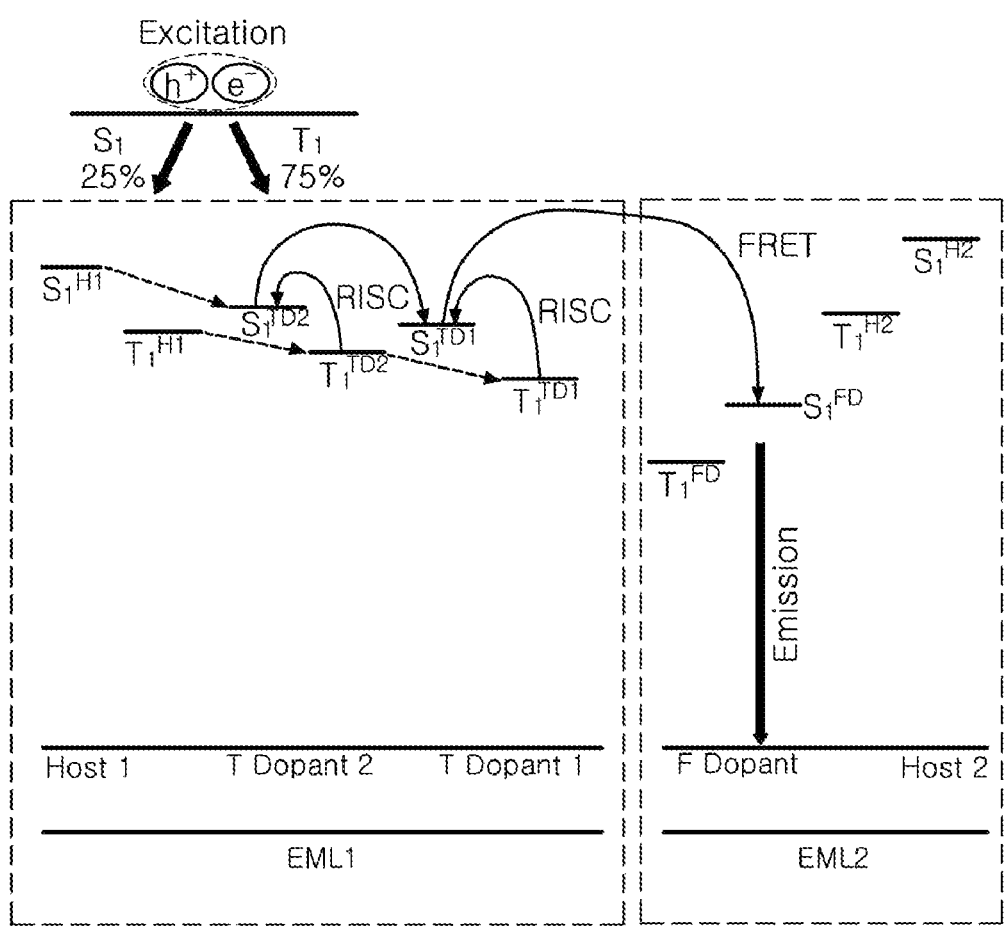
FIG. 9 is a schematic diagram illustrating luminous mechanism by energy level bandgap among luminous materials in accordance with another exemplary embodiment of the present disclosure.

In other words, the triplet exciton energy of the first delayed fluorescent dopant is converted to the singlet exciton energy of its own in the EML1 462 by RISC mechanism, then the converted singlet exciton energy of the first delayed fluorescent dopant is transferred to the singlet exciton energy of the first fluorescent dopant in the EML2 464 because the excited state singlet energy level $S_1^{TD1}$ of the first delayed fluorescent dopant in the EML1 462 is higher than the excited state singlet energy level $S_1^{FD}$ of the fluorescent dopant in the EML2 464 (See, FIG. 9).

The first fluorescent dopant in the EML2 464 can emit light using the triplet exciton energy as well as the singlet exciton energy of the first delayed fluorescent dopant. In addition, the fluorescent dopant has relatively narrow FWHM as compared with the delayed fluorescent dopant. As a result, the OLED 400 can enhance its luminous efficiency and color purity. Particularly, an organic compound as the first fluorescent dopant in the EML2 464 can emit blue light having high color purity. As the exciton energy generated at the first delayed fluorescent dopant in the EML1 462 is transferred efficiently to the first fluorescent dopant in the EML2 464, the OLED 400 can implement hyper-fluorescence.

The first and second delayed fluorescent dopants act as only transferring exciton energy to the first fluorescent dopant. Accordingly, the EML1 462 including the first and second delayed fluorescent dopants is not involved in the ultimate light emission process, but the ultimate light emission is occurred in the EML2 464 including the first fluorescent dopant.

Each of the EML1 462 and the EML2 464 includes the first host and the second host, respectively. For example, each of the first host and the second host may respectively include, but are not limited to, mCP-CN, CBP, mCBP, mCP, DPEPO, PPT, TmPyPB, PYD-2CZ, DCzDBT, DCzTPA, pCzB-2CN, mCzB-2CN, TPSO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

Each of the first and second delayed fluorescent dopants that may be included in the EML1 462 is not particularly limited as long as they satisfy the above-mentioned relationships in Equations (1) to (8). As an example, the first delayed fluorescent dopant may include anyone having the structure of Chemical Formula 5 and the second delayed fluorescent dopant may include anyone having the structure of Chemical Formula 6.

As an example, the first fluorescent dopant that may be included in the EML2 464 may include, but are not limited to, anthracene-based derivatives, tetracene-based derivative, chrysene-based derivatives, phenanthren-based derivatives, pyrene-based derivatives, perylene-based derivatives, stilbene-based derivatives, acridone-based derivatives, coumarin-based derivatives, phenoxazine-based derivatives and phenothiazine-based derivatives. Particularly, the first fluorescent dopant may include, but are not limited to, PAP2BPy, PAPP2BPy, 1,6-FLPAPrn, YGA2S, YGAPA, PCAPA, TBP, PCBAPA, 2PCAPPA, coumarin 30, 2PCAPA, 2PCABPhA, DPhAPhA, (DPQd, BPT, DCM1, DCM2, p-mPhTD, p-mPhAFD, DCJTI, DCJTB and N,N,N',N'-Tetraphenyl-pyrene-1,6-diamine.

In one exemplary embodiment, each of the first and second hosts may have more weight ratio than the first and second delayed fluorescent dopants and the first fluorescent dopant in the EML1 462 and the EML2 464, respectively. In addition, the weight ratio of the first delayed fluorescent dopant in the EML1 462 may be larger than the weight ratio of the first fluorescent dopant in the EML2 464. In this case, it is possible to transfer enough energy from the first delayed fluorescent dopant in the EML1 462 to the first fluorescent dopant in the EML2 464. Moreover, the content of the second delayed fluorescent dopant is less than the content of the first delayed fluorescent dopant but may be larger than a half of the content of the first delayed fluorescent dopant in the EML1 462.

As an example, the EML1 462 may include, but are not limited to, the first host of about 40 to about 60% by weight, the first delayed fluorescent dopant of about 20 to about 40% by weight and the second delayed fluorescent dopant of about 15 to about 25% by weight. The EML2 464 may include the first fluorescent dopant of, but are not limited to, about 1 to about 50% by weight, and preferably about 1 to about 30% by weight.

Energy level relationships among the luminous materials in the double-layered EML 460 will be explained. FIG. 9 is a schematic diagram illustrating luminous mechanism by energy level bandgap among luminous materials in a double-layered EML in accordance with another exemplary embodiment of the present disclosure. As illustrated in FIG. 9, each of an excited state singlet energy level $S_1^{H1}$ and an excited state triplet energy level $T_1^{H1}$ of the first host is higher than excited state singlet energy levels $S_1^{TD1}$ and $S_1^{TD2}$ and excited state triplet energy levels $T_1^{TD1}$ and $T_1^{TD2}$ of the first and second delayed fluorescent dopants in the EML1 462, respectively. Alternatively, each of an excited state singlet energy level $S_1^{H2}$ and an excited state triplet energy level $T_1^{H2}$ of the second host in the EML2 464 may be higher than excited state singlet energy levels $S_1^{TD1}$ and $S_1^{TD2}$ and excited state triplet energy levels $T_1^{TD1}$ and $T_1^{TD2}$ of the first and second delayed fluorescent dopants in the EML1 462, respectively.

In addition, each of the excited state singlet energy levels $S_1^{TD1}$ and $S_1^{TD2}$ and the excited state triplet energy levels $T_1^{TD1}$ and $T_1^{TD2}$ of the first and second delayed fluorescent dopants in the EML1 462 is higher than each of an excited state singlet energy level $S_1^{FD}$ and an excited state triplet energy level $T_1^{FD}$ of the first fluorescent dopant in the EML2 464, respectively. Moreover, each of the excited state singlet energy level $S_1^{H2}$ and the excited state triplet energy level $T_1^{H2}$ of the second host is higher than each of the excited state singlet energy level $S_1^{FD}$ and the excited state triplet energy level $T_1^{FD}$ of the first fluorescent dopant in the EML2 464, respectively.

When the luminous materials do not satisfy the above-described energy level relationships, exciton quenching as non-emission exciton annihilation may occur at the delayed fluorescent dopants and/or the first fluorescent dopant, or exciton energy cannot be transferred efficiently from the host to the dopants so that luminous efficiency of the OLED 400 may be deteriorated.

In an alternatively exemplary embodiment, the second host, which is included in the EML2 464 together with the first fluorescent dopant, may be the same material as the HBL 475. In this case, the EML2 464 may have a hole blocking function as well as an emission function. In other words, the EML2 464 can act as a buffer layer for blocking holes. In one embodiment, the HBL 475 may be omitted where the EML2 464 may be a hole blocking layer as well as an emitting material layer.

In another exemplary embodiment, the EML1 462 may include the second host and the first fluorescent dopant and the EML2 464 may include the first host and the first and second delayed fluorescent dopants. In this embodiment, the second host in the EML1 462 may be the same material as the EBL 455. In this case, the EML1 462 may have an electron blocking function as well as an emission function. In other words, the EML1 462 can act as a buffer layer for blocking electrons. In one embodiment, the EBL 455 may be omitted where the EML1 462 may be an electron blocking layer as well as an emitting material layer.

Figure 10:
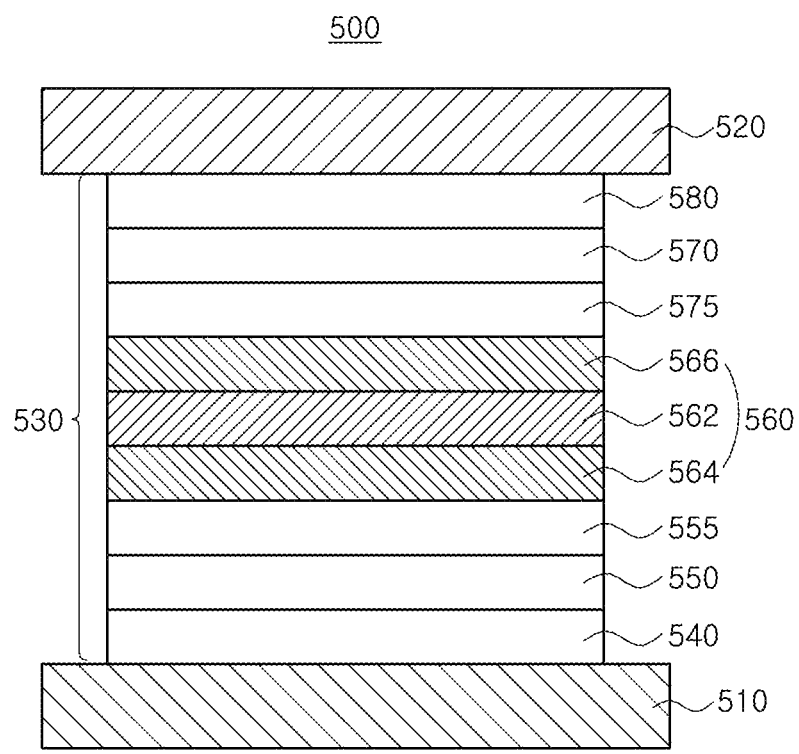
FIG. 10 is a schematic cross-sectional view illustrating an organic light emitting diode in accordance with another exemplary embodiment of the present disclosure.

An OLED having a triple-layered EML will be explained. FIG. 10 is a cross-sectional view illustrating an organic light emitting diode having a triple-layered EML in accordance with another exemplary embodiment of the present disclosure. As illustrated in FIG. 10, an OLED 500 in accordance with fourth embodiment of the present disclosure includes first and second electrodes 510 and 520 facing each other and an emitting unit 530 as an emissive unit disposed between the first and second electrodes 510 and 520.

In one exemplary embodiment, the emitting unit 530 includes an HIL 540, an HTL 550, and EML 560, an ETL 570 and an EIL 580 each of which is laminated sequentially over the first electrode 510. Beside, the emitting unit 530 may further include an EBL 555 as a first exciton blocking layer disposed between the HTL 550 and the EML 560, and/or an HBL 575 as a second exciton blocking layer disposed between the EML 560 and the ETL 570.

The OLED 500 in accordance with the fourth embodiment may have the same first and second electrodes 510 and 520 and the emitting unit 530 as the OLEDs 300 and 400 in accordance with the first to third embodiments except the EML 560.

The first electrode 510 may be an anode and may include, but are not limited to, a conductive material having a relatively large work function values such as ITO, IZO, SnO, ZnO, ICO, AZO, and the likes. The second electrode 520 may be a cathode and may include, but are not limited to, a conductive material having a relatively small work function values such as Al, Mg, Ca, Ag, alloy thereof or combination thereof.

The HIL 540 is disposed between the first electrode 510 and the HTL 550. The HIL 540 may include, but are not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 540 may be omitted in compliance with the structure of the OLED 500.

The HTL 550 is disposed adjacently to the EML 560 between the first electrode 510 and the EML 560. The HTL 550 may include, but are not limited to, aromatic amine compounds such as TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The EBL 555 may include, but are not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB and/or 3,6-bis(N-carbazolyl)-N-phenyl-carbazole.

The EML 560 includes a first EML (EML1) 562, a second EML (EML2) 564 and a third EML (EML3) 566. The configuration and energy levels among the luminous materials in the EML 560 will be explained in more detail below.

The HBL 575 may include, but are not limited to, oxadiazole-based compounds, triazole-based compounds, phenanthroline-based compounds, benzoxazole-based compounds, benzothiazole-based compounds, benzimidazole-based compounds, and triazine-based compounds. As an example, the HBL 575 may include a compound having a relatively low HOMO energy level compared to the emitting material in EML 560. The HBL 575 may include, but are not limited to, BCP, BAlq, Alq$_3$, PBD, spiro-PBD, Liq, B3PYMPM, DPEPO, 9-(6-(9H-carbazol-9-yl)pyridine-3-yl)-9H-3,9'-bicarbazole and combination thereof.

The ETL 570 is disposed between the EML 560 and the EIL 580. In one exemplary embodiment, the ETL 570 may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the likes. As an example, the ETL 570 may include, but are not limited to, Alq$_3$, PBD, spiro-PBD, Liq, TPBi, BAlq, Bphen, NBphen, BCP, TAZ, NTAZ, TpPyPB, TmPPPyTz, PFNBr and/or TPQ.

The EIL 580 is disposed between the second electrode 520 and the ETL 570. In one exemplary embodiment, the EIL 580 may include, but are not limited to, an alkali halide such as LiF, CsF, NaF, BaF$_2$ and the likes, and/or an organic metal compound such as lithium benzoate, sodium stearate, and the likes.

As described above, the EML 560 includes the EML1 562 disposed between the EBL 555 and the HBL 575, the EML2 564 disposed between the EBL 555 and the EML1 562, and the EML3 566 disposed between the EML1 562 and the HBL 575. The EML1 562 includes first and second delayed fluorescent dopants and each of the EML2 564 and EML3 566 includes a first fluorescent dopant and a second fluorescent dopant, respectively. Each of the EML1 562, EML2 564 and EML3 566 further include a first host, a second host and a third host, respectively.

In accordance with this embodiment, the singlet and triplet exciton energies of the first delayed fluorescent dopant, which is included in the EML1 562, is transferred to the first and second fluorescent dopants each of which is included in the EML2 564 and EML3 566 disposed adjacently to the EML1 562 by FRET energy transfer mechanism. Accordingly, the ultimate emission occurs in the first and second fluorescent dopants in the EML2 564 and the EML3 566.

Figure 11:
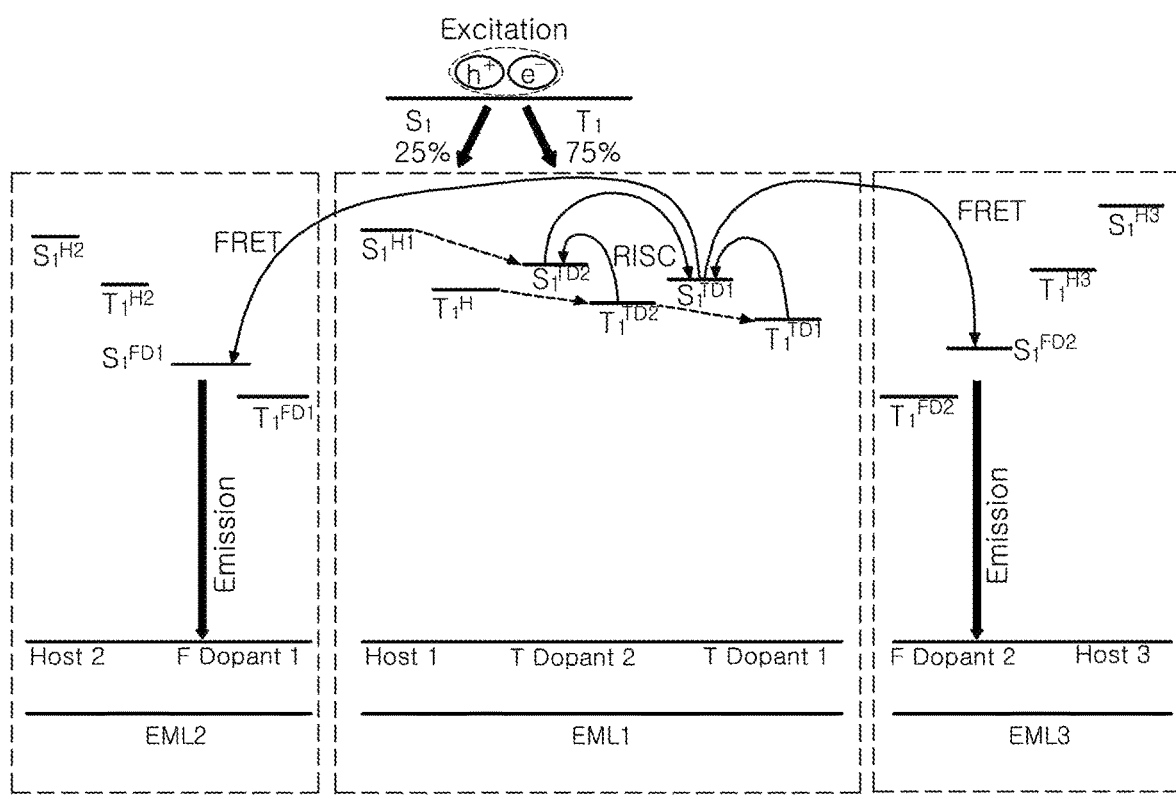
FIG. 11 is a schematic diagram illustrating luminous mechanism by energy level bandgap among luminous materials in accordance with another exemplary embodiment of the present disclosure.

In other words, the triplet exciton energy of the first delayed fluorescent dopant is converted to the singlet exciton energy of its own in the EML1 562 by RISC mechanism, then the singlet exciton energy of the first delayed fluorescent dopant is transferred to the singlet exciton energy of the first and second fluorescent dopants because the excited state singlet energy level $S_1^{TD1}$ of the first delayed fluorescent dopant is higher than the excited state singlet energy levels $S_1^{FD1}$ and $S_1^{FD2}$ of the first and second fluorescent dopants (See, FIG. 11). The first and second fluorescent dopants in the EML2 564 and EML3 566 can emit light using the singlet exciton energy and the triplet exciton energy derived from the delayed fluorescent dopant. Therefore, the OLED 500 enhance its luminous efficiency and color purity owing to the narrow FWHM of the first and second fluorescent dopants.

In this case, the first and second delayed fluorescent dopants only act as transferring energy to the first and second fluorescent dopants. The EML1 562 including the first and second delayed fluorescent dopants is not involved in the ultimate emission process, while both the EML1 562 including the first fluorescent dopant and the EML3 566 including the second fluorescent dopant emit light. Since the fluorescent dopants have relatively narrow FWHM as compared with the delayed fluorescent dopant, the OLED 500 can enhance its luminous efficiency and color purity.

In addition, each of the EML1 562, the EML2 564 and the EML3 566 include the first host, the second host and the third host, respectively. The first to third hosts are the same as or different from one another. As an example, each of the first to third host may independently include, but are not limited to, mCP-CN, CBP, mCBP, mCP, DPEPO, PPT, TmPyPB, PYD-2CZ, DCzDBT, DCzTPA, pCzB-2CN, mCzB-2CN, TPSO1, CCP, 4-(3-(triphenylen-2-yl)phenyl) dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

Each of the first and second delayed fluorescent dopants that may be included in the EML1 562 is not particularly limited as long as they satisfy the above-mentioned relationships in Equations (1) to (8). As an example, the first delayed fluorescent dopant may include anyone having the structure of Chemical Formula 5 and the second delayed fluorescent dopant may include anyone having the structure of Chemical Formula 6.

As an example, each of the first and second fluorescent dopants, which may be included in the EML2 564 or in the EML3 566, may include, but are not limited to, anthracene-based derivatives, tetracene-based derivative, chrysene-based derivatives, phenanthren-based derivatives, pyrene-based derivatives, perylene-based derivatives, stilbene-based derivatives, acridone-based derivatives, coumarin-based derivatives, phenoxazine-based derivatives and phenothiazine-based derivatives. Particularly, the first fluorescent dopant may include, but are not limited to, PAP2BPy, PAPP2BPy, 1,6-FLPAPrn, YGA2S, YGAPA, PCAPA, TBP, PCBAPA, 2PCAPPA, coumarin 30, 2PCAPA, 2PCABPhA, DPhAPhA, (DPQd, BPT, DCM1, DCM2, p-mPhTD, p-mPhAFD, DCJTI, DCJTB and N,N,N',N'-Tetraphenyl-pyrene-1,6-diamine.

In one exemplary embodiment, each of the first to third hosts may have more weight ratio than the first and second delayed fluorescent dopants and the first and second fluorescent dopant in the EML1 562, the EML2 564 and the EML3 566, respectively. In addition, the weight ratio of the first delayed fluorescent dopant in the EML1 562 may be larger than each of the weight ratio of the first and second fluorescent dopants in the EML2 564 and the EML3 566, respectively. In this case, it is possible to transfer enough energy from the first delayed fluorescent dopant in the EML1 562 to the first and second fluorescent dopants in the EML2 564 and in the EML3 566. Moreover, the content of the second delayed fluorescent dopant is less than the content of the first delayed fluorescent dopant but may be larger than a half of the content of the first delayed fluorescent dopant in the EML1 562.

As an example, the EML1 562 may include, but are not limited to, the first host of about 40 to about 60% by weight, the first delayed fluorescent dopant of about 20 to about 40% by weight and the second delayed fluorescent dopant of about 15 to about 25% by weight. Each of the EML2 564 and the EML3 566 may include the first or second fluorescent dopant of, but are not limited to, about 1 to about 50% by weight, and preferably about 1 to about 30% by weight.

Energy level relationships among the luminous materials in the EML 560 will be explained in more detail. FIG. 11 is a schematic diagram illustrating luminous mechanism by energy level bandgap among the luminous material in a triple-layered EML in accordance with another exemplary embodiment of the present disclosure. As illustrated in FIG.

11, each of an excited state singlet energy level $S_1^{TD}$ and an excited state triplet energy level $T_1^{H1}$ of the first host is higher than excited state singlet energy levels $S_1^{TD1}$ and $S_1^{TD2}$ and excited state triplet energy levels $T_1^{TD1}$ and $T_1^{TD2}$ of the first and second delayed fluorescent dopants in the EML1 562, respectively. Alternatively, each of an excited state singlet energy levels $S_1^{H2}$ and $S_1^{H3}$ and an excited state triplet energy level $T_1^{H2}$ and $T_1^{H3}$ of the second and third hosts in the EML2 564 and in the EML3 566 may be higher than excited state singlet energy levels $S_1^{TD1}$ and $S_1^{TD2}$ and excited state triplet energy levels $T_1^{TD1}$ and $T_1^{TD2}$ of the first and second delayed fluorescent dopants in the EML1 562, respectively.

In addition, each of the excited state singlet energy levels $S_1^{TD1}$ and $S_1^{TD2}$ and the excited state triplet energy levels $T_1^{TD1}$ and $T_1^{TD2}$ of the first and second delayed fluorescent dopants in the EML1 562 is higher than each of excited state singlet energy levels $S_1^{FD1}$ and $S_1^{FD2}$ and excited state triplet energy levels $T_1^{FD1}$ and $T_1^{FD2}$ of the first and second fluorescent dopants in the EML2 564 and in the EML3 566, respectively. Moreover, each of the excited state singlet energy levels $S_1^{H2}$ and $S_1^{H3}$ and the excited state triplet energy levels $T_1^{H2}$ and $T_1^{H3}$ of the second and third host may be higher than each of the excited state singlet energy levels $S_1^{FD1}$ and $S_1^{FD2}$ and the excited state triplet energy levels $T_1^{FD1}$ and $T_1^{FD2}$ of the first and second fluorescent dopants in the EML2 564 and in the EML3 566, respectively.

In an alternatively exemplary embodiment, the second host, which is included in the EML2 564 together with the first fluorescent dopant, may be the same material as the EBL 555. In this case, the EML2 564 may have an electron blocking function as well as an emission function. In other words, the EML2 564 can act as a buffer layer for blocking electrons. In one embodiment, the EBL 555 may be omitted where the EML2 564 may be an electron blocking layer as well as an emitting material layer.

In another exemplary embodiment, the third host, which is included in the EML3 566 together with the second fluorescent dopant, may be the same material as the HBL 575. In this case, the EML3 566 may have a hole blocking function as well as an emission function. In other words, the EML3 566 can act as a buffer layer for blocking holes. In one embodiment, the HBL 575 may be omitted where the EML3 566 may be a hole blocking layer as well as an emitting material layer.

In still another exemplary embodiment, the second host in the EML2 564 may be the same material as the EBL 555 and the third host in the EML3 566 may be the same material as the HBL 575. In this embodiment, the EML2 564 may have an electron blocking function as well as an emission function, and the EML3 566 may have a hole blocking function as well as an emission function. In other words, each of the EML2 564 and the EML3 566 can act as a buffer layer for blocking electrons or hole, respectively. In one embodiment, the EBL 555 and the HBL 575 may be omitted where the EML2 564 may be an electron blocking layer as well as an emitting material layer and the EML3 566 may be a hole blocking layer as well as an emitting material layer.

Figure 12:
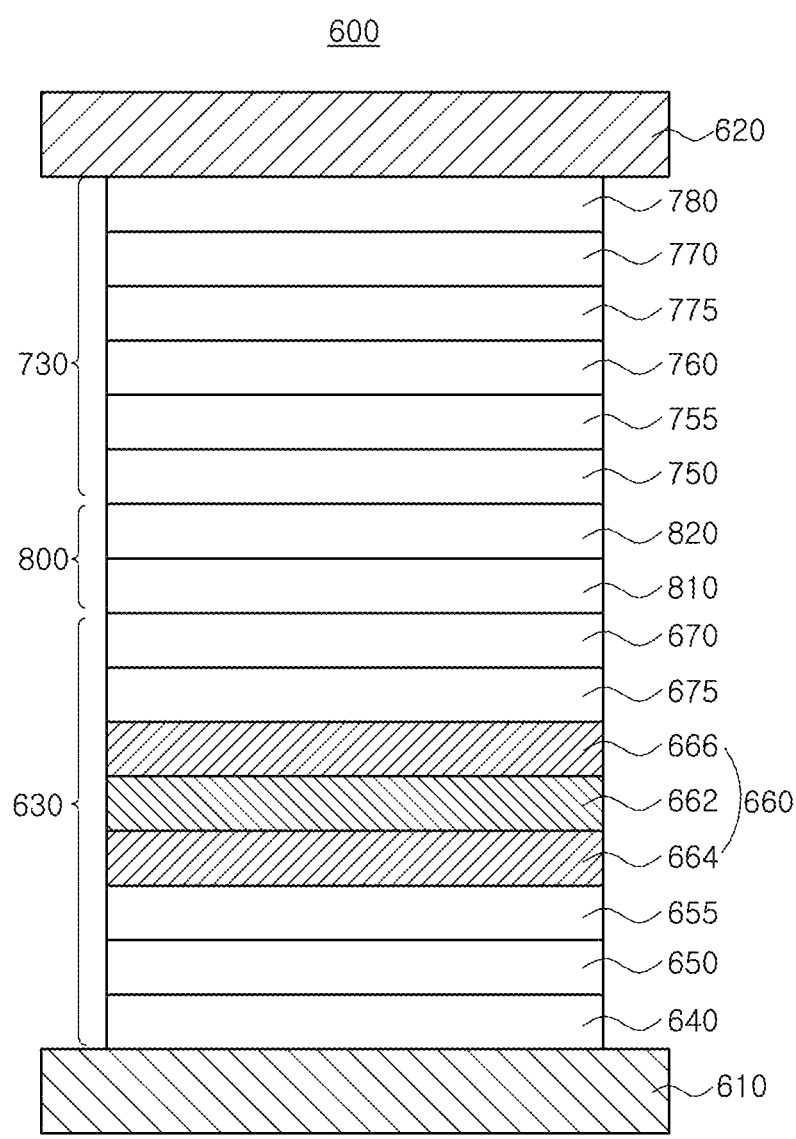
FIG. 12 is a schematic cross-section view illustrating an organic light emitting diode in accordance with another exemplary embodiment of the present disclosure.

In the above embodiments, the OLED having only one emitting unit is described. Unlike the above embodiment, the OLED may have multiple emitting units so as to form a tandem structure. FIG. 12 is a cross-sectional view illustrating an organic light emitting diode in accordance with still another embodiment of the present disclosure.

As illustrated in FIG. 12, the OLED 600 in accordance with the fifth embodiment of the present disclosure includes first and second electrodes 610 and 620 facing each other, a first emitting unit 630 as a first emission layer disposed between the first and second electrodes 610 and 620, a second emitting unit 730 as a second emission layer disposed between the first emitting unit 630 and the second electrode 620, and a charge generation layer 800 disposed between the first and second emitting units 630 and 730.

As mentioned above, the first electrode 610 may be an anode and include, but are not limited to, a conductive material, for example, a transparent conductive material (TCO), having a relatively large work function values. As an example, the first electrode 610 may include, but are not limited to, ITO, IZO, SnO, ZnO, ICO, AZO, and the likes. The second electrode 620 may be a cathode and may include, but are not limited to, a conductive material having a relatively small work function values such as Al, Mg, Ca, Ag, alloy thereof or combination thereof.

The first emitting unit 630 includes a HIL 640, a first HTL (a lower HTL) 650, a lower EML 660 and a first ETL (a lower ETL) 670. The first emitting unit 630 may further include a first EBL (a lower EBL) 655 disposed between the first HTL 650 and the lower EML 660 and/or a first HBL (a lower HBL) 675 disposed between the lower EML 660 and the first ETL 670.

The second emitting unit 730 includes a second HTL (an upper HTL) 750, an upper EML 760, a second ETL (an upper ETL) 770 and an EIL 780. The second emitting unit 730 may further include a second EBL (an upper EBL) 755 disposed between the second HTL 750 and the upper EML 760 and/or a second HBL (an upper HBL) 775 disposed between the upper EML 760 and the second ETL 770.

At least one of the lower EML 660 and the upper EML 760 may emit blue (B) light. As an example, both the lower and upper EMLs 660 and 760 may emit blue light. Alternatively, one of the lower and upper EMLs 660 and 760 may emit blue light and the other of the lower and upper EMLs 660 and 760 may emit other any light having emission wavelength ranges longer than the blue light, for example, green (G), yellow-green (YG), yellow (Y) and/or Orange. Hereinafter, the OLED 600, where the lower EML 660 emits blue light and the upper EML 760 emits green, yellow-green, yellow and/or orange light, will be explained.

The HIL 640 is disposed between the first electrode 610 and the first HTL 650 and improves an interface property between the inorganic first electrode 610 and the organic first HTL 650. In one exemplary embodiment, the HIL 640 may include, but are not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 640 may be omitted in compliance with a structure of the OLED 600.

Each of the first and second HTLs 650 and 750 may independently include, but are not limited to, TPD, NPD (NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

Each of the first and second ETLs 670 and 770 facilitates electron transportations in the first emitting unit 630 and the second emitting unit 730, respectively. Each of the first and second ETLs 670 and 770 may independently include, but are not limited to, oxadiazole-based compounds, triazole-based compounds, phenanthroline-based compounds, benzoxazole-based compounds, benzothiazole-based compounds, benzimidazole-based compounds, triazine-based compounds, and the likes, respectively. As an example, each of the first and second ETLs 670 and 770 may independently include, but are not limited to, Alq$_3$, PBD, spiro-PBD, Liq, TPBi, BAlq, Bphen, NBphen, BCP, TAZ, NTAZ, TpPyPB, TmPPPyTz, PFNBr and/or TPQ, respectively.

The EIL 780 is disposed between the second electrode 620 and the second ETL 770, and can improve physical properties of the second electrode 620 and therefore, can enhance the life span of the OLED 600. In one exemplary embodiment, the EIL 680 may include, but are not limited to, an alkali halide such as LiF, CsF, NaF, BaF$_2$ and the likes, and/or an organic metal compound such as lithium benzoate, sodium stearate, and the likes.

Each of the first and second EBLs 655 and 755 may independently include, but are not limited to, TCTA, Tris [4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB and/or 3,6-bis(N-carbazolyl)-N-phenyl-carbazole, respectively.

Each of the first and second HBLs 675 and 775 may independently include, but are not limited to, oxadiazole-based compounds, triazole-based compounds, phenanthroline-based compounds, benzoxazole-based compounds, benzothiazole-based compounds, benzimidazole-based compounds, and triazine-based compounds. As an example, each of the first and second HBLs 675 and 775 may independently include, but are not limited to, BCP, BAlq, Alq$_3$, PBD, spiro-PBD, Liq, B3PYMPM, DPEPO, 9-(6-(9H-carbazol-9-yl)pyridine-3-yl)-9H-3,9'-bicarbazole and combination thereof, respectively.

In one exemplary embodiment, when the upper EML 760 emits green light, the upper EML 760 may be, but are not limited to, a phosphorescent emitting material layer that includes a host (e.g. CBP and the likes) and an iridium-based dopant (e.g. Iridium (III) bis(2,4-diphenyloxazolato-1,3-N, C2')(acetyl acetonate) (dpo$_2$Ir(acac)), Iridium (III) bis(2-phenyl-oxazolinato-N,C2')(acetyl acetonate) (op$_2$Ir(acac)) and the likes). Alternatively, the upper EML 760 may be a fluorescent material including Alq as a dopant. In this case, the upper EML 760 may emit green light having, but are not limited to, emission wavelength ranges of about 510 nm to about 570 nm.

In another exemplary embodiment, when the upper EML 760 emits yellow light, the upper EML 760 may have a single-layered structure of yellow-green EML or a double-layered structure of a yellow-green EML and green EML. As an example, when the upper EML 760 is a yellow-green EML, the upper EML 760 may include, but are not limited to, a host selected from at least one of CBP and BAlq and a phosphorescent dopant emitting yellow-green light. In this case, the upper EML 760 may emit yellow-green light having, but are not limited to, emission wavelength ranges of about 510 nm to about 590 nm.

In still another exemplary embodiment, the upper EML 760 may have two EMLs, for example, a yellow-green EML and a red EML. As an example, when the upper EML 760 is a yellow-green EML, the upper EML 760 may have a single-layered structure of yellow-green EML or a double-layered structure of a yellow-green EML and green EML. When the upper EML 760 has a single-layered structure of the yellow-green EML, the upper EML 760 may include, but are not limited to, a host selected from at least one of CBP and BAlq and a phosphorescent dopant emitting yellow-green light.

The charge generation layer (CGL) 800 is disposed between the first emitting unit 630 and the second emitting unit 730. The CGL 800 includes an N-type CGL 810 disposed adjacently to the first emitting unit 630 and a P-type CGL 820 disposed adjacently to the second emitting unit 730. The N-type CGL 810 injects electrons into the first emitting unit 630 and the P-type CGL 820 injects holes into the second emitting unit 730.

As an example, the N-type CGL 810 may be a layer doped with an alkali metal such as Li, Na, K and/or Cs and/or an alkaline earth metal such as Mg, Sr, Ba and/or Ra. For example, a host used in the N-type CGL 810 may include, but are not limited to, an organic compound such as Bphen or MTDATA. The alkali metal or the alkaline earth metal may be doped by about 0.01 wt % to about 30 wt %.

The P-type CGL 820 may include, but are not limited to, an inorganic material selected from the group consisting of tungsten oxide (WO$_x$), molybdenum oxide (MoO$_x$), beryllium oxide (Be$_2$O$_3$), vanadium oxide (V$_2$O$_5$) and combination thereof, and/or an organic material selected from the group consisting of NPD, HAT-CN, 2,3,5,6-Tetrafluoro-7,7,8,8-tetracyanoquinodimethane (F4TCNQ), TPD, N,N,N',N'-Tetranaphthalenyl-benzidine (TNB), TCTA, N,N'-dioctyl-3,4,9,10-perylenedicarboximide (PTCDI-C8) and combination thereof.

The lower EML 660 includes a first EML (EML1) 662, a second EML (EML2) 664 and a third EML3 (EML3) 666. The EML1 662 is disposed between the first EBL 655 and the first HBL 675, the EML2 664 is disposed between the first EBL 655 and the EML1 662, and the EML3 666 is disposed between the EML1 662 and the first HBL 675. The EML1 662 includes first and second delayed fluorescent dopants and each of the EML2 664 and EML3 666 includes a first fluorescent dopant and a second fluorescent dopant, respectively. Each of the EML1 662, EML2 664 and EML3 666 further includes a first host, a second host and a third host, respectively.

The singlet and triplet exciton energies of the first delayed fluorescent dopant, which is included in the EML1 662, is transferred to the first and second fluorescent dopants each of which is included in the EML2 664 and EML3 666 disposed adjacently to the EML1 662 by FRET energy transfer mechanism. Accordingly, the ultimate emission occurs in the first and second fluorescent dopants in the EML2 664 and the EML3 666.

In other words, the triplet exciton energy of the first delayed fluorescent dopant is converted to the singlet exciton energy of its own in the EML1 662 by RISC mechanism, then the singlet exciton energy of the first delayed fluorescent dopant is transferred to the singlet exciton energy of the first and second fluorescent dopants because the excited state singlet energy level $S_1^{TD1}$ of the first delayed fluorescent dopant is higher than the excited state singlet energy levels $S_1^{FD1}$ and $S_1^{FD2}$ of the first and second fluorescent dopants (See, FIG. 11). The first and second fluorescent dopants in the EML2 664 and EML3 666 can emit light using the singlet exciton energy and the triplet exciton energy derived from the delayed fluorescent dopant. Therefore, the OLED 600 enhance its luminous efficiency and color purity owing to the narrow FWHM of the first and second fluorescent dopants.

In addition, each of the EML1 662, the EML2 664 and the EML3 666 include the first host, the second host and the third host, respectively. The first to third hosts are the same as or different from one another. As an example, each of the first to third host may independently include, but are not limited to, mCP-CN, CBP, mCBP, mCP, DPEPO, PPT, TmPyPB, PYD-2CZ, DCzDBT, DCzTPA, pCzB-2CN, mCzB-2CN, TPSO1, CCP, 4-(3-(triphenylen-2-yl)phenyl) dibenzo[b,d]thiophene, 9-(4-(9H-carbazol-9-yl)phenyl)-9H-

3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

Each of the first and second delayed fluorescent dopants that may be included in the EML1 662 is not particularly limited as long as they satisfy the above-mentioned relationships in Equations (1) to (8). As an example, the first delayed fluorescent dopant may include anyone having the structure of Chemical Formula 5 and the second delayed fluorescent dopant may include anyone having the structure of Chemical Formula 6.

As an example, each of the first and second fluorescent dopants, which may be included in the EML2 664 or in the EML3 666, may include, but are not limited to, anthracene-based derivatives, tetracene-based derivative, chrysene-based derivatives, phenanthren-based derivatives, pyrene-based derivatives, perylene-based derivatives, stilbene-based derivatives, acridone-based derivatives, coumarin-based derivatives, phenoxazine-based derivatives and phenothiazine-based derivatives. Particularly, the first fluorescent dopant may include, but are not limited to, PAP2BPy, PAPP2BPy, 1,6-FLPAPrn, YGA2S, YGAPA, PCAPA, TBP, PCBAPA, 2PCAPPA, coumarin 30, 2PCAPA, 2PCABPhA, DPhAPhA, (DPQd, BPT, DCM1, DCM2, p-mPhTD, p-mPhAFD, DCJTI, DCJTB and N,N,N',N'-Tetraphenyl-pyrene-1,6-diamine.

In this case, the energy level relationships among the luminous materials, i.e. the first to third hosts, the first and second delayed fluorescent dopants and the first and second fluorescent dopants in the EML 660 may be identical as illustrated in FIG. 11.

In one exemplary embodiment, each of the first to third hosts may have more weight ratio than the first and second delayed fluorescent dopants and the first and second fluorescent dopant in the EML1 662, the EML2 664 and the EML3 666, respectively. In addition, the weight ratio of the first delayed fluorescent dopant in the EML1 662 may be larger than each of the weight ratio of the first and second fluorescent dopants in the EML2 664 and the EML3 666, respectively. In this case, it is possible to transfer enough energy from the first delayed fluorescent dopant in the EML1 662 to the first and second fluorescent dopants in the EML2 664 and in the EML3 666 by FRET mechanism. Moreover, the content of the second delayed fluorescent dopant is less than the content of the first delayed fluorescent dopant but may be larger than a half of the content of the first delayed fluorescent dopant in the EML1 662.

In an alternatively exemplary embodiment, the second host, which is included in the EML2 664 together with the first fluorescent dopant, may be the same material as the first EBL 655. In this case, the EML2 664 may have an electron blocking function as well as an emission function. In other words, the EML2 664 can act as a buffer layer for blocking electrons. In one embodiment, the first EBL 655 may be omitted where the EML2 664 may be an electron blocking layer as well as an emitting material layer.

In another exemplary embodiment, the third host, which is included in the EML3 666 together with the second fluorescent dopant, may be the same material as the first HBL 675. In this case, the EML3 666 may have a hole blocking function as well as an emission function. In other words, the EML3 666 can act as a buffer layer for blocking holes. In one embodiment, the first HBL 675 may be omitted where the EML3 666 may be a hole blocking layer as well as an emitting material layer.

In still another exemplary embodiment, the second host in the EML2 664 may be the same material as the first EBL 655 and the third host in the EML3 666 may be the same material as the first HBL 675. In this embodiment, the EML2 664 may have an electron blocking function as well as an emission function, and the EML3 666 may have a hole blocking function as well as an emission function. In other words, each of the EML2 664 and the EML3 666 can act as a buffer layer for blocking electrons or hole, respectively. In one embodiment, the first EBL 655 and the first HBL 675 may be omitted where the EML2 664 may be an electron blocking layer as well as an emitting material layer and the EML3 666 may be a hole blocking layer as well as an emitting material layer.

In an alternative embodiment, the lower EML 660 may have a single-layered structure as illustrated in FIG. 2. In this case, the lower EML 660 may include a first host, first and second delayed fluorescent dopant, and optionally a first fluorescent dopant. In another alternative embodiment, the lower EML 660 may have a double-layered structure as illustrated in FIG. 8. In this case, the lower EML 660 may include a first EML and a second EML. The first EML may include a first host and first and second delayed fluorescent dopant, and the second EML may include a second host and a first fluorescent dopant.

In still another exemplary embodiment, an OLED of the present disclosure may further includes a third emitting unit disposed between the second emitting unit 730 and the second electrode 620 and a second CGL disposed between the second emitting unit 730 and the third emitting unit. In this case, at least one of the first emitting unit 630, the second emitting unit 730 and the third emitting unit may include an emitting material layer which includes at least one host and first and second fluorescent dopants, as described above.

SYNTHESIS EXAMPLE 1

Synthesis of Compound 1

(1) Synthesis of Intermediate c

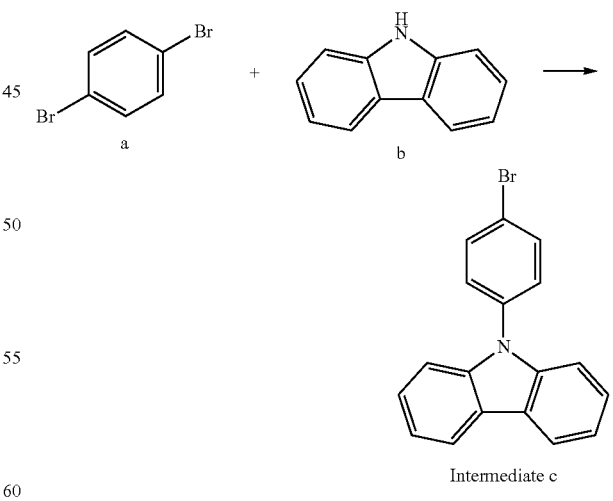

Intermediate c 1 equivalent of compound a (1,4-dibromobenzene; CAS Registration No: 106-37-6), 2.5 equivalents of compound b (carbazole, CAS Registration No: 86-74-8), 0.1 equivalent of tris(dibenzylideneacetone)dipalladium (0)(Pd(dba)$_3$), 0.1 equivalent of tri-tert-butylphosphine and 5 equivalents of sodium-t-botanolate was dissolved in toluene under N$_2$ purging condition, and then the solution was stirred for 30 minutes at room temperature. The solution was placed into an oil bath at 111° C., and then stirred again with refluxing for 12 hours. After the reactants were cooled to room temperature, water was added into the solution to terminate a reaction. The solution was extracted with ethyl acetate and distilled water and MgSO₄ was added to remove moisture. After removing the organic solvent, obtained crude product was wet purified using dichloromethane/hexane as a developing solvent to give intermediate c.

(2) Synthesis of Intermediate d

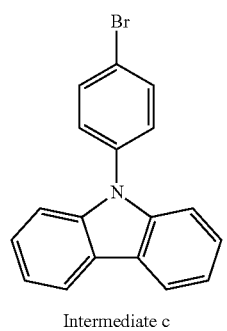

Intermediate c

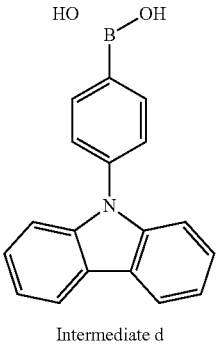

Intermediate d

A solution of 1 equivalent of intermediate c dissolved in tetrahydrofuran (THF) was cooled to 78° C. under N₂ purging condition. Another solution of 1.3 equivalents of n-butyl-lithium dissolved in hexane was added into the solution and then the mixed solution was stirred for 3 hours and stirred for 30 minutes at room temperature. The mixed solution was cooled to −75° C., and 1.5 equivalents of trimethyl borate were added into the mixed solution and then the mixed solution was stirred again for 3 hours at room temperature. 3-5 drops of hydrogenchloride was added drop wisely to the mixed solution and then water as added to terminate a reaction. The mixed solution was extracted with dichloromethane and then moisture was removed by adding MgSO₄ to give intermediate d.

(3) Synthesis of Compound 1

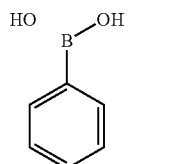

Intermediate d

+

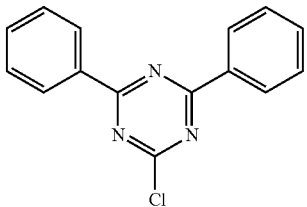

e

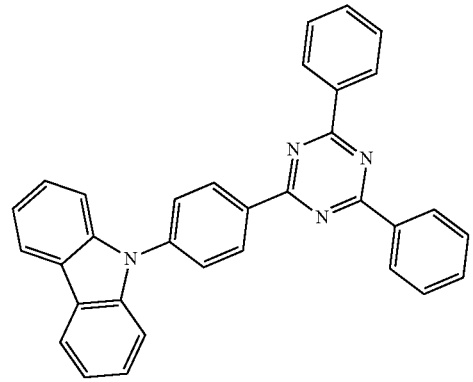

Compound 1

1 equivalent of intermediate d, 1.5 equivalents of compound e (2-chloro-4,6-diphenyl-1,3,5-triazine; CAS Registration No: 3842-55-5), 0.05 equivalent of tetrakis(triphenylphosphine)platinum(0) (Pt(PPh₃)₄) and 3 equivalents of 2M aqueous Na₂CO₃ were dissolved in a mixed solvent of toluene and ethanol (2:1) under N₂ purging condition, and then the solution was stirred about 30 minutes at room temperature. The solution was placed into an oil bath at 120° C., and then stirred again with refluxing for 3 hours. After the reactants were cooled, water was added into the solution to terminate a reaction. The solution was extracted with dichloromethane and distilled water and MgSO₄ was added to remove moisture. After removing the organic solvents, obtained crude product was wet purified using dichloromethane/hexane as a developing solvent to give Compound 1.

SYNTHESIS EXAMPLE 2

Synthesis of Compound 12

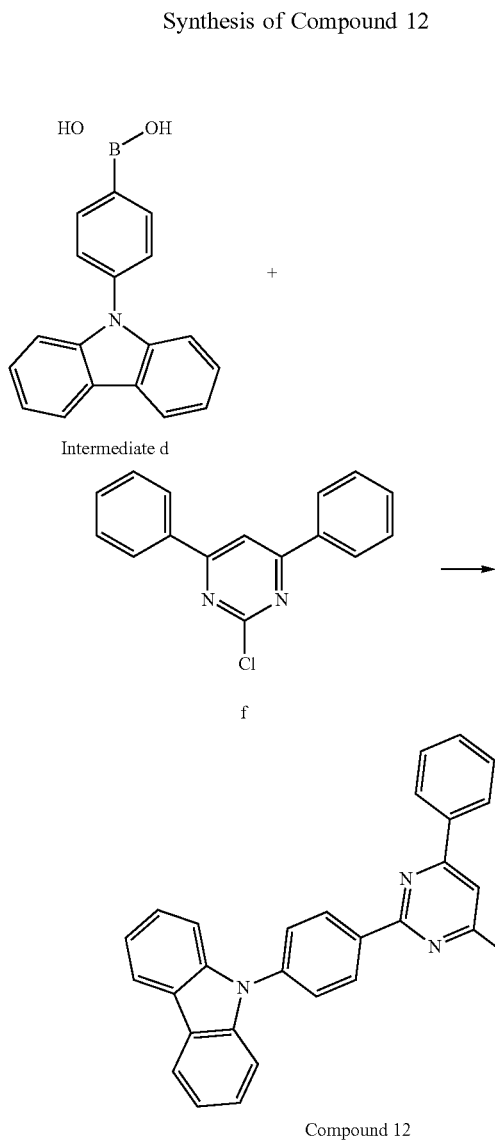

1 equivalent of intermediated d, 1.5 equivalents of compound f (2-chloro-4,6-diphenyl-1,3,5-pyrimidine; CAS Registration No: 2915-16-4), 0.05 equivalent of Pt(PPh$_3$)$_4$ and 3 equivalents of 2M aqueous Na$_2$CO$_3$ were dissolved in a mixed solvent of toluene and ethanol (2:1) under N$_2$ purging condition, and then the solution was stirred about 30 minutes at room temperature. The solution was placed into an oil bath at 120° C., and then stirred again with refluxing for 3 hours. After the reactants were cooled to room temperature, water was added into the solution to terminate a reaction. The solution was extracted with dichloromethane and distilled water and MgSO$_4$ was added to remove moisture. After removing the organic solvents, obtained crude product was wet purified using dichloromethane/hexane as a developing solvent to give Compound 12.

SYNTHESIS EXAMPLE 3

Synthesis of Compound A-29

(1) Synthesis of Intermediate i

A solution of 1 equivalent of intermediate h dissolved in a mixed solution of tetrahydrofuran (THF) and hexane (1:1) was cooled to 78° C. under N$_2$ purging condition, and 1.3 equivalents of n-butyl-lithium dissolved in hexane was added to the solution and the mixed solution was stirred for 2 hours and stirred for 30 minutes at room temperature. The mixed solution was cooled to −75° C., 1.5 equivalents of compound g (9-fluoreone) and methane sulfonic acid in chloroform was added sequentially to the mixed solution and then the solution was stirred under reflux for 10 hours. Water was added into the solution to terminate a reaction, the mixed solution was extracted with dichloromethane and MgSO$_4$ was added to remove moisture. After removing the organic solvents, obtained crude product was wet purified using dichloromethane/hexane as a developing solvent to give intermediate i.

(2) Synthesis of Intermediate 1

-continued

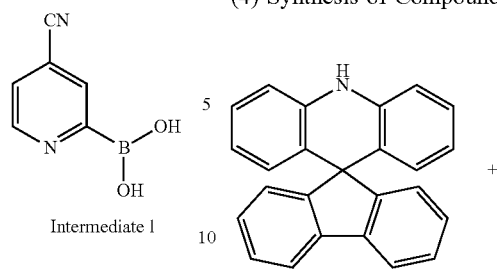

Intermediate l 1 equivalent of compound j (2-bromo-isonicotinonitrile; CAS Registration No: 10386-27-3), 1.5 equivalents of compound k (Bis(pinacolato)diboron; CAS Registration No: 73183-34-3) was dissolved in 1,4-dioxane, and 0.1 equivalent of 1,1-bis(diphenylphosphine)ferrocene palladium dichloride (Pd(dppf)Cl$_2$) and 3 equivalent of potassium acetate was added to the solution. The solution was stirred under reflux for 21 hours at 90° C. and then cooled down to room temperature in order to terminate a reaction. The crude product was filtered with celite and the solution was removed to give intermediate l.

(3) Synthesis of Intermediate n

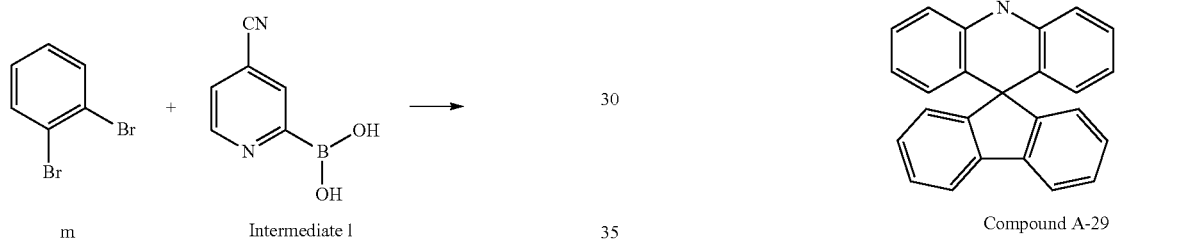

m           Intermediate l

Intermediate n 1.3 equivalents of compound m, 1 equivalent of intermediate l, 0.05 equivalent of Pt(PPh$_3$)$_4$ and 3 equivalents of 2M aqueous Na$_2$CO$_3$ were dissolved in a mixed solvent of toluene and ethanol (2:1) under N$_2$ purging condition, and then the solution was stirred about 30 minutes at room temperature. The solution was placed into an oil bath at 120° C., and then stirred again with refluxing for 3 hours. After the reactants were cooled to room temperature, water was added into the mixed solution to terminate a reaction. The solution was extracted with dichloromethane and distilled water and MgSO$_4$ was added to remove moisture. After removing the organic solvents, obtained crude product was wet purified using dichloromethane/hexane as a developing solvent to give intermediate n.

(4) Synthesis of Compound A-29

Intermediate i

Intermediate n

Compound A-29

1 equivalent of intermediate i, 1.2 equivalents of intermediate n, 0.1 equivalent of tri-tert-butylphosphine, 0.1 equivalent of Pd(dba)$_3$ and 5 equivalents of sodium n-butanolate were dissolved in toluene under N$_2$ purging condition, and then the solution was stirred for about 30 minutes at room temperature. The solution was placed into an oil bath at 120° C., and then stirred again with refluxing for 2 hours. After the reactants were cooled to room temperature, water was added to the reactants to terminate a reaction. The solution was extracted with dichloromethane and distilled water and MgSO$_4$ was added to remove moisture. After removing the organic solvent, obtained crude product was wet purified using dichloromethane/hexane as a developing solvent to give Compound A-29.

SYNTHESIS EXAMPLE 4

Synthesis of Compound A-26

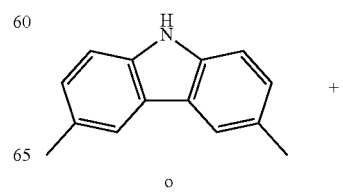

o

-continued

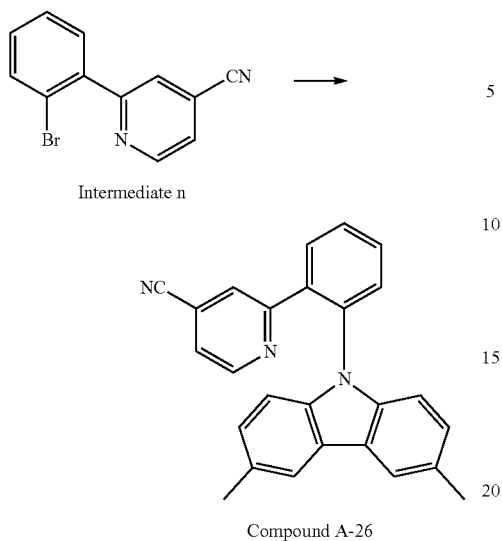

Intermediate n

Compound A-26

1 equivalent of compound o (3,6-dimethyl-9H-carbazole; CAS Registration No: 5599-50-8), 1.2 equivalents of intermediate n, 0.1 equivalent of tri-tert-butylphosphine, 0.1 equivalent of Pd(dba)$_3$ and 5 equivalents of sodium n-butanolate were dissolved in toluene under N$_2$ purging condition, and then the solution was stirred for about 30 minutes at room temperature. The solution was placed into an oil bath at 120° C., and then stirred again with refluxing for 2 hours. After the reactants were cooled to room temperature, water was added to the reactants to terminate a reaction. The solution was extracted with dichloromethane and distilled water and MgSO$_4$ was added to remove moisture. After removing the organic solvents, obtained crude product was wet purified using dichloromethane/hexane as a developing solvent to give Compound A-26.

SYNTHESIS EXAMPLE 5

Synthesis of Compound A-17

(1) Synthesis of Intermediate q

-continued

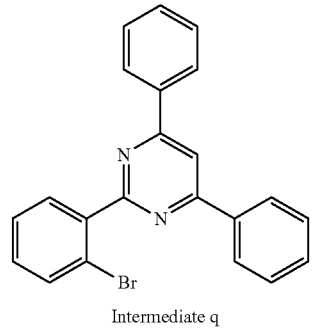

Intermediate q 1.5 equivalents of compound p ((2-bromophenyl)boronic acid); CAS Registration No: 244205-40-1), 1 equivalent of compound f (2-chloro-4,6-diphenyl-1,3,5-pyrimidine; CAS Registration No: 2915-16-4), 0.05 equivalent of Pt(PPh$_3$)$_4$ and 3 equivalents of 2M aqueous Na$_2$CO$_3$ were dissolved in a mixed solvent of toluene and ethanol (2:1) under N$_2$ purging condition, and then the solution was stirred about 30 minutes at room temperature. The solution was placed into an oil bath at 120° C., and then stirred again with refluxing for 3 hours. After the reactants were cooled to room temperature, water was added into the reactants to terminate a reaction. The solution was extracted with dichloromethane and distilled water and MgSO$_4$ was added to remove moisture. After removing the organic solvents, obtained crude product was wet purified using dichloromethane/hexane as a developing solvent to give intermediate q.

(2) Synthesis of Compound A-17

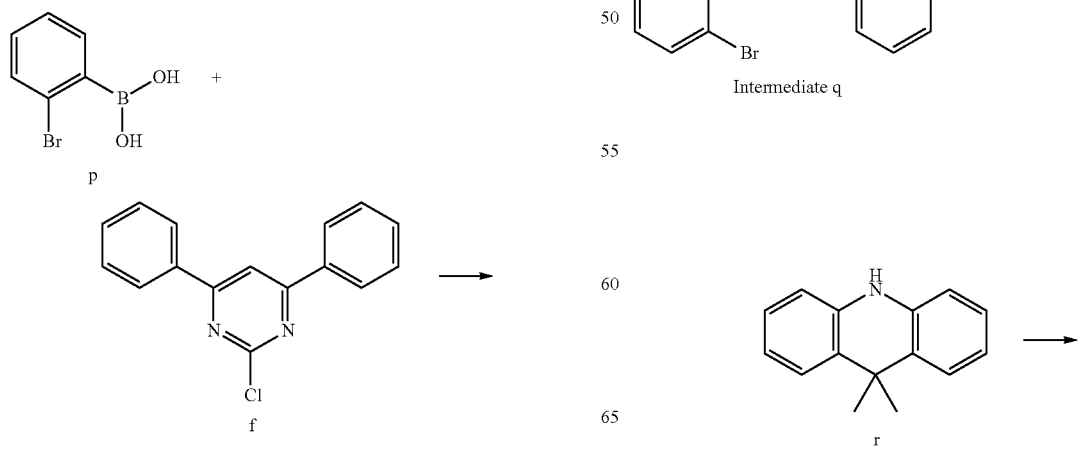

-continued

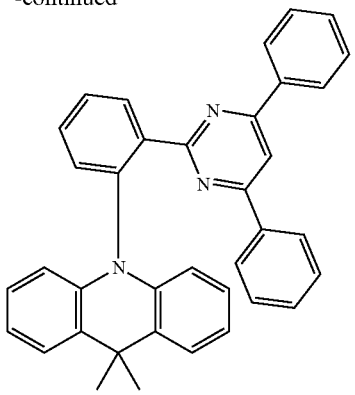

Compound A-17

1 equivalent of intermediate q, 1.5 equivalents of compound r (9,10-dihydro-9,10-dimethyl acridine; CAS Registration No: 6267-02-03), 0.1 equivalent of tri-tert-butylphosphine, 0.1 equivalent of Pd(dba)$_3$ and 5 equivalents of sodium n-butanolate were dissolved in toluene under N$_2$ purging condition, and then the solution was stirred for about 30 minutes at room temperature. The solution was placed into an oil bath at 120° C., and then stirred again with refluxing for 2 hours. After the reactants were cooled to room temperature, water was added to the reactants to terminate a reaction. The solution was extracted with dichloromethane and distilled water and MgSO$_4$ was added to remove moisture. After removing the organic solvent, obtained crude product was wet purified using dichloromethane/hexane as a developing solvent to give Compound A-17.

SYNTHESIS EXAMPLE 6

Synthesis of Compound A-67

(1) Synthesis of Intermediate u

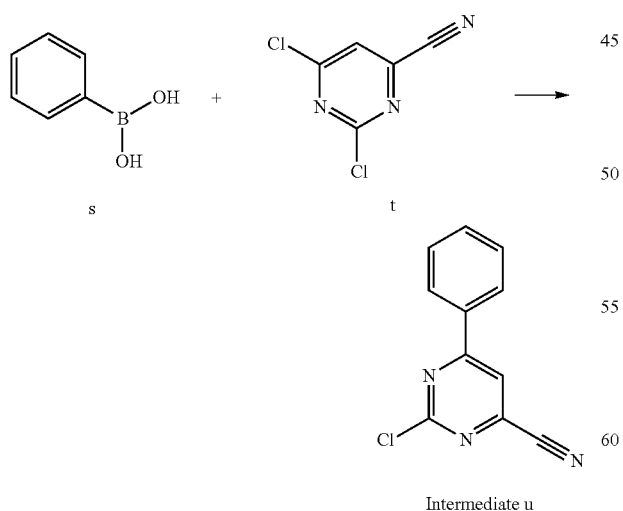

0.8 equivalent of compound s (phenyl boronic acid; CAS Registration No: 98-80-6), 1 equivalent of compound t (2,6-dichloropyrimidine-4-carbonitrile; CAS Registration No: 26293-93-6), 0.05 equivalent of Pt(PPh$_3$)$_4$ and 3 equivalents of 2M aqueous Na$_2$CO$_3$ were dissolved in a mixed solvent of toluene and ethanol (2:1) under N$_2$ purging condition, and then the solution was stirred about 30 minutes at room temperature. The solution was placed into an oil bath at 120° C., and then stirred again with refluxing for 3 hours. After the reactants were cooled to room temperature, water was added to the reactants to terminate a reaction. The solution was extracted with dichloromethane and distilled water and MgSO$_4$ was added to remove moisture. After removing the organic solvents, obtained crude product was wet purified using dichloromethane/hexane as a developing solvent to give intermediate u.

(2) Synthesis of Intermediate v

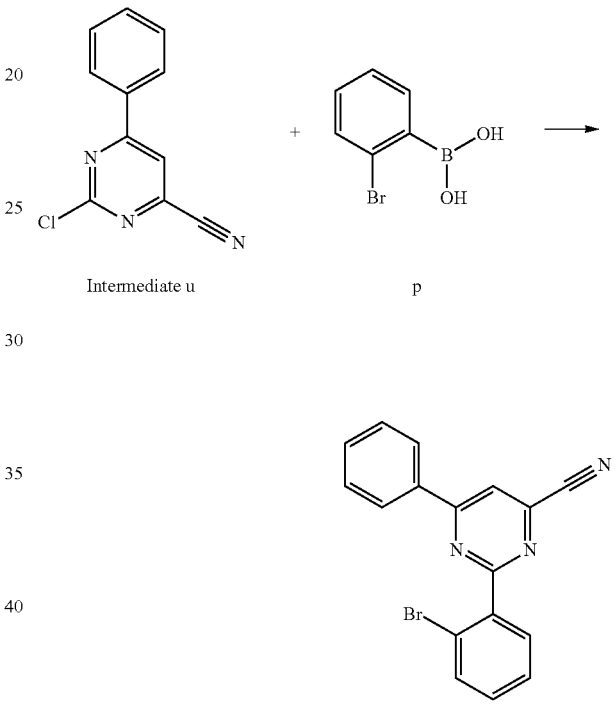

1 equivalents of intermediate u, 1.5 equivalents of compound p ((2-bromophenyl)boronic acid); CAS Registration No: 244205-40-1, 0.05 equivalent of Pt(PPh$_3$)$_4$ and 3 equivalents of 2M aqueous Na$_2$CO$_3$ were dissolved in a mixed solvent of toluene and ethanol (2:1) under N$_2$ purging condition, and then the solution was stirred about 30 minutes at room temperature. The solution was placed into an oil bath at 120° C., and then stirred again with refluxing for 3 hours. After the reactants were cooled to room temperature, water was added into the solution to terminate a reaction. The solution was extracted with dichloromethane and distilled water and MgSO$_4$ was added to remove moisture. After removing the organic solvents, obtained crude product was wet purified using dichloromethane/hexane as a developing solvent to give intermediate v.

(3) Synthesis of Compound A-67

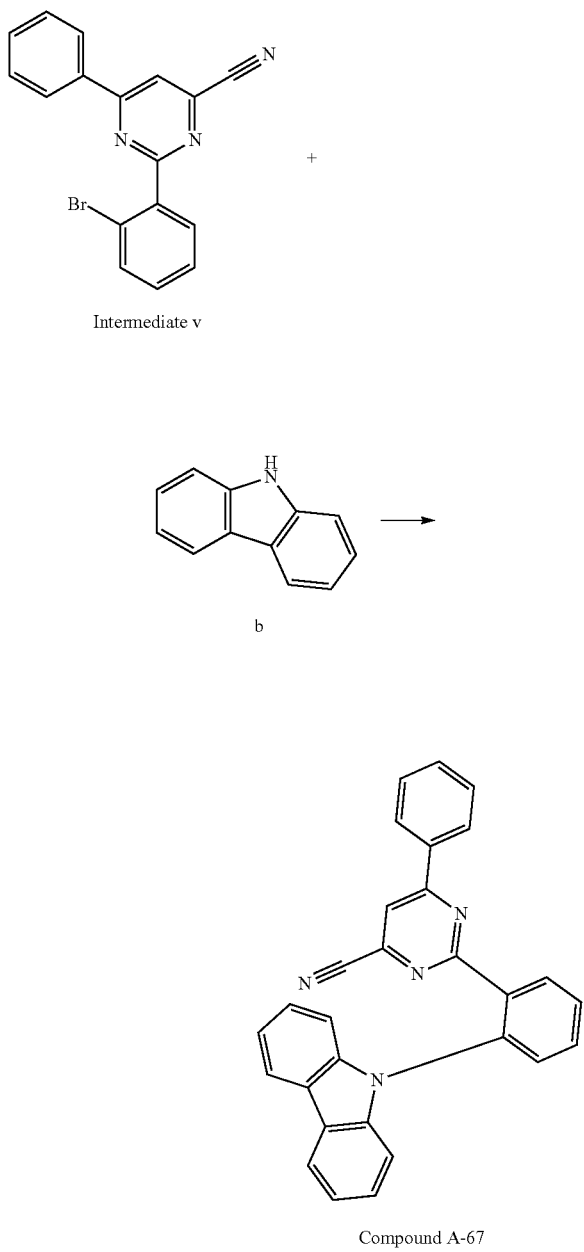

Intermediate v b

Compound A-67

1 equivalent of intermediate v, 1.2 equivalents of compound b (carbazole; CAS Registration No: 86-74-8), 0.1 equivalent of tri-tert-butylphosphine, 0.1 equivalent of Pd(dba)$_3$ and 5 equivalents of sodium n-butanolate were dissolved in toluene under N$_2$ purging condition, and then the solution was stirred for about 30 minutes at room temperature. The solution was placed into an oil bath at 111° C., and then stirred again with refluxing for 12 hours. After the reactants were cooled to room temperature, water was added to the reactants to terminate a reaction. The solution was extracted with ethyl acetate and distilled water and MgSO$_4$ was added to remove moisture. After removing the organic solvent, obtained crude product was wet purified using dichloromethane/hexane as a developing solvent to give Compound A-67.

SYNTHESIS EXAMPLE 7

Synthesis of Compound A-12

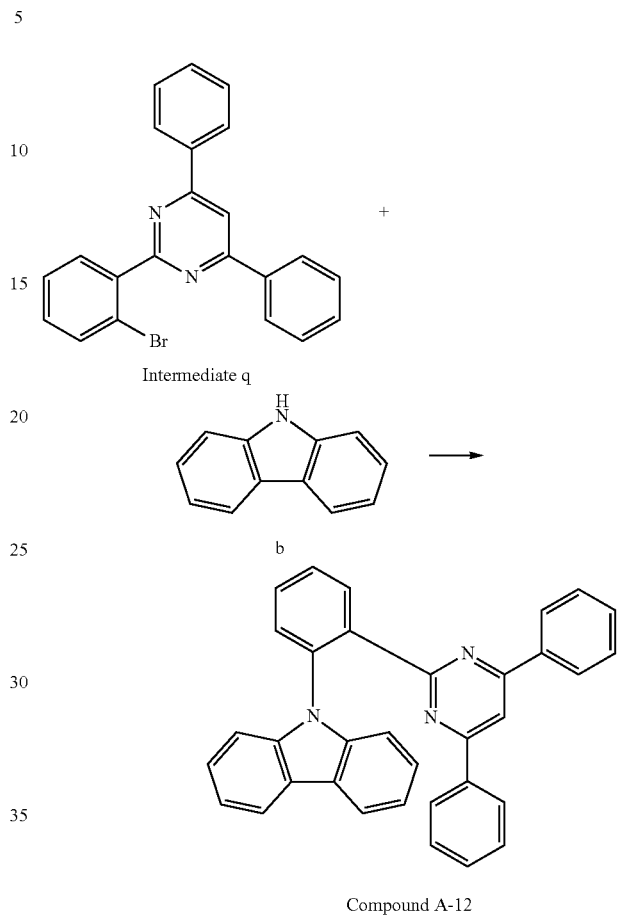

Intermediate q b

Compound A-12

1 equivalent of intermediate q, 1.2 equivalents of compound b (carbazole; CAS Registration No: 86-74-8), 0.1 equivalent of tri-tert-butylphosphine, 0.1 equivalent of Pd(dba)$_3$ and 5 equivalents of sodium n-butanolate were dissolved in toluene under N$_2$ purging condition, and then the solution was stirred for about 30 minutes at room temperature. The solution was placed into an oil bath at 111° C., and then stirred again with refluxing for 2 hours. After the reactants were cooled to room temperature, water was added to the reactants to terminate a reaction. The solution was extracted with ethyl acetate and distilled water and MgSO$_4$ was added to remove moisture. After removing the organic solvent, obtained crude product was wet purified using dichloromethane/hexane as a developing solvent to give Compound A-12.

EXPERIMENTAL EXAMPLE 1

Evaluation of Energy Level of Compound

Energy levels such as HOMO energy levels, LUMO energy levels and excited state triplet energy levels (T$_1$) were evaluated for compound 9-(6-(9H-carbazol-9-yl)-pyridin-3-yl)-9H-3,9-bicarbazole, which can be used as a host in an emitting material layer, and compounds in the Synthesis Examples 1 to 7 and compound 33, which can be used as a first delayed fluorescent dopant (TD1) or a second delayed fluorescent dopant (TD2). Table 1 indicates the evaluation results.

TABLE 1

Energy Level of Compound

|  | Compound | HOMO (eV) | LUMO (eV) | $T_1$ (eV) |
|---|---|---|---|---|
|  | Host | −5.90 | −2.60 |  |
| TD1 | Compound 1 | −5.80 | −2.90 | 2.70 |
|  | Compound 12 | −5.89 | −2.84 | 2.65 |
|  | Compound 33 | −5.88 | −2.70 | 2.76 |
| TD2 | Compound A-12 | −5.84 | −2.82 | 2.85 |
|  | Compound A-29 | −5.90 | −2.81 | 2.95 |
|  | Compound A-26 | −5.87 | −2.81 | 2.9 |
|  | Compound A-17 | −5.72 | −2.70 | 2.9 |
|  | Compound A-67 | −5.90 | −2.91 | 2.9 |

HOMO: Film (100 nm/ITO), by AC3;
LUMO: calculated from film absorption edge;
$T_1$: Calculated by Gaussian ED-DFT(time-dependent density functional theory)

EXAMPLE 1

Fabrication of Organic Light Emitting Diode (OLED)

An organic light emitting diode was fabricated applying 9-(6-(9H-carbazol-9-yl)-pyridin-3-yl)-9H-3,9-bicarbazole as a host, compound 1 as a first delayed fluorescent dopant (TD1) and compound A-12 as a second delayed fluorescent dopant (TD2) into an emitting material layer. ITO substrate was washed by UV-Ozone treatment before using, and was transferred to a vacuum chamber for depositing emission layer. Subsequently, an anode, an emission layer and a cathode were deposited by evaporation from a heating boat under $10^{-6}$ Torr vacuum condition as the following order:

An anode (ITO, 500 Å); a hole injection layer (HIL) (HAT-CN; 50 Å); a hole transport layer (HTL) (NPB, 500 Å); an electron blocking layer (EBL) (2,8-bis(9-phenyl-9H-carbazol-3-yl)dibenzo[b,d]thiophene; 100 Å); an emitting material layer (EML) (9-(6-(9H-carbazol-9-yl)pyridin-3-yl)-9H-3,9'-bicarbazole (host; H): Compound 1 (TD1): Compound A-12 (TD2)=50:30:20 by weigh ratio; 250 Å); a hole blocking layer (HBL) (DPEPO; 100 Å); an electron transport layer (ETL) (TPBi; 250 Å); an electron injection layer (EIL) (LiF; 8 Å); and a cathode (Al; 1000 Å).

And then, cappling layer (CPL) was deposited over the cathode and the device was encapsualted by glass. After deposition of emissve layer and the cathode, the OLED was transferred from the depostion chamber to a dry box for film formation, followed by encapsulation using UV-curable epoxy and moisture getter. The manufacture organic light emitting diode had an emision area of 9 mm². The enery levels among the host (H), the first delayed fluorescent dopant (TD1) and the second delayed fluorscent dopant (TD2) are as follows: $T_1^{TD2}-T_1^{TD1}=0.15$ eV; $HOMO^H<HOMO^{TD2}$; $HOMO^{TD1}-HOMO^{TD2}=0.04$ eV; $LUMO^H>LUMO^{TD2}$; $LUMO^{TD2}-LUMO^{TD1}=0.08$ eV.

EXAMPLE 2

Fabrication of OLED

An OLED was fabricated using the same materials as Example 1, except using Compound A-29 as the second delayed fluorescent dopant in place of Compound A-12 in the EML. The enery levels among the host (H), the first delayed fluorescent dopant (TD1) and the second delayed fluorscent dopant (TD2) are as follows: $T_1^{TD2}-T_1^{TD1}=0.25$ eV; $HOMO^H=HOMO^{TD2}$; $HOMO^{TD1}-HOMO^{TD2}=0.1$ eV; $LUMO^H>LUMO^{TD2}$; $LUMO^{TD2}-LUMO^{TD1}=0.09$ eV.

EXAMPLE 3

Fabrication of OLED

An OLED was fabricated using the same materials as Example 1, except using Compound A-26 as the second delayed fluorescent dopant in place of Compound A-12 in the EML. The enery levels among the host (H), the first delayed fluorescent dopant (TD1) and the second delayed fluorscent dopant (TD2) are as follows: $T_1^{TD2}-T_1^{TD1}=0.2$ eV; $HOMO^H<HOMO^{TD2}$; $HOMO^{TD1}-HOMO^{TD2}=0.07$ eV; $LUMO^H>LUMO^{TD2}$; $LUMO^{TD2}-LUMO^{TD1}=0.09$ eV.

COMPARATIVE EXAMPLE 1

Fabrication OLED

An OLED was fabricated using the same materials as Example 1, except that the EML includes 9-(6-(9H-carbazol-9-yl)-pyridin-3-yl)-9H-3,9-bicarbazole as a host of 70% by weight and Compound 1 as a single delayed fluorescent dopant of 30% by weight (Ref. 1).

COMPARATIVE EXAMPLE 2

Fabrication OLED

An OLED was fabricated using the same materials as Example 1, except using Compound A-17 as the second delayed fluorescent dopant in place of Compound A-12 in the EML (Ref. 2). The enery levels among the host (H), the first delayed fluorescent dopant (TD1) and the second delayed fluorescent dopant (TD2) are as follows: $T_1^{TD2}-T_1^{TD1}=0.2$ eV; $HOMO^H<HOMO^{TD2}$; $HOMO^{TD1}-HOMO^{TD2}=-0.08$ eV; $LUMO^H>LUMO^{TD2}$; $LUMO^{TD2}-LUMO^{TD1}=0.2$ eV.

COMPARATIVE EXAMPLE 3

Fabrication OLED

An OLED was fabricated using the same materials as Example 1, except using Compound A-67 as the second delayed fluorescent dopant in place of Compound A-12 in the EML (Ref. 3). The enery levels among the host (H), the first delayed fluorescent dopant (TD1) and the second delayed fluorescent dopant (TD2) are as follows: $T_1^{TD2}-T_1^{TD1}=0.2$ eV; $HOMO^H=HOMO^{TD2}$; $HOMO^{TD1}-HOMO^{TD2}=0.1$ eV; $LUMO^H>LUMO^{TD2}$; $LUMO^{TD2}-LUMO^{TD1}=-0.01$ eV.

COMPARATIVE EXAMPLE 4

Fabrication OLED

An OLED was fabricated using the same materials as Example 1, except using Compound 12 as the second delayed fluorescent dopant in place of Compound A-12 in the EML (Ref. 4). The enery levels among the host (H), the first delayed fluorescent dopant (TD1) and the second delayed fluorescent dopant (TD2) are as follows: $T_1^{TD2}-$ $T_1^{TD1}$=−0.05 eV; HOMO$^H$<HOMO$^{TD2}$; HOMO$^{TD1}$−HOMO$^{TD2}$=0.09 eV; LUMO$^H$>LUMO$^{TD2}$; LUMO$^{TD2}$−LUMO$^{TD1}$=0.06 eV.

COMPARATIVE EXAMPLE 5

Fabrication OLED

An OLED was fabricated using the same materials as Example 1, except using Compound 33 as the second delayed fluorescent dopant in place of Compound A-12 in the EML (Ref. 5). The enery levels among the host (H), the first delayed fluorescent dopant (TD1) and the second delayed fluorscent dopant (TD2) are as follows: $T_1^{TD2}$−$T_1^{TD1}$=0.06 eV; HOMO$^H$<HOMO$^{TD2}$; HOMO$^{TD1}$−HOMO$^{TD2}$=0.08 eV; LUMO$^H$>LUMO$^{TD2}$; LUMO$^{TD2}$−LUMO$^{TD1}$=0.2 eV.

COMPARATIVE EXAMPLE 6~10

Fabrication OLED

An OLED was fabricated using the same materials as Comparative Example 1, except using Compound A-12 (Comparative Example 6, Ref. 6), Compound A-17 (Comparative Example 7, Ref. 7), Compound A-67 (Comparative Example 8, Ref. 8), Compound 12 (Comparative Example 9, Ref. 9) or Compound 33 (Comparative Example 10) as a single delayed fluorescent dopant in place of Compound 1 in the EML.

EXPERIMENTAL EXAMPLE 2

Measurement of Luminous Properties of OLED

Each of the organic light emitting diode fabricated by Examples 1 to 3 and Comparative Examples 1 to 10 was connected to an external power source and luminous properties for all the diodes were evaluated using a constant current source (KEITHLEY) and a photometer PR650 at room temperature. In particular, driving voltage (V), current efficiency (cd/A), power efficiency (lm/W), external quantum efficiency (EQE; %), CIE color coordinates at a current density of 10 mA/cm$^2$ and a time period until luminescence is reduced to 95% level at 3000 nit (life span of the diode; $T_{95}$) of the light emitting diodes of Examples 1 to 3 and Comparative Examples 1 to 5 were measured. In addition, an Electroluminescent (EL) peak for each of the OLEDs in Example 1 to 3 and Comparative Examples 1 to 10 was measured. The results thereof are shown in the following Table 2 and FIGS. 13 to 17.

TABLE 2

Luminous Properties of OLED

| Sample | V | cd/A | lm/W | EQE | CIEx | CIEy | $T_{95}$(time)) |
|---|---|---|---|---|---|---|---|
| Example 1 | 4.2 | 9.5 | 7.1 | 9.2 | 0.140 | 0.261 | 40 |
| Example 2 | 4.0 | 10.2 | 8.0 | 10.0 | 0.140 | 0.260 | 50 |
| Example 3 | 4.1 | 9.8 | 7.5 | 9.8 | 0.140 | 0.259 | 42 |
| Ref. 1 | 4.0 | 9.2 | 7.2 | 9.0 | 0.140 | 0.260 | 2.1 |
| Ref. 2 | 4.6 | 3.5 | 2.4 | 3.4 | 0.158 | 0.302 | 3.0 |
| Ref. 3 | 5.0 | 2.1 | 1.3 | 3.0 | 0.155 | 0.280 | 2.6 |
| Ref. 4 | 4.1 | 3.6 | 2.8 | 3.8 | 0.150 | 0.270 | 2.0 |
| Ref. 5 | 4.1 | 5.4 | 4.1 | 6.0 | 0.150 | 0.275 | 10 |

As indicated in Table 2, each of the organic light emitting diodes of Examples includes two delayed fluorescent dopants whose energy levels are controlled in the EML lowered its driving voltage, enhanced its luminous efficiency and improved dramatically its life span. Particularly, compared with the OLEDs fabricated in the Comparative Examples, the OLEDs fabricated in the Examples lowered their driving voltages up to 20%, and improved their current efficiency up to 385.7%, power efficiency 515.4%, EQE up to 233.3% and life span up to 22.8 times.

Figure 13:
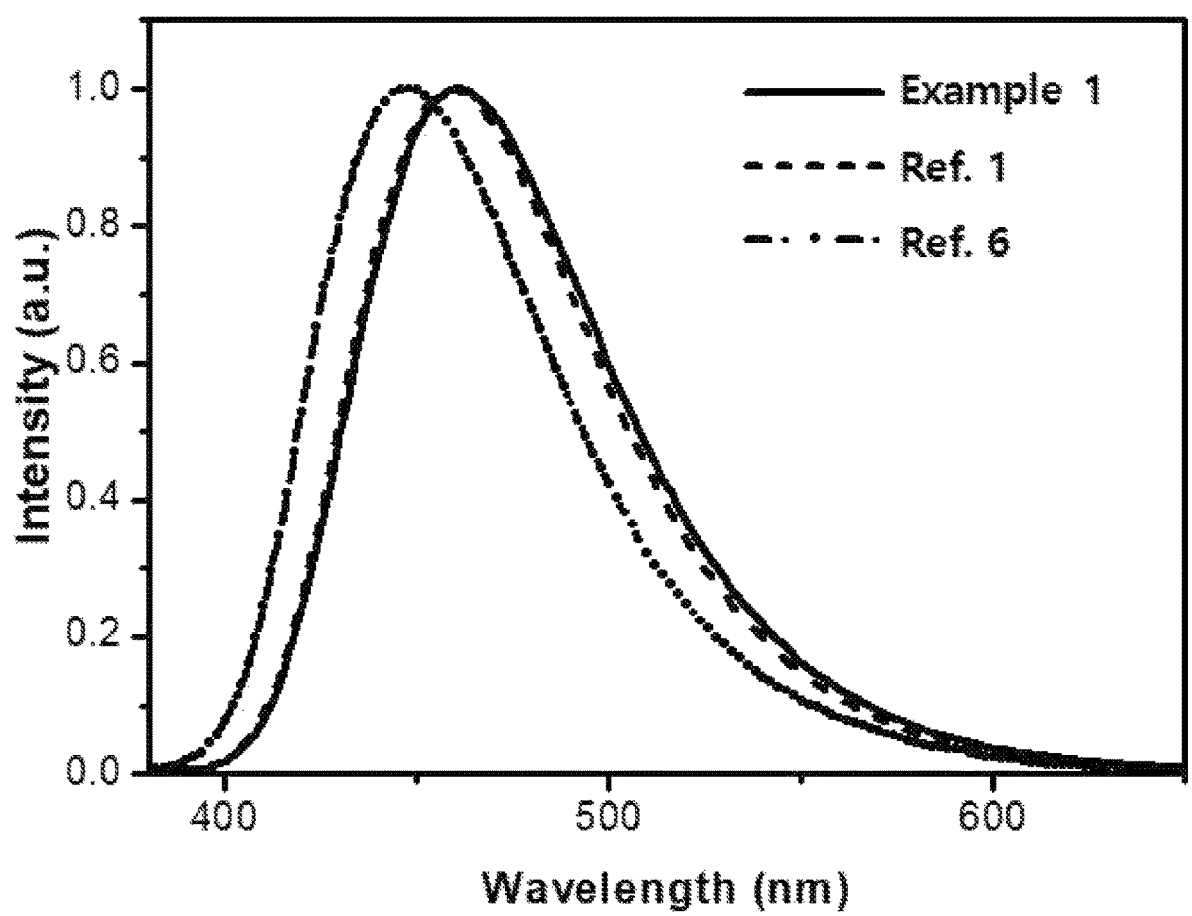
FIGS. 13 to 17 are graphs each of which illustrating electroluminescence (EL) spectrum of an organic light emitting diode in accordance with the Examples of the present disclosure.

With referring FIG. 13, the EL spectrum of the OLED fabricated in Example 1 showed the same EL spectrum of the OLED fabricated in Ref. 1, which used only the first delayed fluorescent dopant, and was different from the EL spectrum of the OLED fabricated in Ref. 6, which used only the second delayed fluorescent dopant. These results indicate that that substantial light emission is occurred in the first delayed fluorescent dopant whose excited triplet energy level was lower than the excited stated triplet energy level of the second delayed fluorescent dopant and the second delayed fluorescent dopant, which is added for increasing the life span of the OLED, is not involved in the light emission process in spite of using two different delayed fluorescent materials in the EML. On the contrary, the OLED fabricated in Ref. 1 only using a single delayed fluorescent material showed very short life span.

Figure 14:
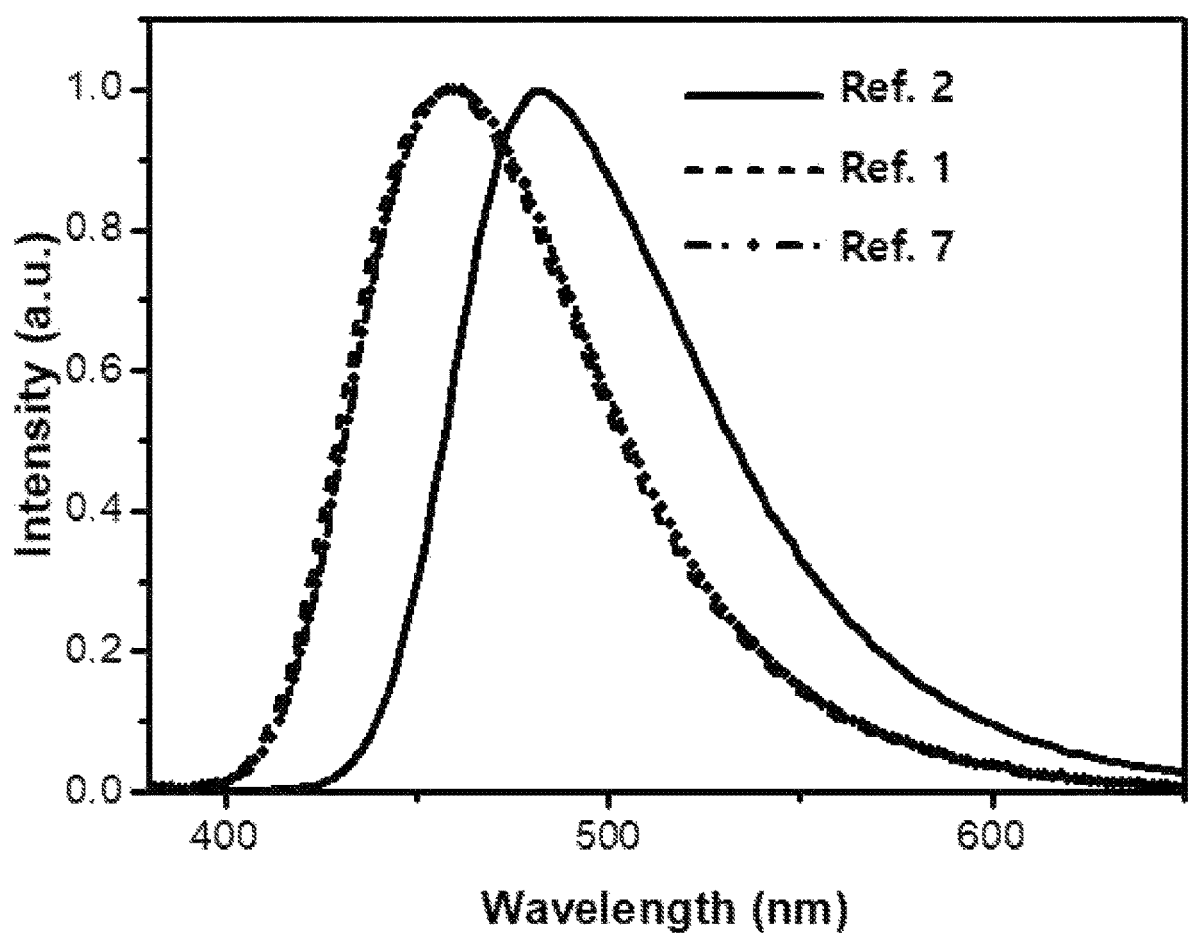

With referring FIG. 14, in case of the OLED fabricated in Ref. 2, which used the second delayed fluorescent dopant having a HOMO energy level shallower than a HOMO energy level of the first delayed fluorescent dopant, holes injected through the host are trapped in the second delayed fluorescent dopant. As a result, since an excited complex, i.e. exciplex is formed between the first delayed fluorescent dopant, which absorbs electrons, and the second delayed fluorescent dopant, which traps holes, the EL spectrum of the OLED in Ref. 2 is shifted toward long wavelength range, and the color purity, luminous efficiency and life span of the OLED in Ref. 2 are not increased compared to the OLED fabricated in Ref. 1.

Figure 15:
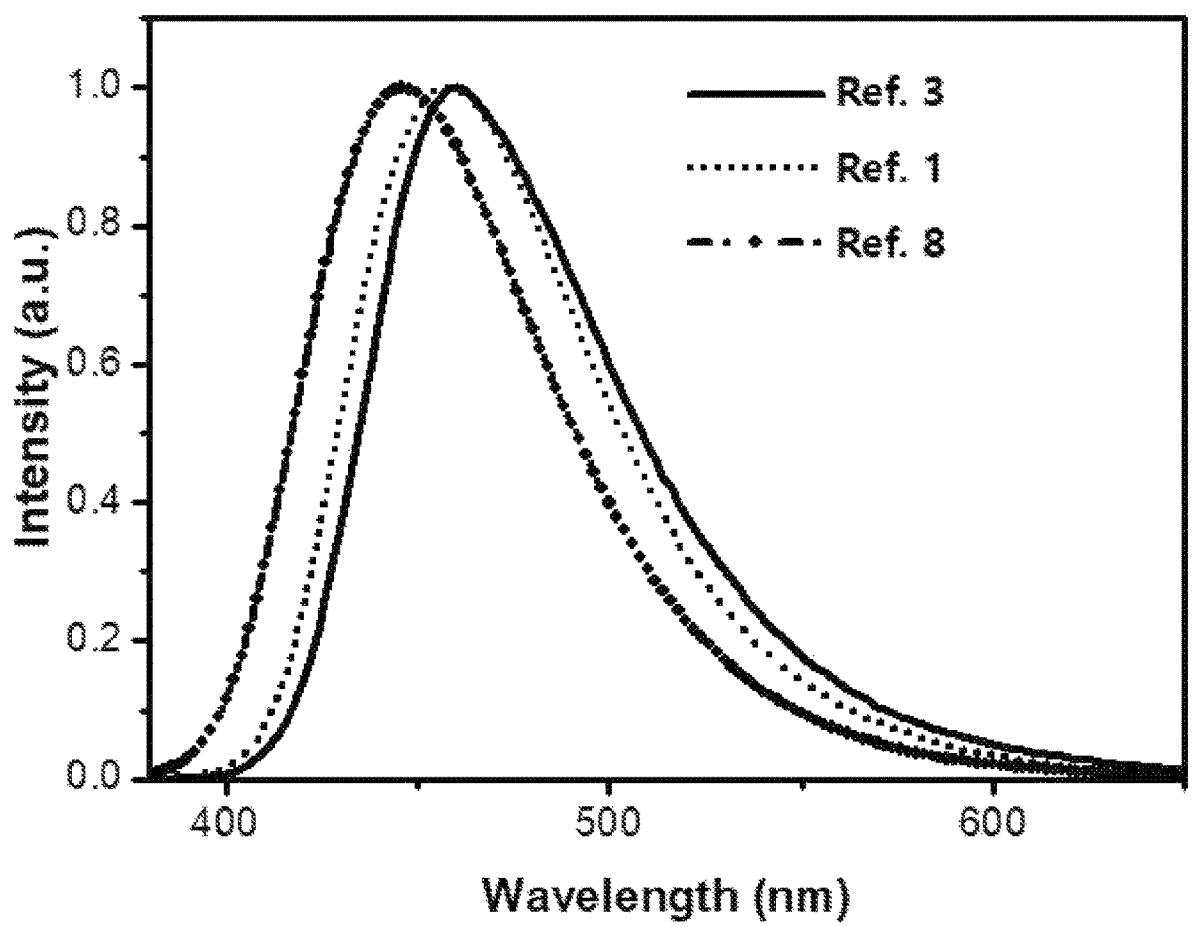

With referring FIG. 15, in case of the OLED fabricated in Ref. 3, which used the second delayed fluorescent dopant having a LUMO energy level identical as a LUMO energy level of the first delayed fluorescent dopant, a part of electrons injected through the host are trapped in the first delayed fluorescent dopant and a rest of electrons are trapped in the second delayed fluorescent dopant. Since an exciplex is formed between the second delayed fluorescent dopant, which a part of exciton energy of electrons, the first delayed fluorescent dopant, which absorbs exciton energy of holes, the EL spectrum of the OLED in Ref. 3 is shifted toward long wavelength range, and the color purity, luminous efficiency and life span of the OLED in Ref. 3 is not increased compared to the OLED fabricated in Ref. 1.

Figure 16:
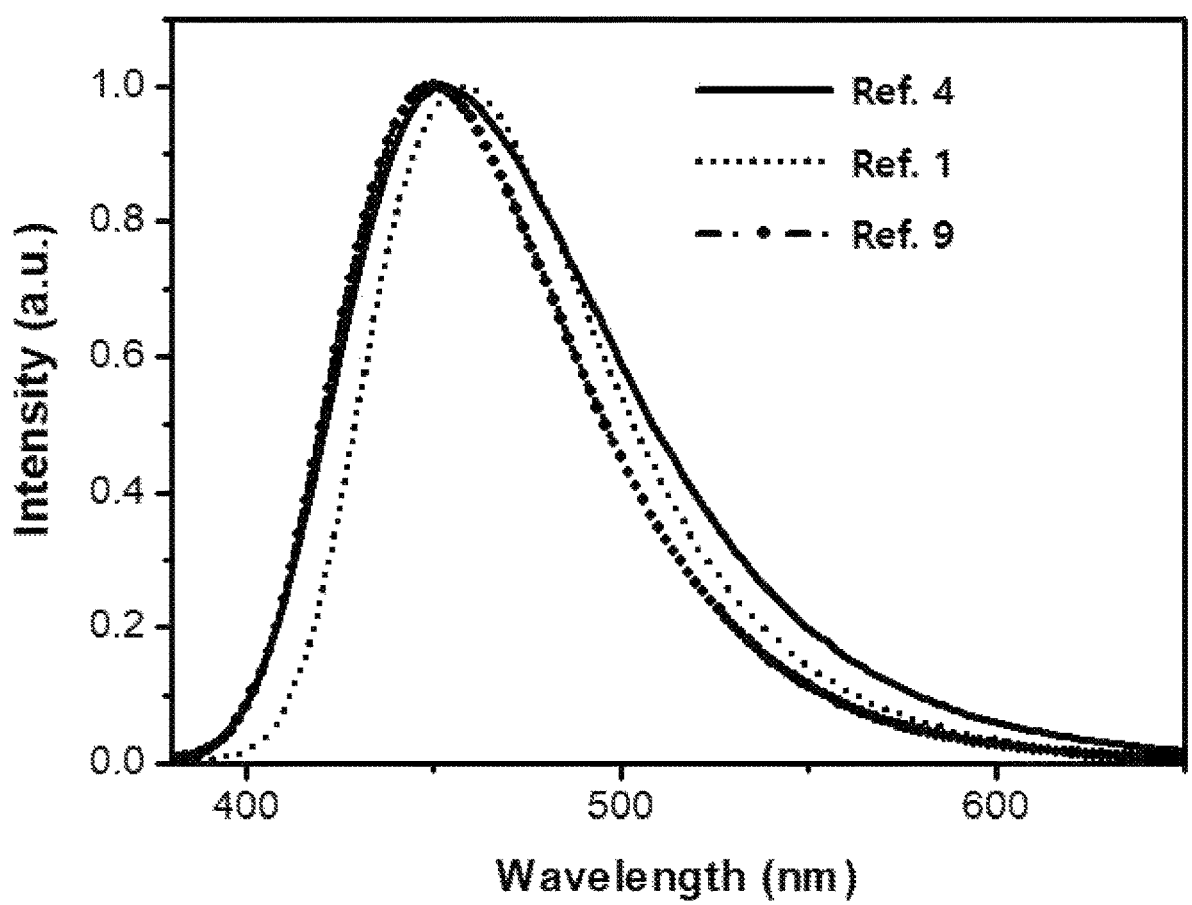

With referring FIG. 16, in case of the OLED fabricated in Ref. 4, which used the second delayed fluorescent dopant having an excited state triplet energy level lower than an exited state triplet energy level of the first delayed fluorescent dopant, a triplet exciton energy of the first delayed fluorescent dopant is transferred to the second delayed fluorescent dopant and quenched (triplet quenching), although holes and electron excitons are injected into the first delayed fluorescent dopant. As the amount of triplet excitons, which can perform RISC mechanism, is reduced in the first delayed fluorescent dopant, the OLED in Ref. 4 showed lower luminous efficiency. Also, sine each of the second delayed fluorescent dopant, which absorbed triplet exciton energy quenched in the first delayed fluorescent dopant, and the first delayed fluorescent dopant emit light, the OLED in Ref. 4 showed EL spectrum of blue light having wide FWHM (full-width at half maximum) and having reduced color purity owing to an overlapping of two different EL spectra. In addition, since the second delayed fluorescent dopant cannot 'hot triple excitons' of the first delayed fluorescent dopant, the OLED in Ref. 4 showed very short life span.

Figure 17:
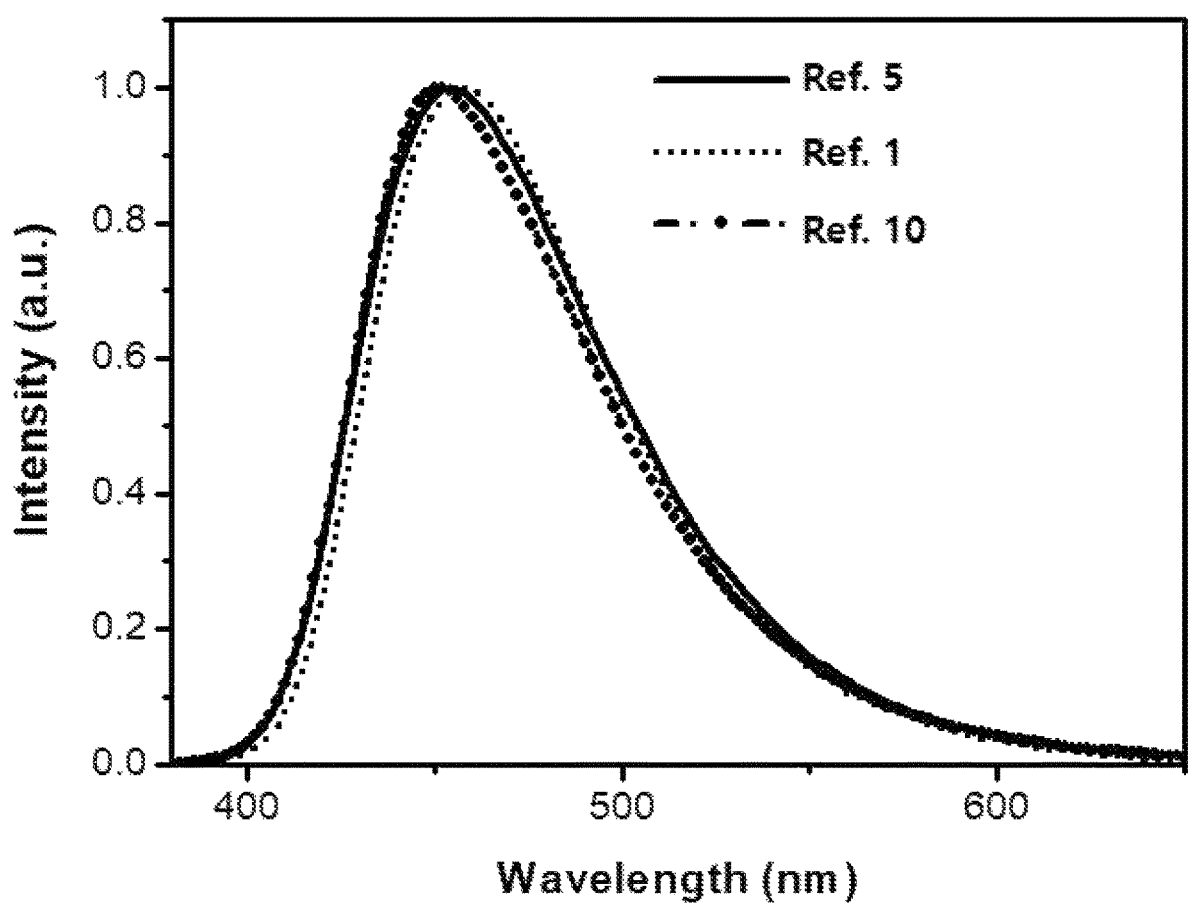

With referring FIG. 17, in case of the OLED fabricated in Ref. 5, which used the second delayed fluorescent dopant having an excited state triplet energy level very similar to the exited state triplet energy level of the first delayed fluorescent dopant, a triplet exciton energy of the first delayed fluorescent dopant is transferred to the second delayed fluorescent dopant and a part of triplet exciton energy of the first delayed fluorescent dopant is lost. As similar to Ref. 4, as the amount of triplet excitons, which can perform RISC mechanism, is reduced in the first delayed fluorescent dopant, the OLED in Ref. 5 showed reduced luminous efficiency. Also, sine each of the second delayed fluorescent dopant, which absorbed triplet exciton energy quenched in the first delayed fluorescent dopant, and the first delayed fluorescent dopant emit light, the OLED in Ref. 5 showed EL spectrum of blue light having wide FWHM and having reduced color purity owing to an overlapping of two different EL spectra. In addition, since the second delayed fluorescent dopant cannot 'hot triple excitons' of the first delayed fluorescent dopant, the OLED in Ref. 4 showed very short life span.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode, comprising:
   a first electrode;
   a second electrode,
      wherein the first electrode and second electrode face each other; and
   at least one emitting unit disposed between the first and second electrodes,
      wherein the at least one emitting unit comprises a first emitting material layer,
      wherein the first emitting material layer comprises a first host, a first delayed fluorescent dopant and a second delayed fluorescent dopant,
      wherein an excited state triplet energy level ($T_1^{TD1}$) of the first delayed fluorescent dopant and an excited state triplet energy level ($T_1^{TD2}$) of the second delayed fluorescent dopant satisfy the following relationship in Equation (1),
      wherein a highest occupied molecular orbital (HOMO) energy level ($HOMO^H$) of the first host, a HOMO energy level ($HOMO^{TD1}$) of the first delayed fluorescent dopant and a HOMO energy level ($HOMO^{TD2}$) of the second delayed fluorescent dopant satisfy the following relationships in Equations (3) and (4), and
      wherein a lowest unoccupied molecular orbital (LUMO) energy level ($LUMO^H$) of the first host, a LUMO energy level ($LUMO^{TD1}$) of the first delayed fluorescent dopant and a LUMO energy level ($LUMO^{TD2}$) of the second delayed fluorescent dopant satisfy the following relationships in Equations (6) and (7):

$$0.1 \text{ eV} \leq T_1^{TD2} - T_1^{TD1} \leq 0.5 \text{ eV} \quad (1)$$

$$HOMO^H \leq HOMO^{TD2} \quad (3)$$

$$HOMO^{TD1} - HOMO^{TD2} > 0.03 \text{ eV} \quad (4)$$

$$LUMO^H \geq LUMO^{TD2} \quad (6)$$

$$LUMO^{TD2} - LUMO^{TD1} > 0.05 \text{ eV} \quad (7),$$

wherein the first delayed fluorescent dopant includes a compound having the following structure of Chemical Formula 1 and the second delayed fluorescent dopant includes a compound having the following structure of Chemical Formula 2:

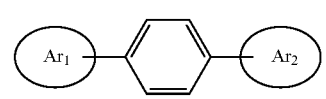

Chemical Formula 1

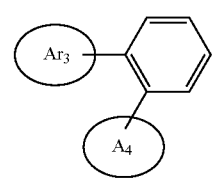

Chemical Formula 2 wherein each of $Ar_1$ in Chemical Formula 1 and $Ar_3$ in Chemical Formula 2 is independently a moiety having the following structure of Chemical Formula 3; each of $Ar_2$ in Chemical Formula 1 and $Ar_4$ in Chemical Formula 2 is independently a moiety having the following structure of Chemical Formula 4, and Chemical Formula 1 and Chemical Formula 2 are connected to Chemical Formula 3 and Chemical Formula 4 through the (*—) in Chemical Formula 3 and Chemical Formula 4:

Chemical Formula 3

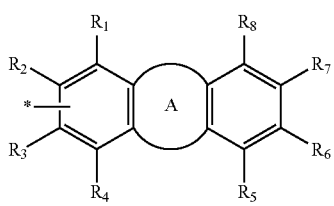

wherein each of $R_1$ to $R_8$ is independently protium, deuterium, tritium, linear or branched $C_1$~$C_{10}$ alkyl group, $C_5$~$C_{30}$ aryl group or $C_4$~$C_{30}$ hetero aryl group, or adjacent two groups among $R_1$ to $R_8$ form a $C_5$~$C_{20}$ fused aromatic ring or a $C_4$~$C_{20}$ hetero aromatic ring; A is a fused 5-membered or 6-membered hetero aromatic ring having at least one nitrogen atom within a nucleus, wherein the hetero aromatic ring of A is unsubstituted or substituted with linear or branched $C_1$~$C_{10}$ alkyl group, $C_5$~$C_{30}$ aryl group, $C_4$~$C_{30}$ hetero aryl group and combination thereof, or forms a spiro structure;

Chemical Formula 4

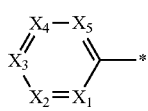

wherein each of $X_1$ to $X_5$ is independently $CR_{11}$ or N, wherein at least one of $X_1$ to $X_5$ is N, wherein $R_{11}$ is protium, deuterium, tritium, cyano group, nitro group, halogen, $C_1$~$C_{10}$ alkyl halide, $C_5$~$C_{30}$ aryl group or $C_4$~$C_{30}$ hetero aryl group; and in Chemical Formulae 3 and 4.

2. The organic light emitting diode of claim 1, wherein the excited state triplet energy level ($T_1^{TD1}$) of the first delayed fluorescent dopant and the excited state triplet energy level ($T_1^{TD2}$) of the second delayed fluorescent dopant satisfy the following relationship in Equation (2)

$$0.1 \text{ eV} \leq T_1^{TD2} - T_1^{TD1} \leq 0.3 \text{ eV} \quad (2).$$

3. The organic light emitting diode of claim 1, wherein the HOMO energy level ($HOMO^{TD1}$) of the first delayed fluorescent dopant and the HOMO energy level ($HOMO^{TD2}$) of the second delayed fluorescent dopant satisfy the following relationship in Equation (5)

$$0.4 \text{ eV} \leq HOMO^{TD1} - HOMO^{TD2} < 1.0 \text{ eV} \quad (5).$$

4. The organic light emitting diode of claim 1, wherein the LUMO energy level ($LUMO^{TD1}$) of the first delayed fluorescent dopant and the LUMO energy level ($LUMO^{TD2}$) of the second delayed fluorescent dopant satisfy the following relationship in Equation (8)

$$0.05 \text{V} < LUMO^{TD2} - LUMO^{TD1} < 1.0 \text{ eV} \quad (8).$$

5. An organic light emitting device, comprising:
a substrate; and
the organic light emitting diode according to claim 1,
wherein the organic light emitting diode is disposed over the substrate.

6. The organic light emitting diode of claim 1, wherein Chemical Formula 3 has the following structure:

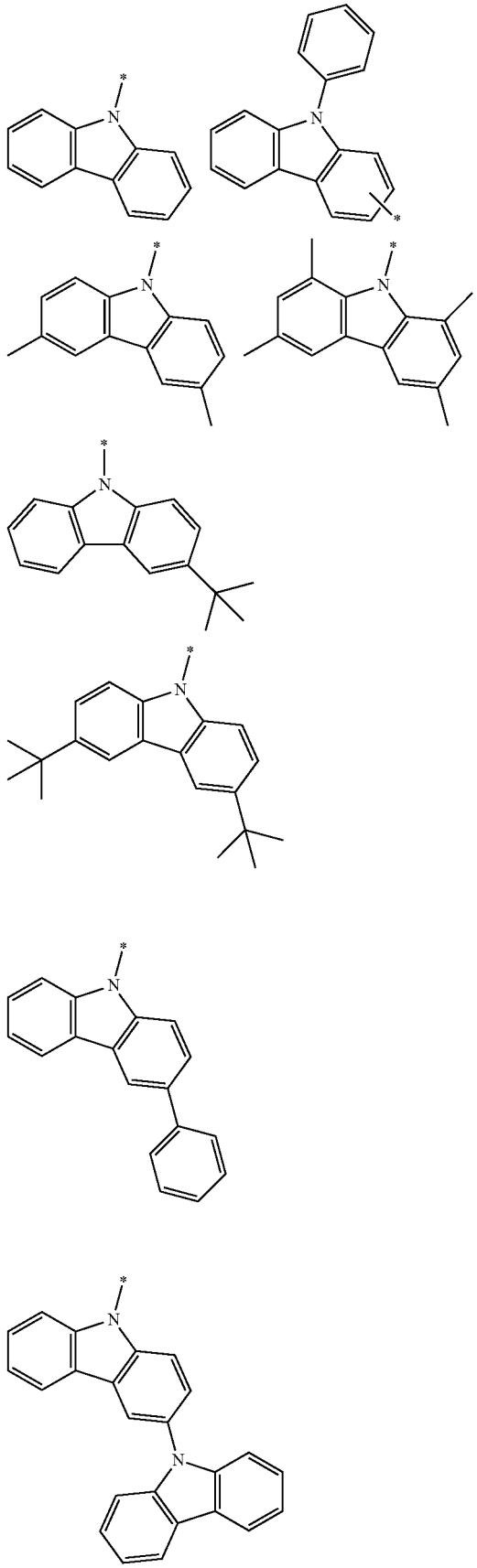

107
-continued
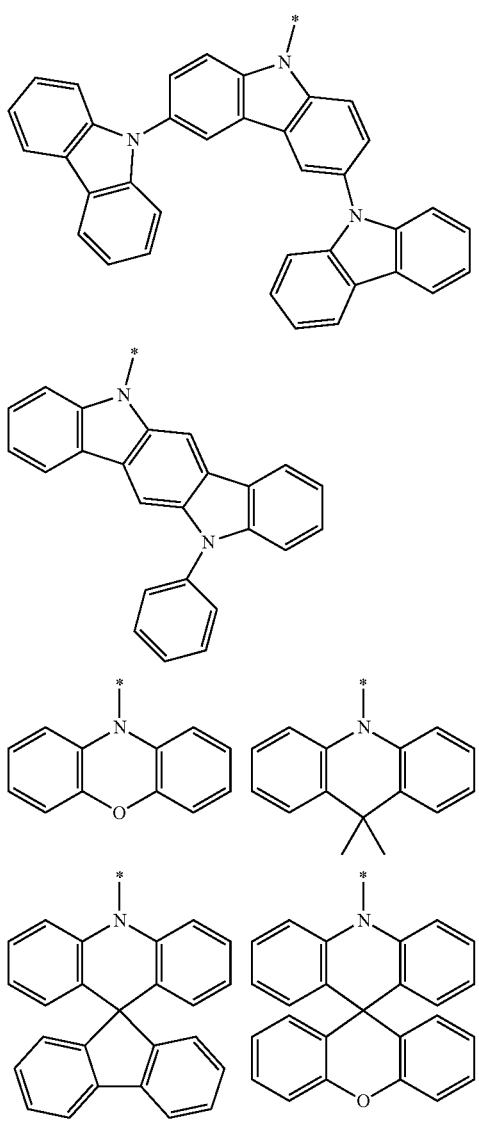
7. The organic light emitting diode of claim 1, wherein Chemical Formula 4 has the following structure:
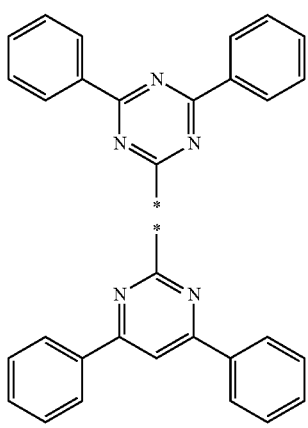
108
-continued
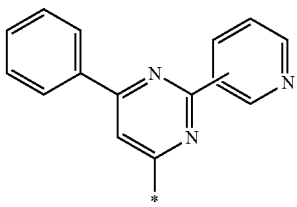
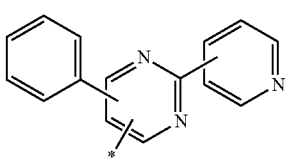
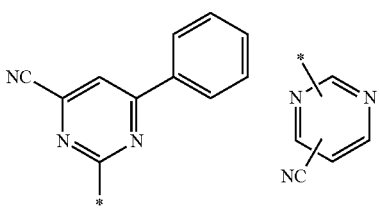
8. The organic light emitting diode of claim 1, wherein the first delayed fluorescent dopant has a structure of Chemical Formula 5:
[Chemical Formula 5]
Compound 1
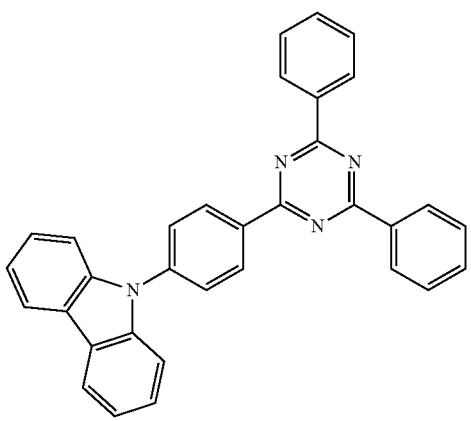

-continued
Compound 2
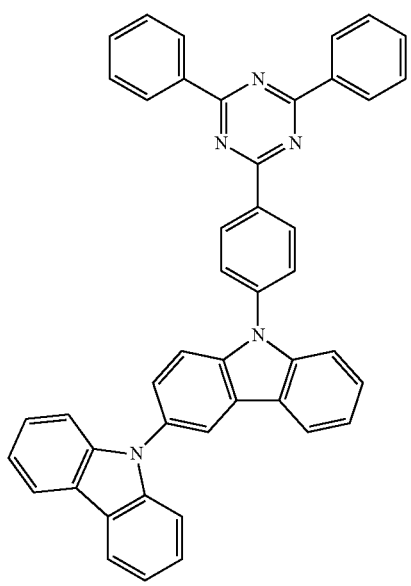
Compound 3
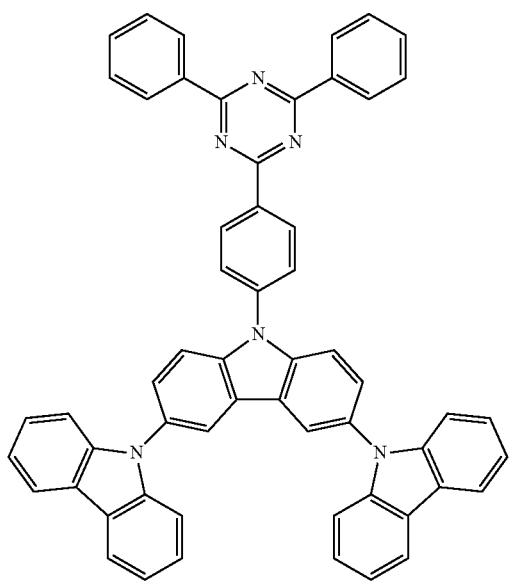
Compound 4
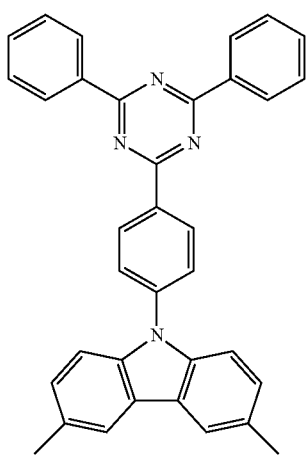
-continued
Compound 5
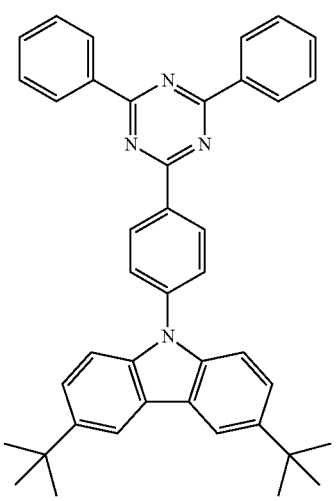
Compound 6
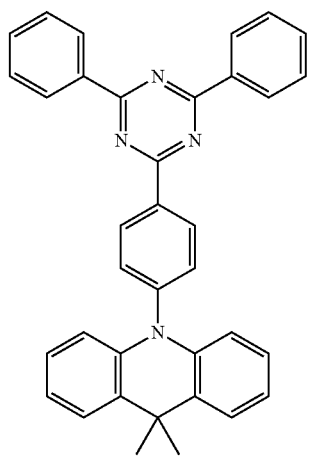
Compound 7
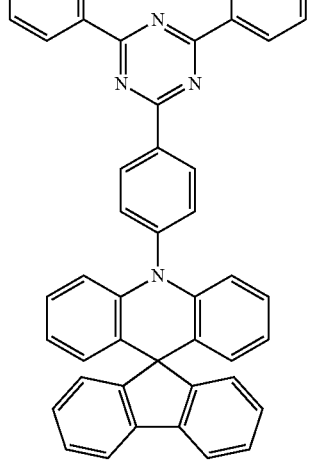

Compound 8
Compound 11
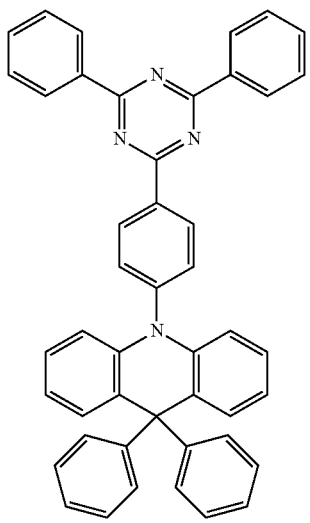
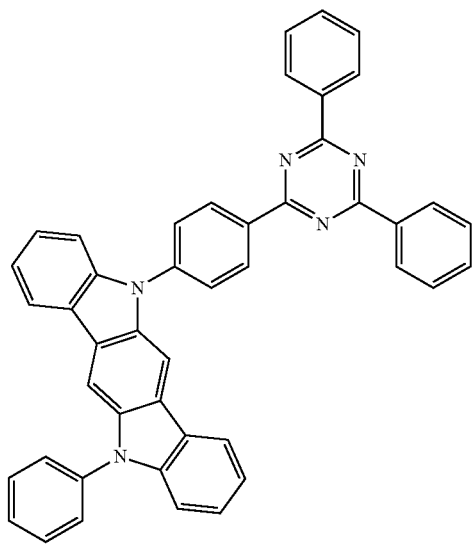
Compound 9
Compound 12
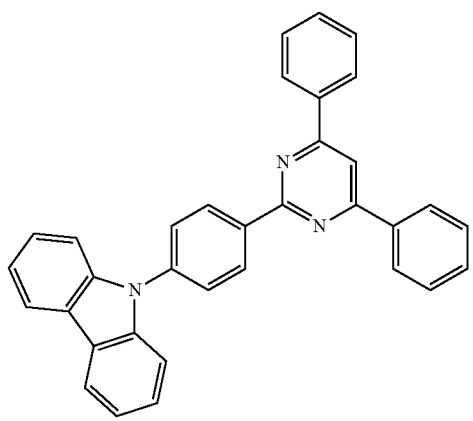
Compound 10
Compound 13
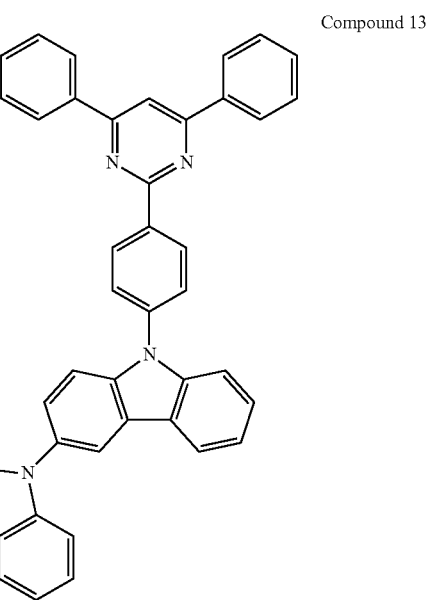

Compound 14
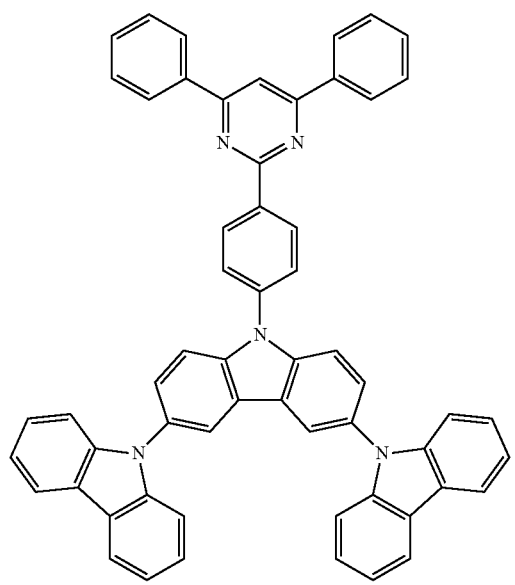
Compound 15
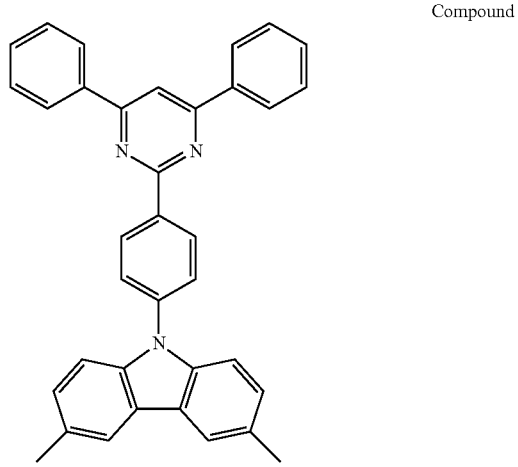
Compound 16
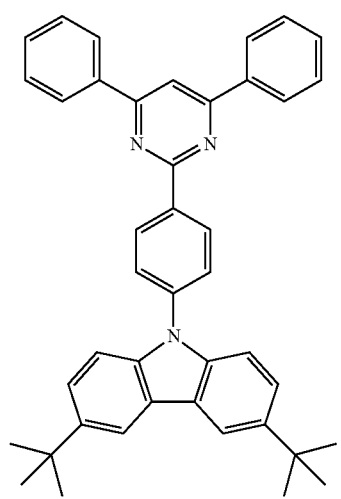
Compound 17
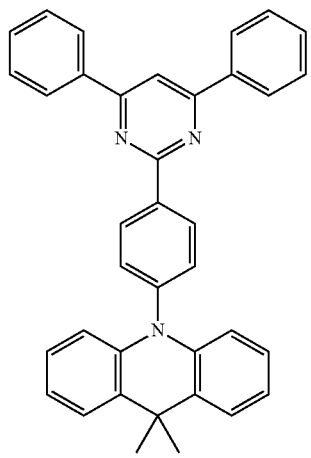
Compound 18
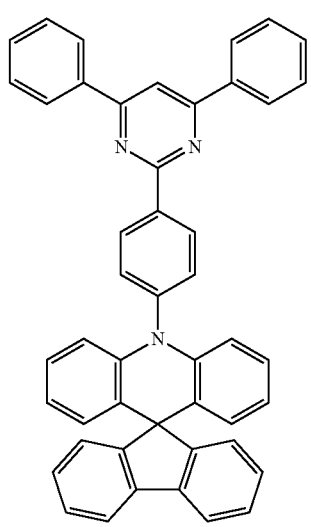
Compound 19
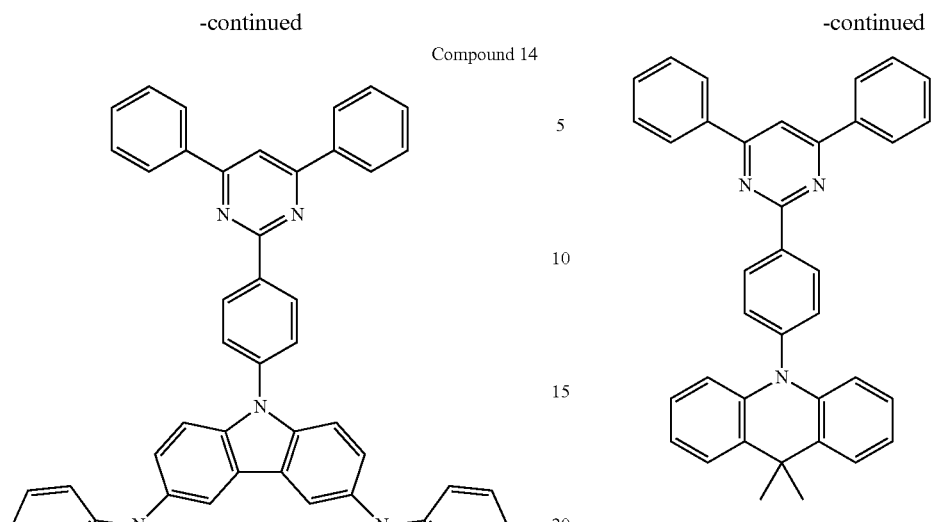

-continued
Compound 20
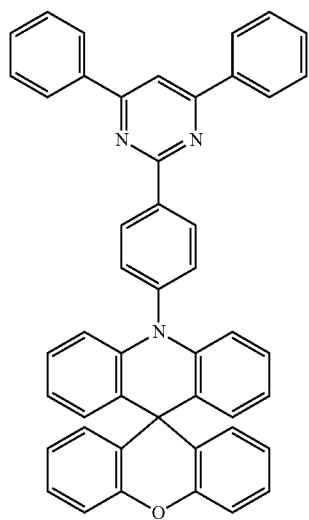
Compound 21
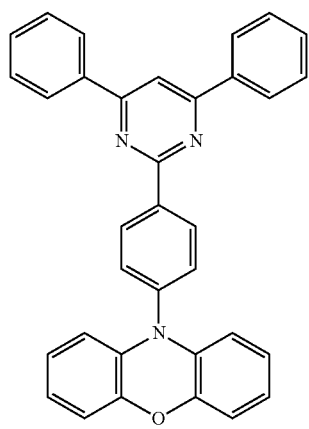
Compound 22
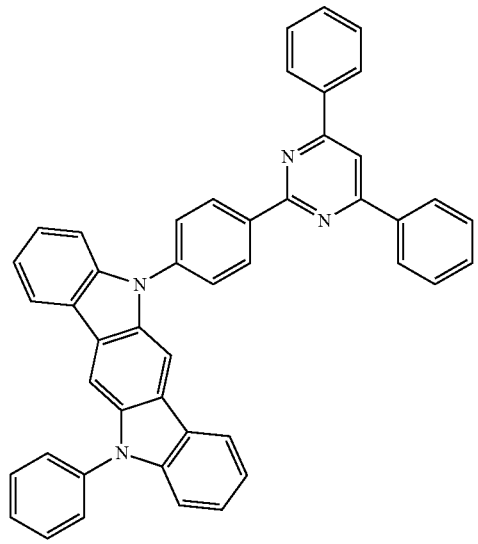
Compound 23
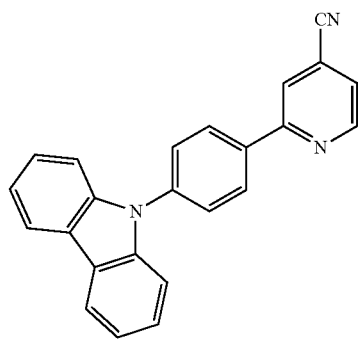
Compound 24
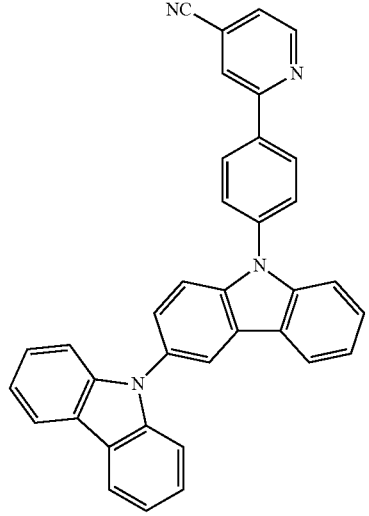
Compound 25
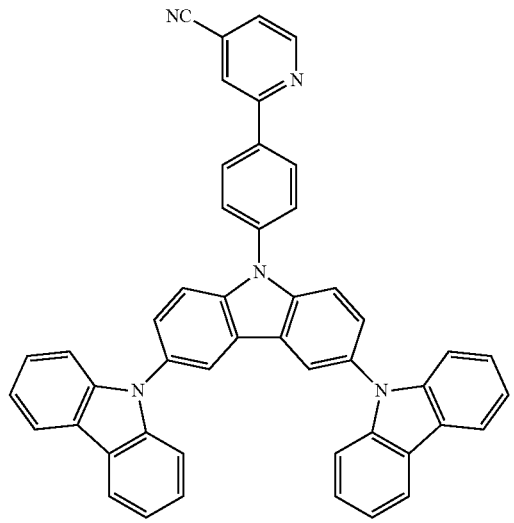

Compound 26
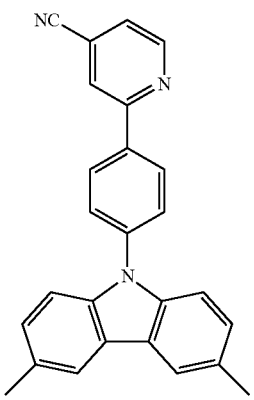
Compound 27
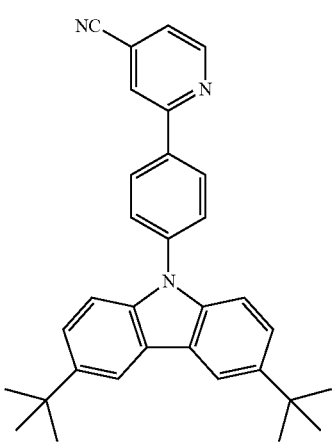
Compound 28
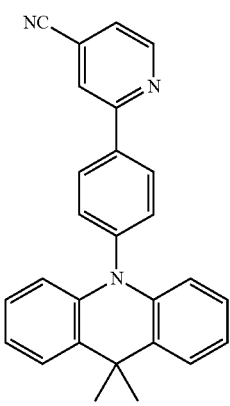
Compound 29
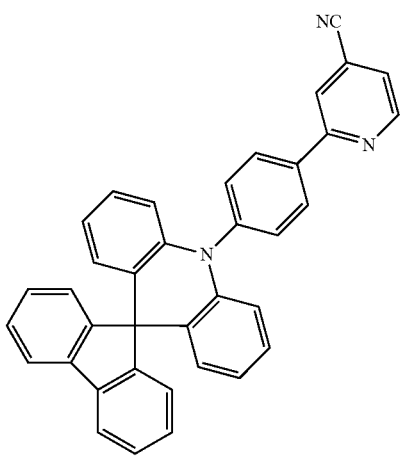
Compound 30
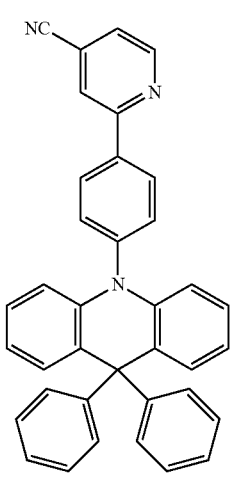
Compound 31
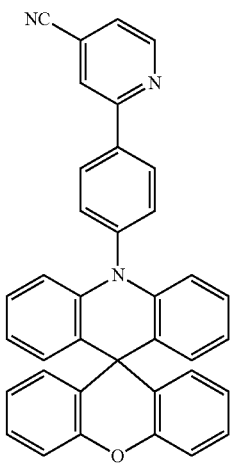

Compound 32
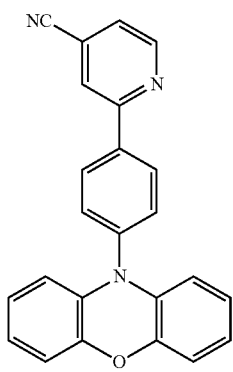
Compound 33
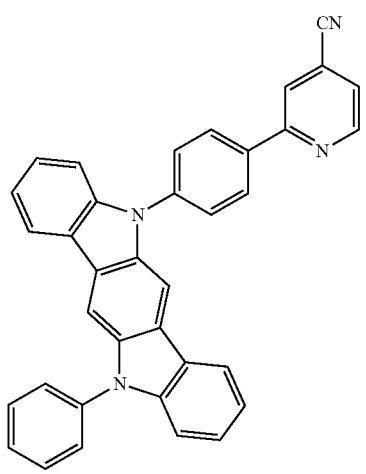
Compound 34
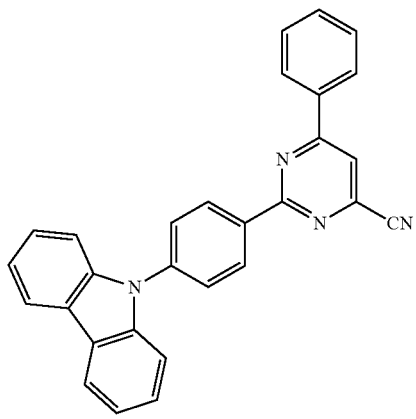
Compound 35
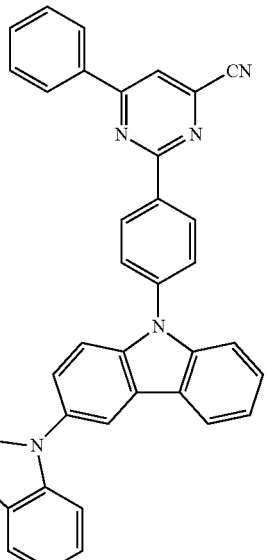
Compound 36
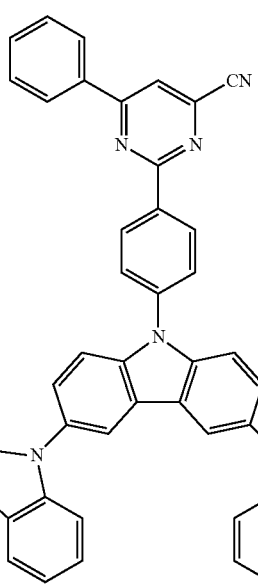
Compound 37
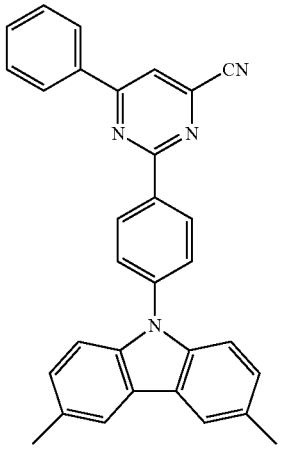

Compound 38
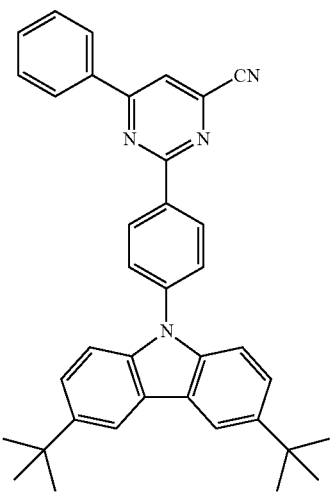
Compound 39
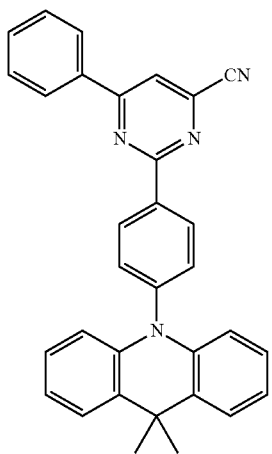
Compound 40
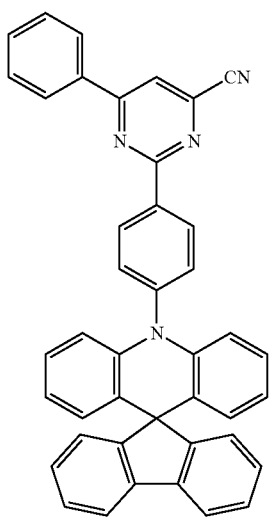
Compound 41
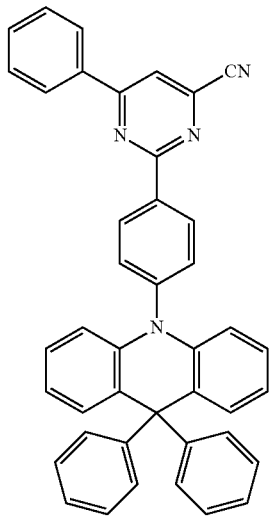
Compound 42
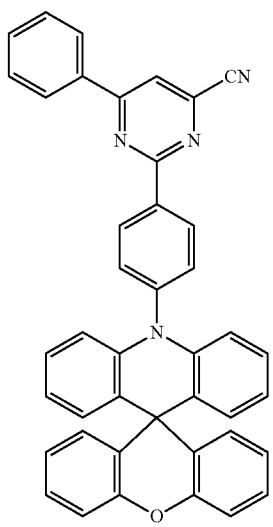
Compound 43
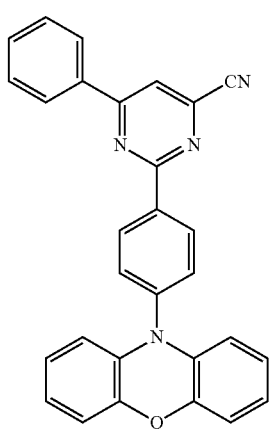

Compound 44
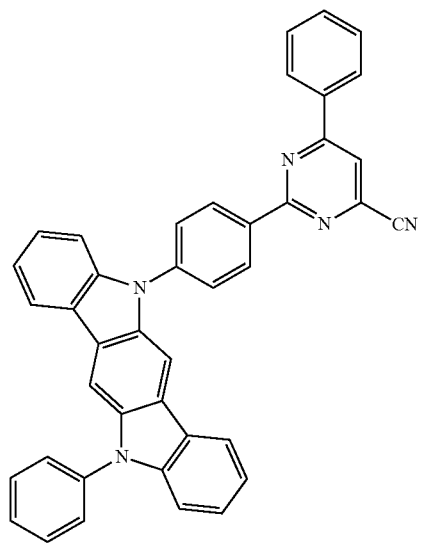
Compound 45
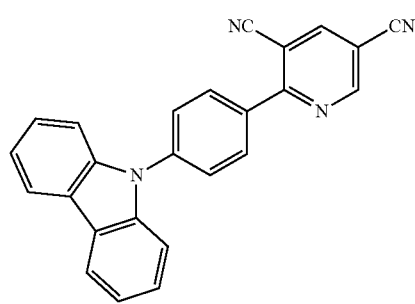
Compound 46
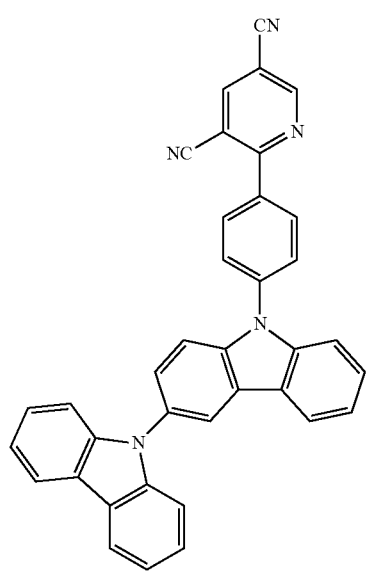
Compound 47
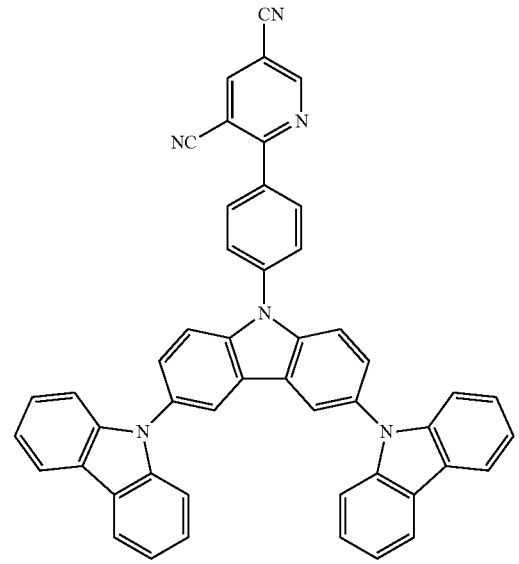
Compound 48
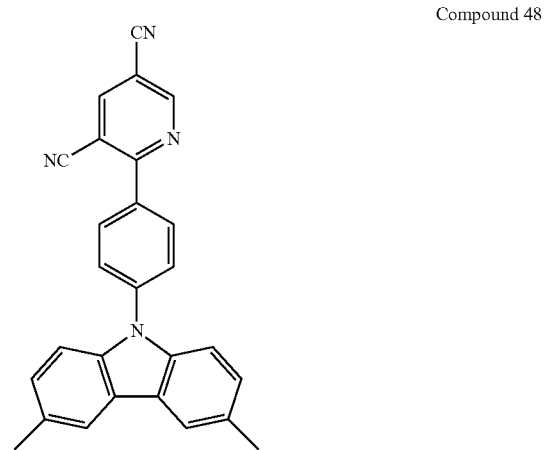
Compound 49
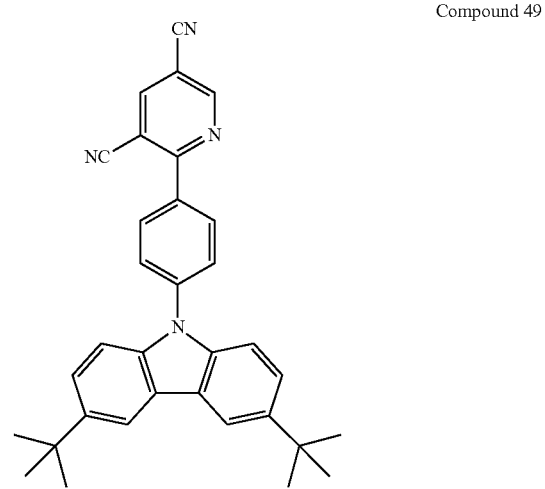

-continued
Compound 50
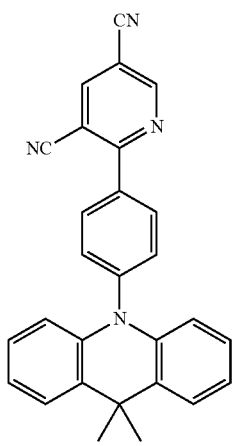
Compound 51
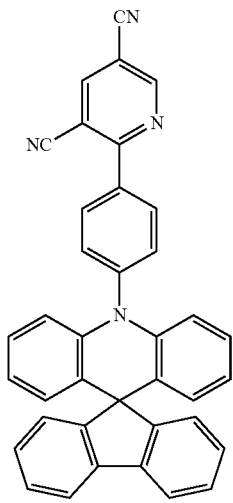
Compound 52
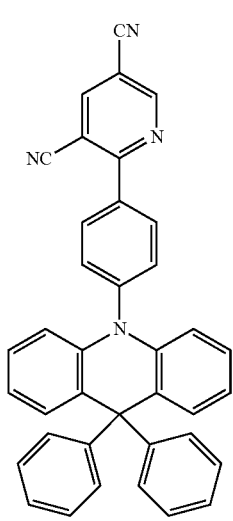
-continued
Compound 53
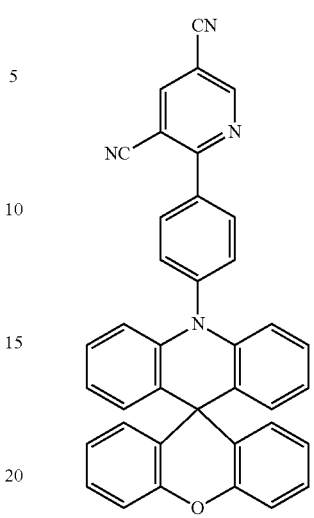
Compound 54
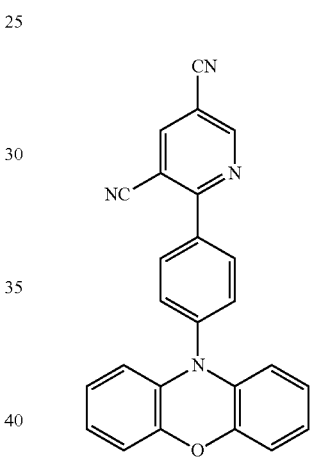
Compound 55
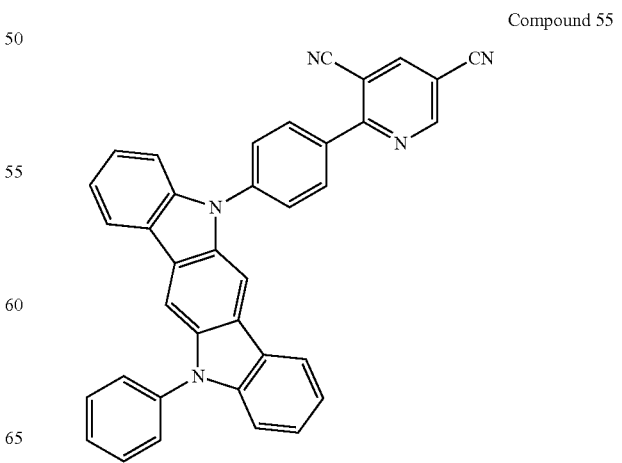

-continued
Compound 56
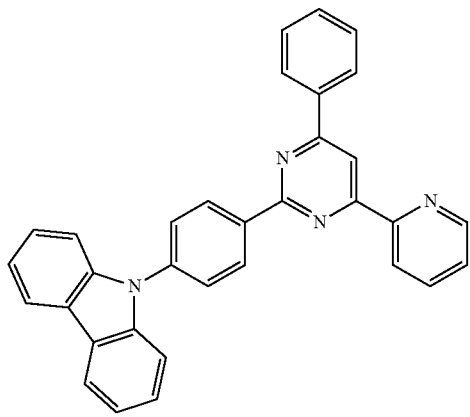
Compound 57
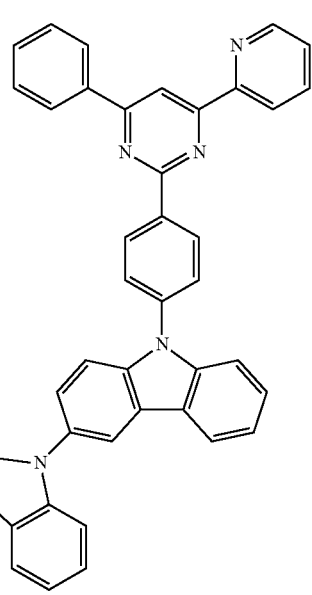
Compound 58
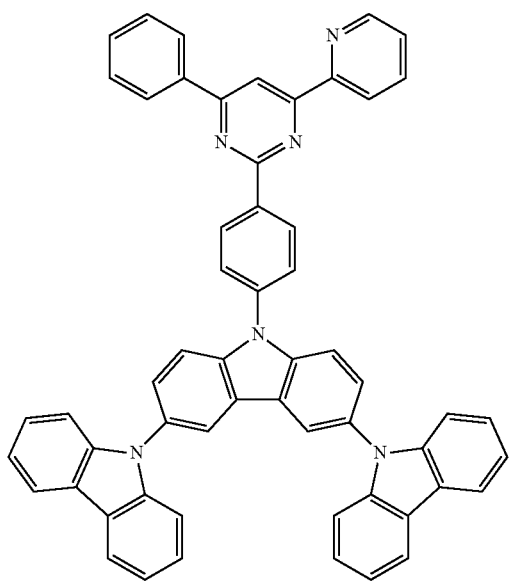
-continued
Compound 59
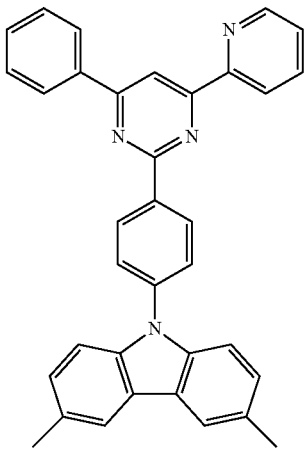
Compound 60
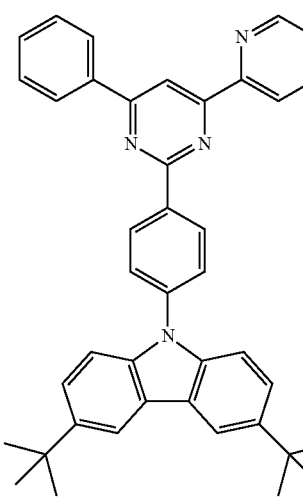
Compound 61
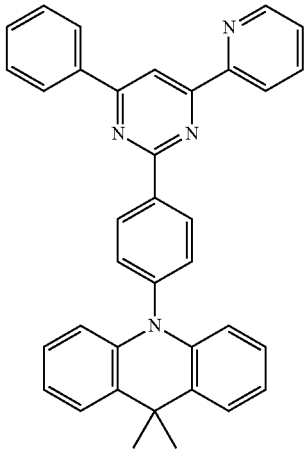

Compound 62
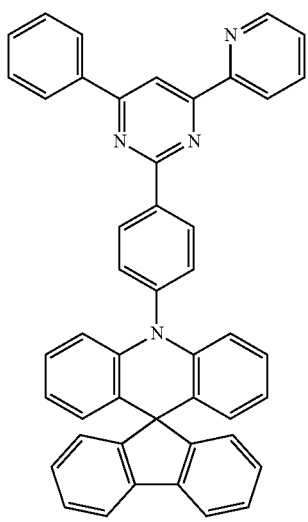
Compound 63
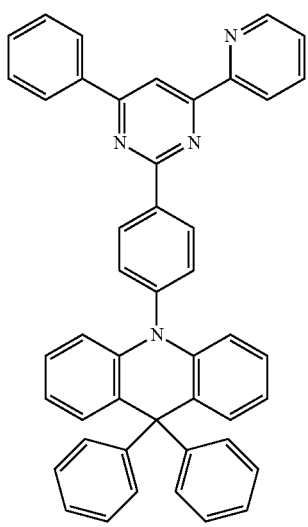
Compound 64
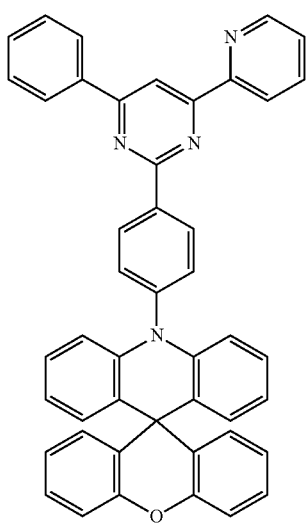
Compound 65
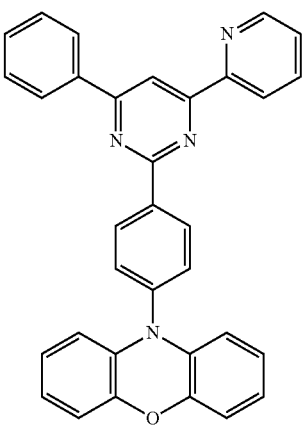
Compound 66
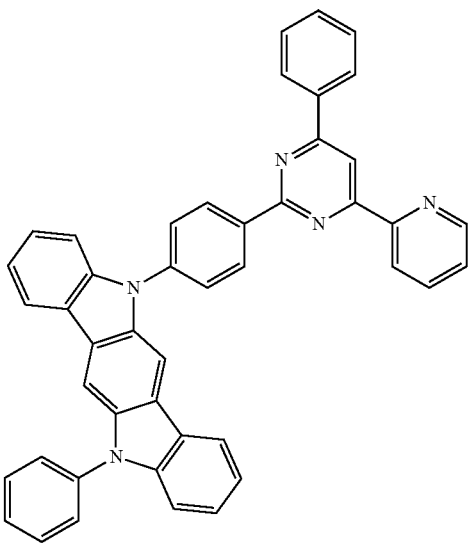
Compound 67
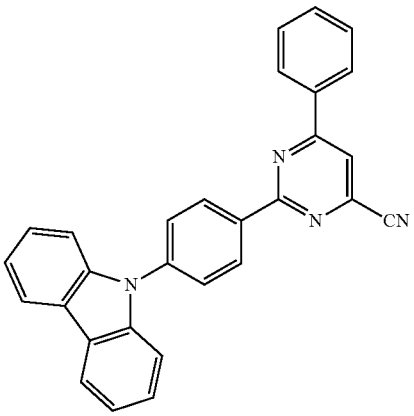

Compound 68
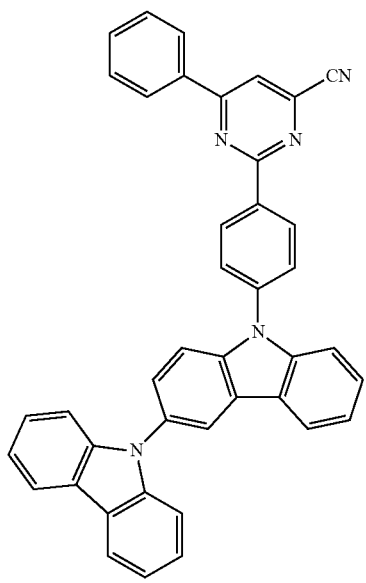
Compound 71
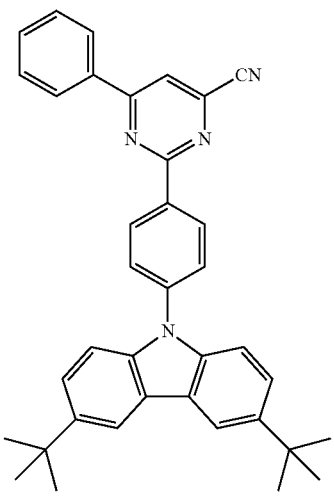
Compound 69
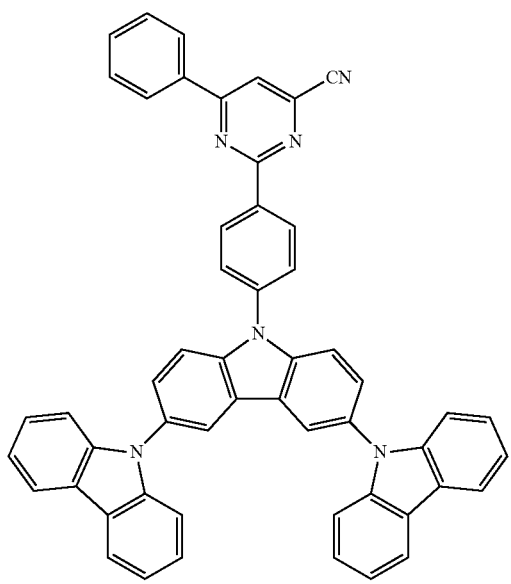
Compound 72
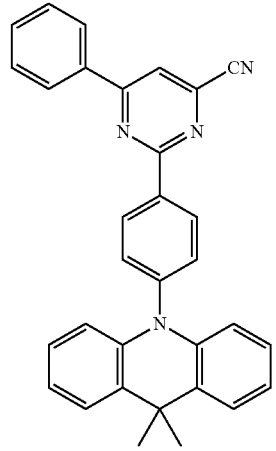
Compound 70
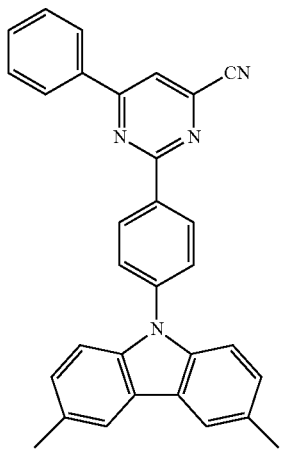
Compound 73
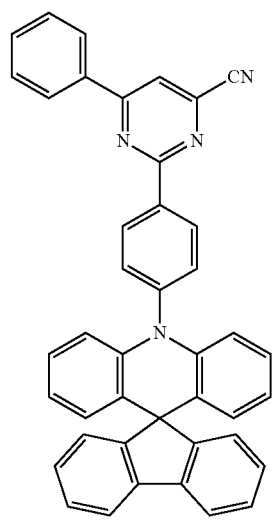

Compound 74
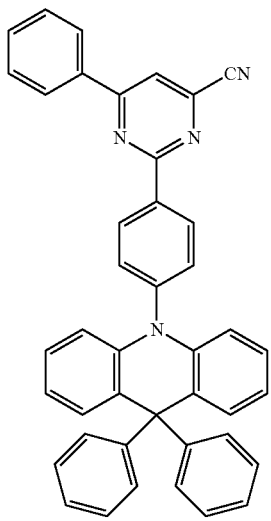
Compound 75
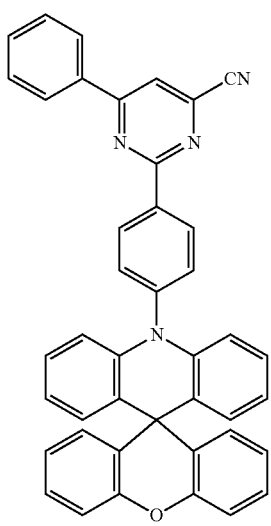
Compound 76
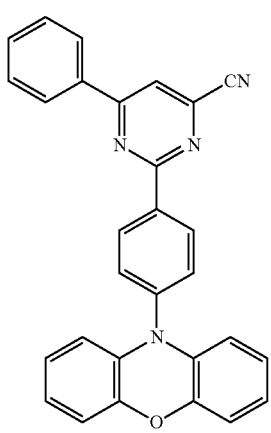
Compound 77
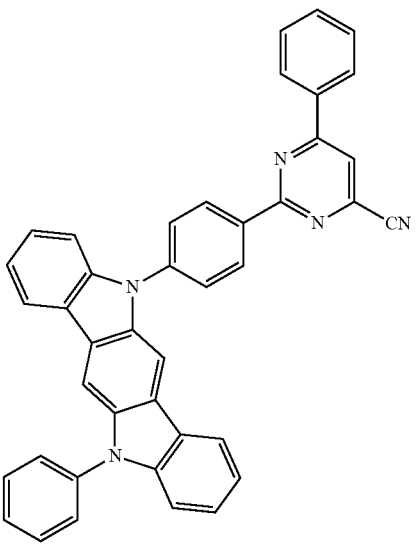
Compound 78
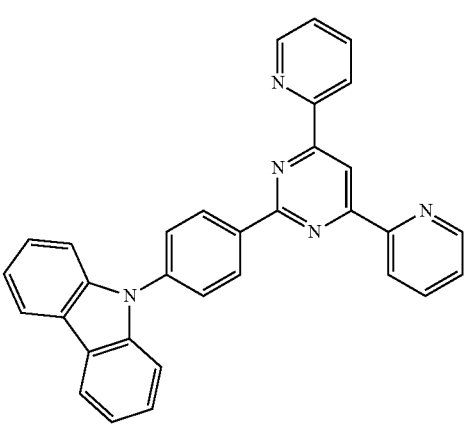
Compound 79
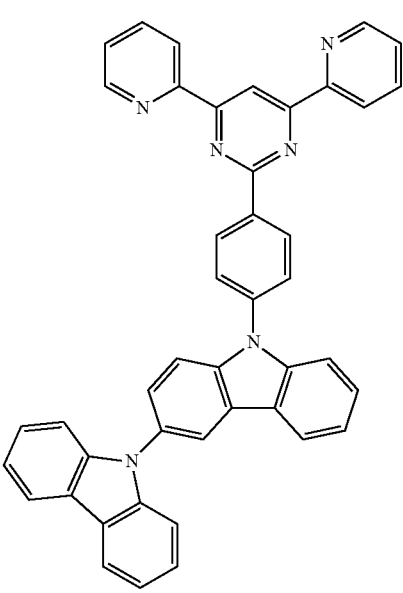

Compound 80
Compound 81
Compound 82
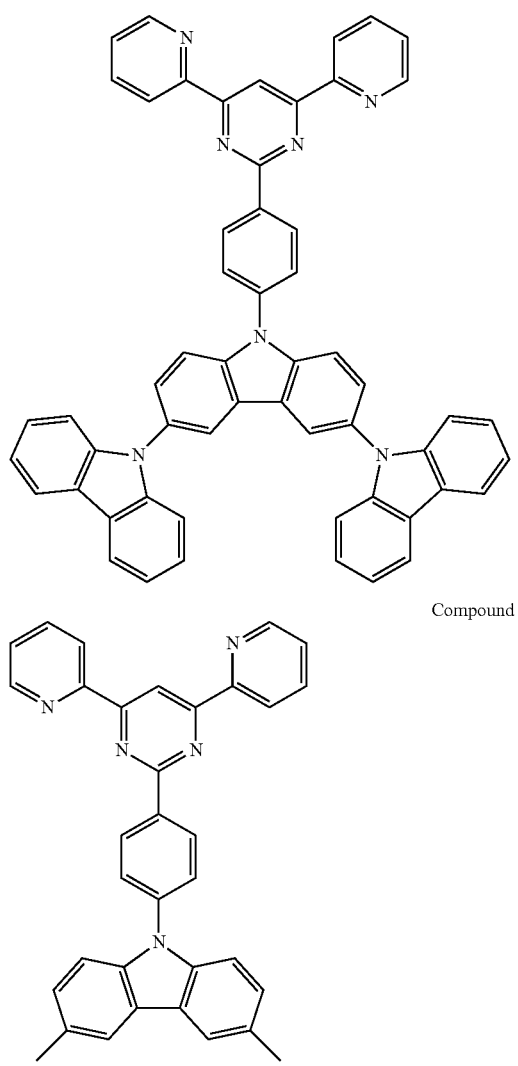
Compound 83
Compound 84
Compound 85
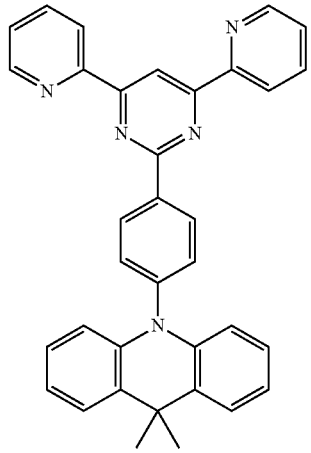
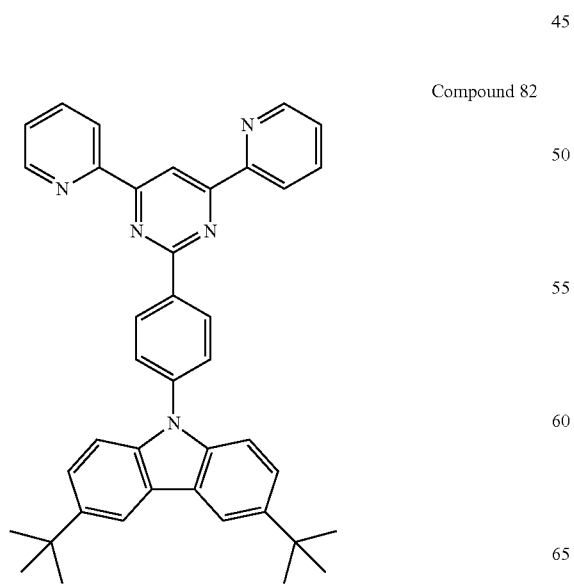

Compound 86
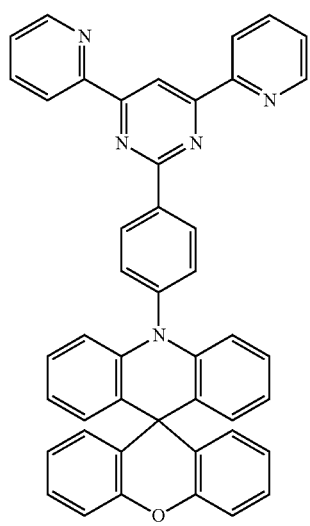
Compound A-1
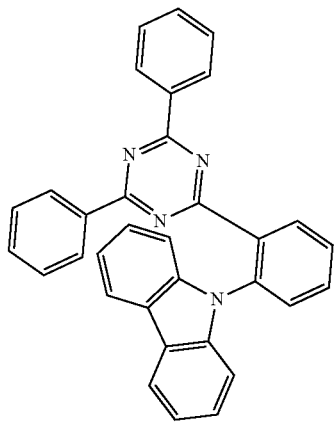
Compound 87
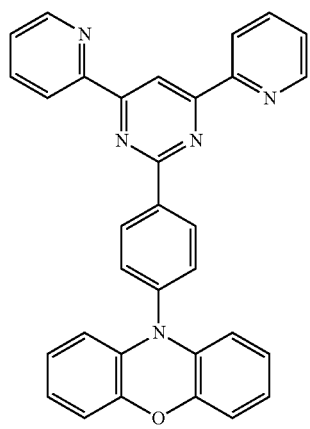
Compound A-2
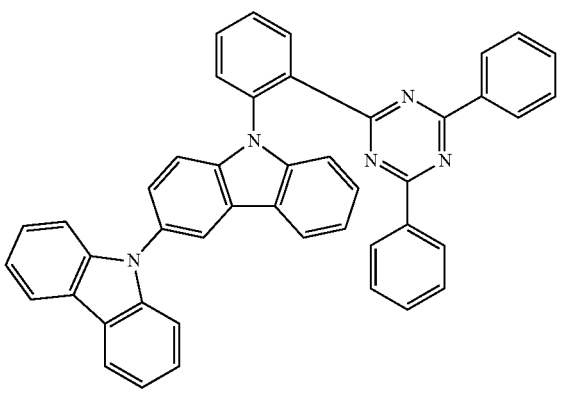
Compound 88
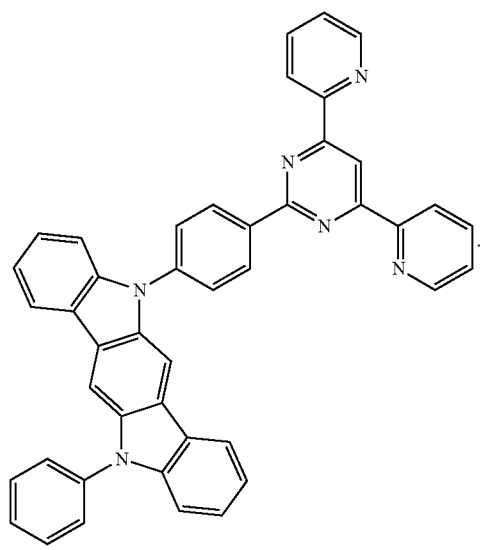
Compound A-3
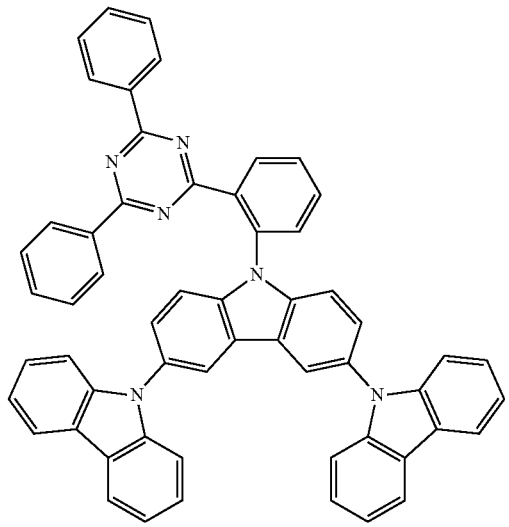
9. The organic light emitting diode of claim 1, wherein the second delayed fluorescent dopant has a structure of Chemical Formula 6:

Compound A-4
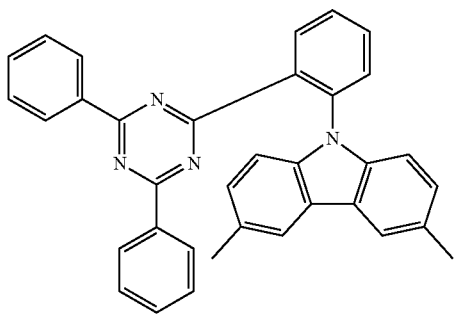
Compound A-5
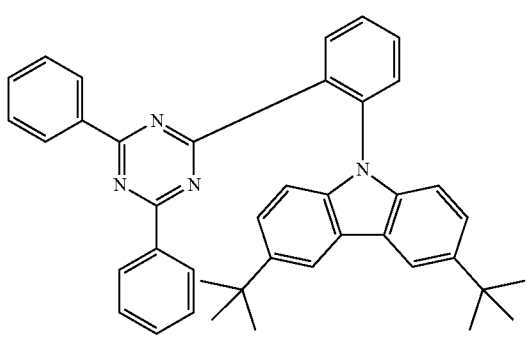
Compound A-6
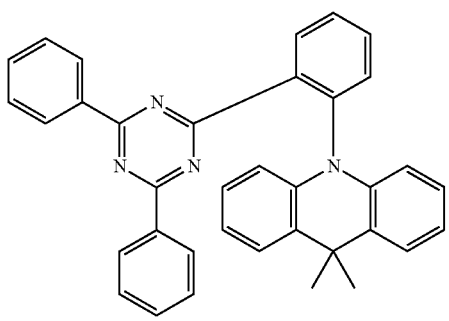
Compound A-7
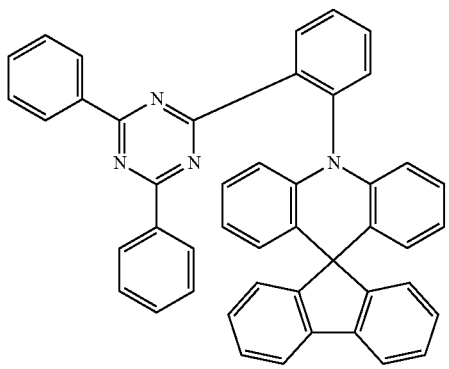
Compound A-8
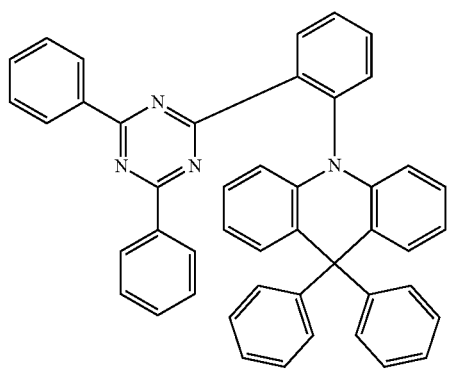
Compound A-9
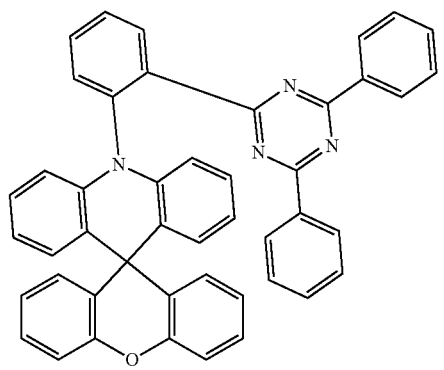
Compound A-10
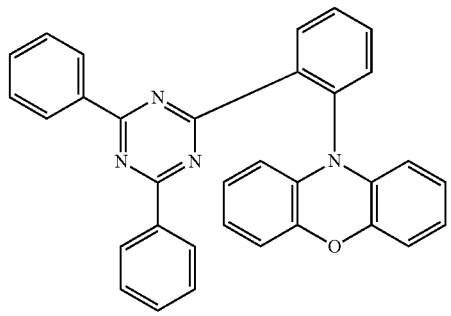

Compound A-11
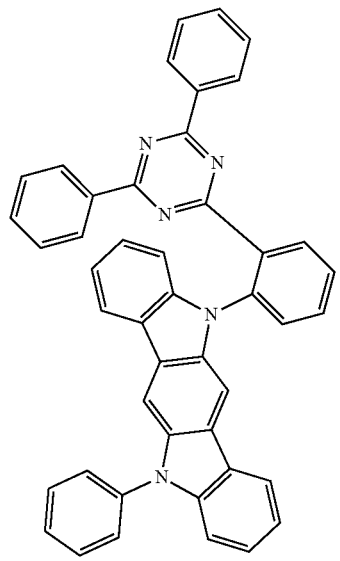
Compound A-12
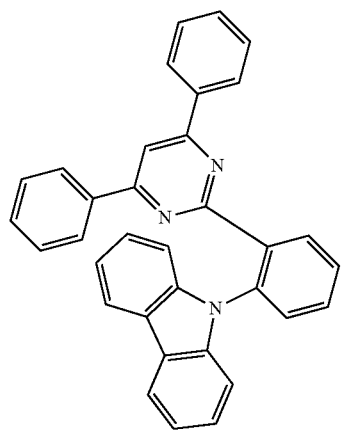
Compound A-13
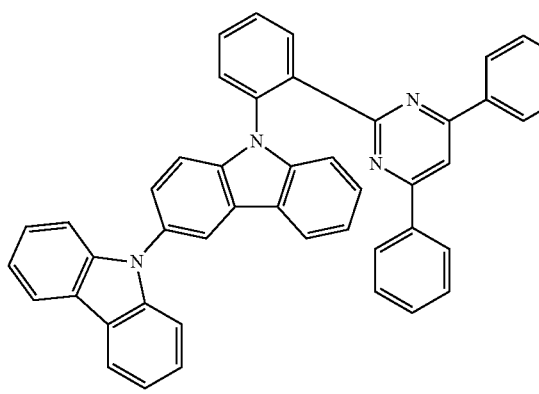
Compound A-14
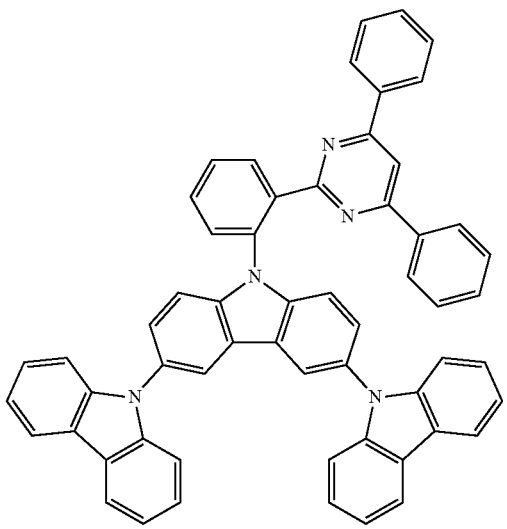
Compound A-15
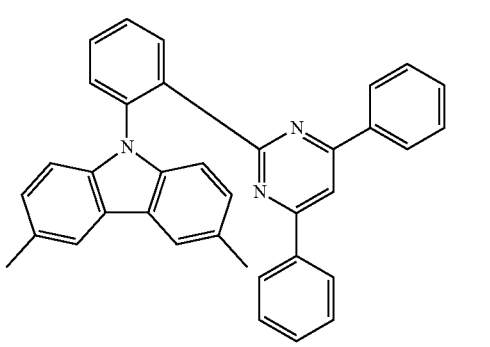
Compound A-16
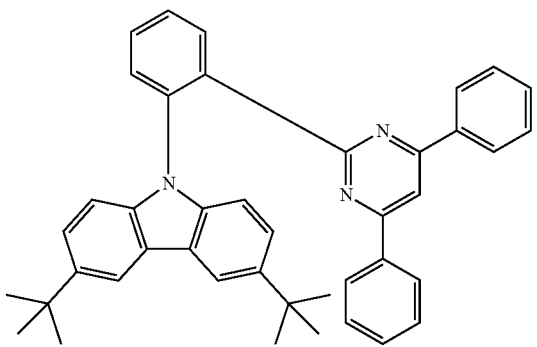
Compound A-17
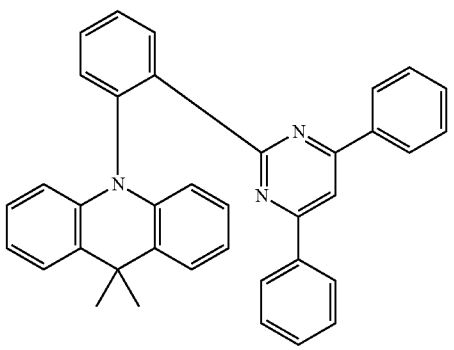

-continued
Compound A-18
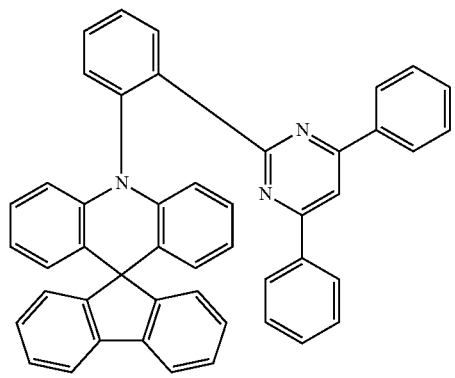
Compound A-19
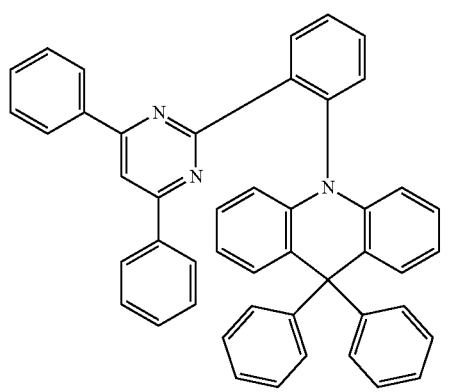
Compound A-20
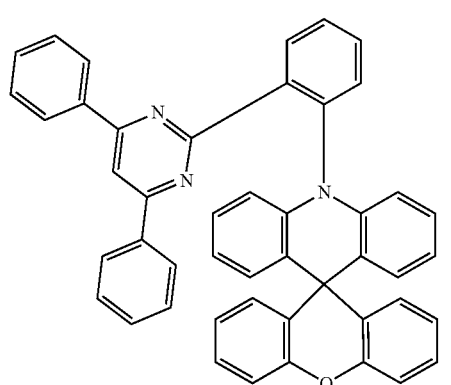
Compound A-21
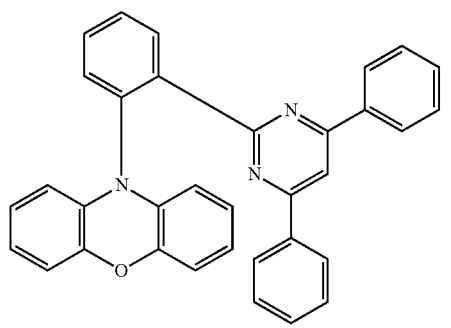
Compound A-22
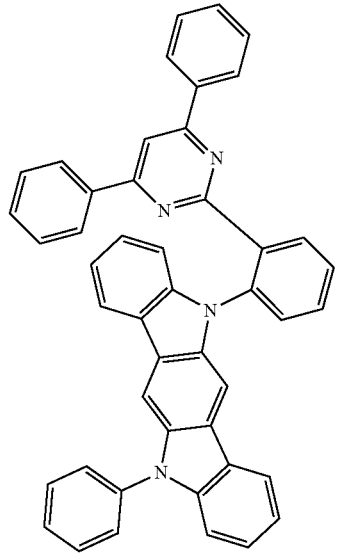
Compound A-23
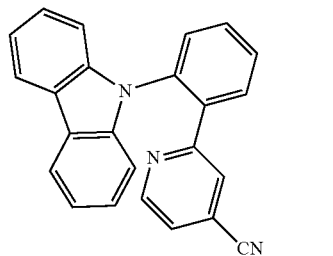
Compound A-24
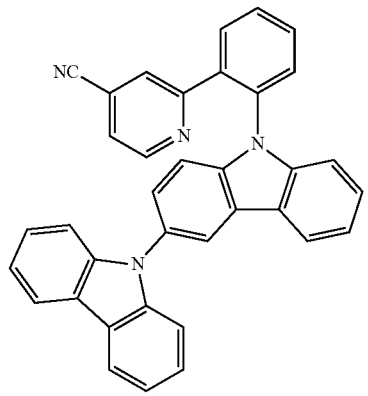
Compound A-25
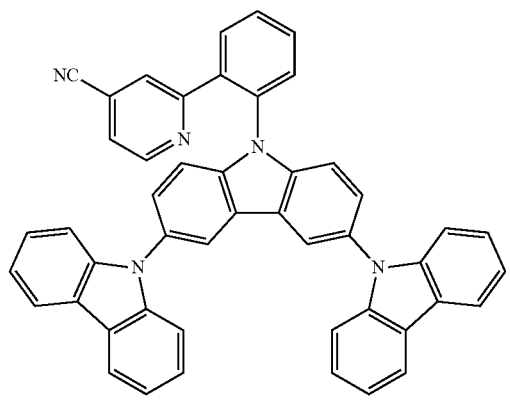

Compound A-26
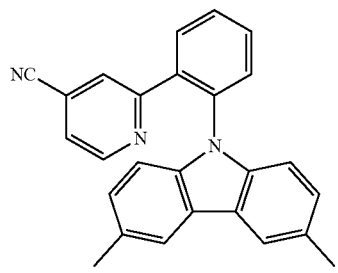
Compound A-27
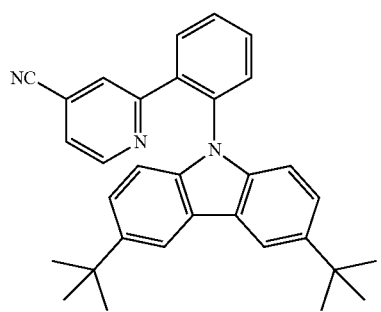
Compound A-28
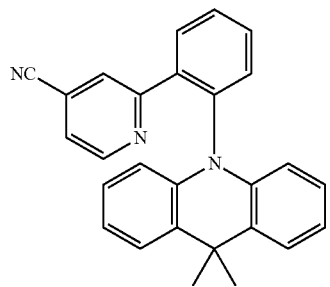
Compound A-29
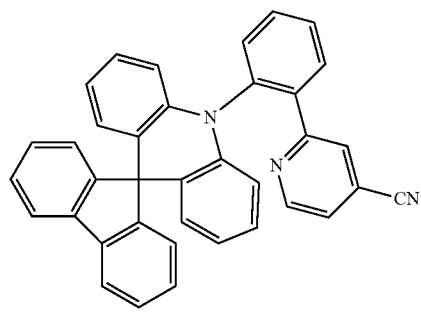
Compound A-30
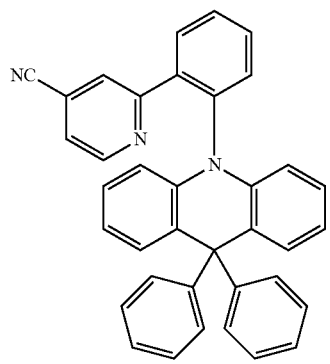
Compound A-31
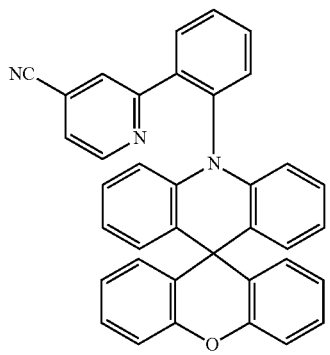
Compound A-32
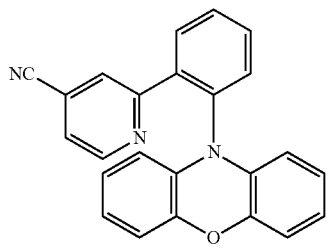
Compound A-33
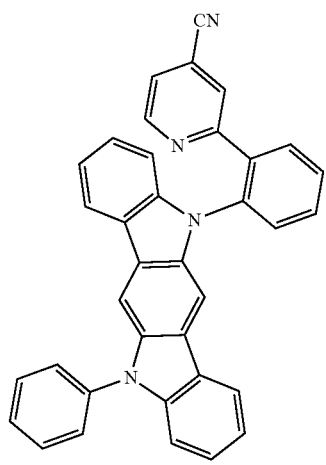
Compound A-34
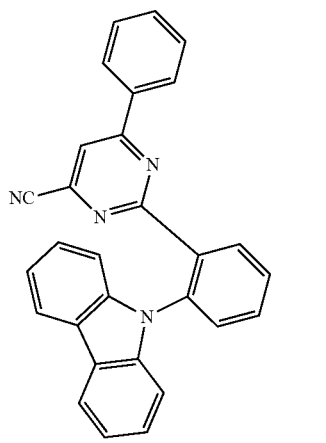

Compound A-35
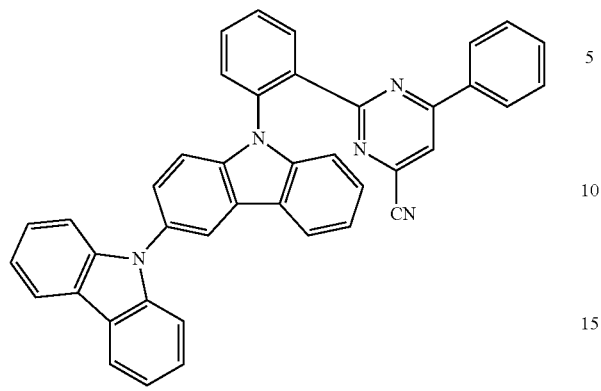
Compound A-36
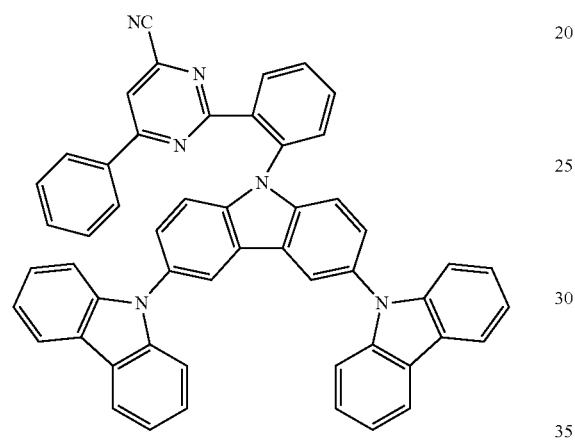
Compound A-37
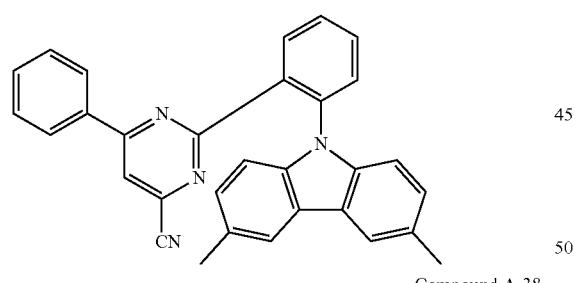
Compound A-38
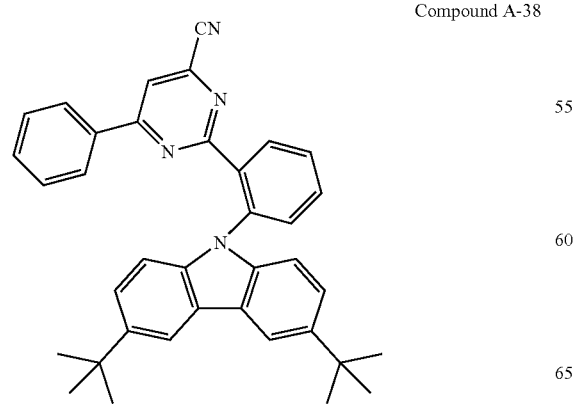
Compound A-39
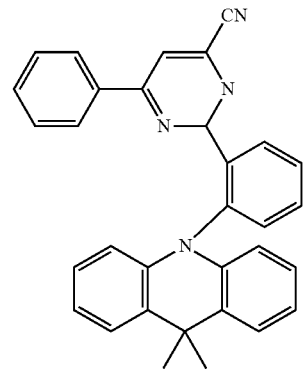
Compound A-40
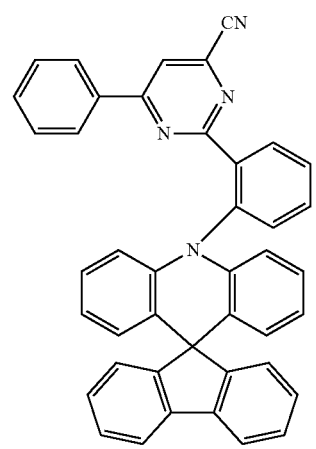
Compound A-41
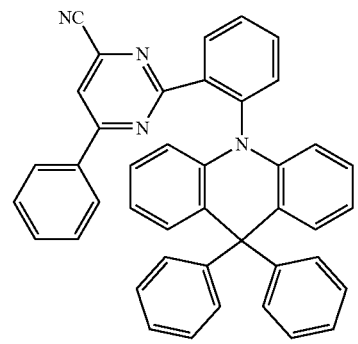
Compound A-42
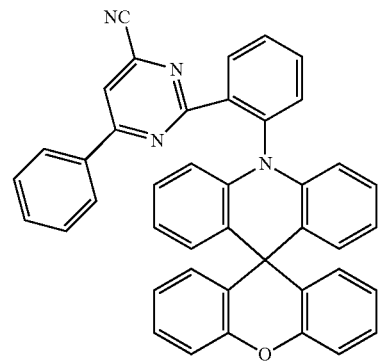

Compound A-43
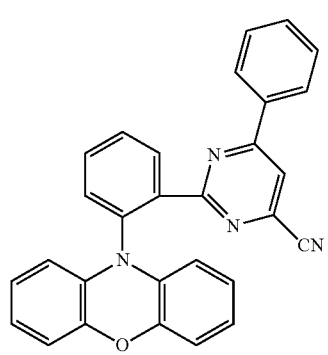
Compound A-44
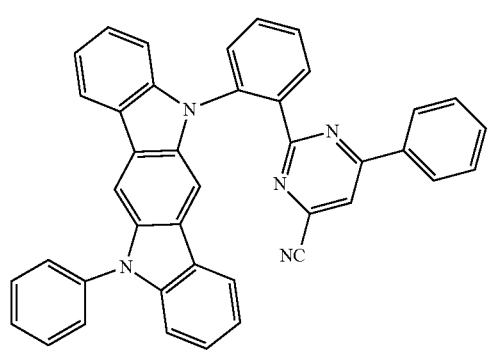
Compound A-45
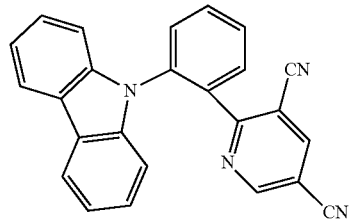
Compound A-46
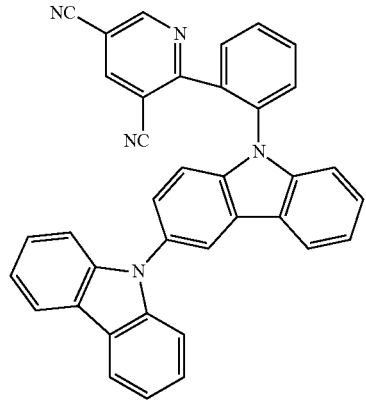
Compound A-47
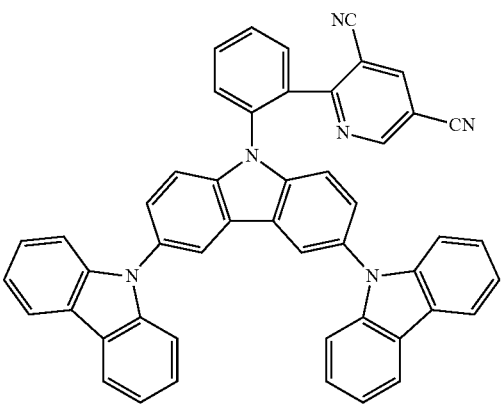
Compound A-48
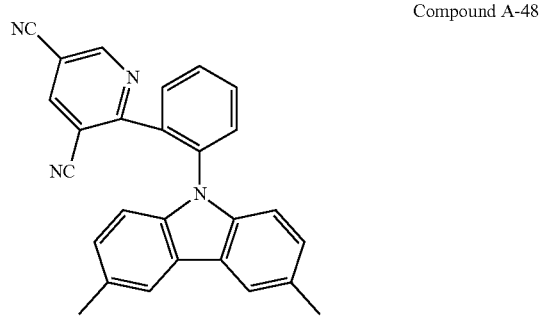
Compound A-49
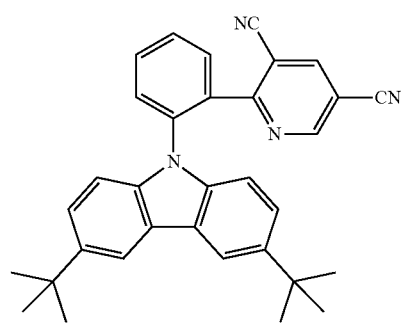
Compound A-50
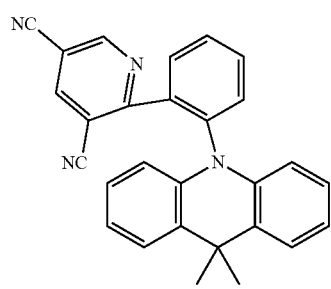

Compound A-51
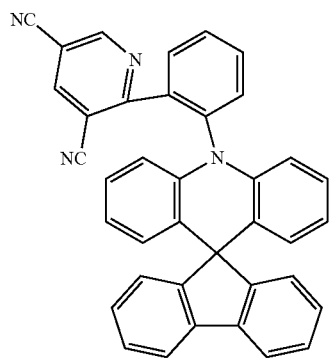
Compound A-52
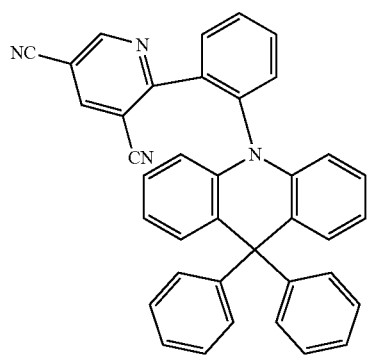
Compound A-53
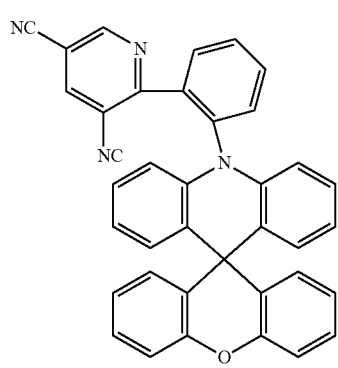
Compound A-54
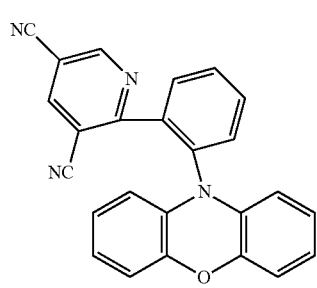
Compound A-55
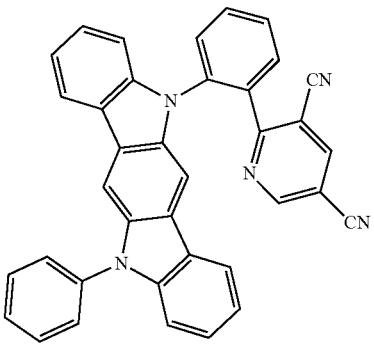
Compound A-56
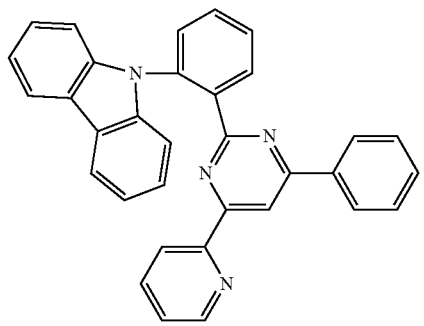
Compound A-57
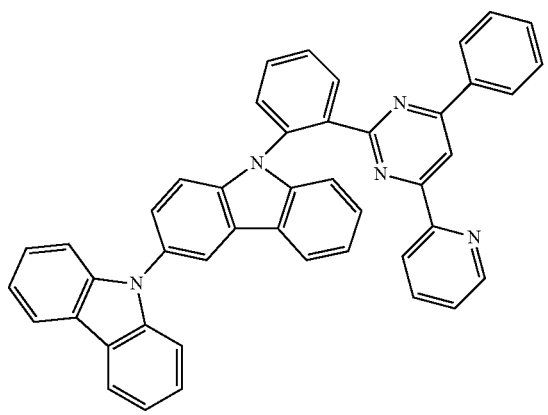
Compound A-58
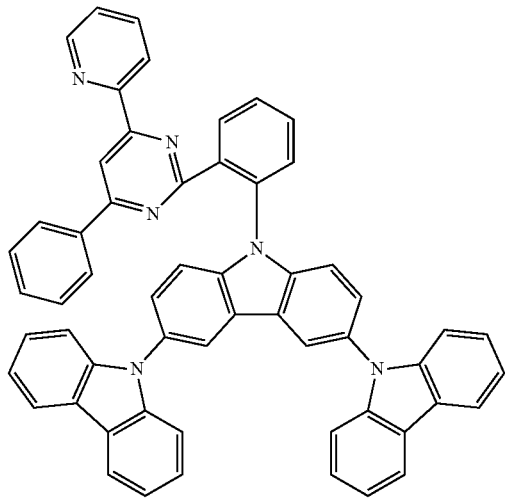

Compound A-59
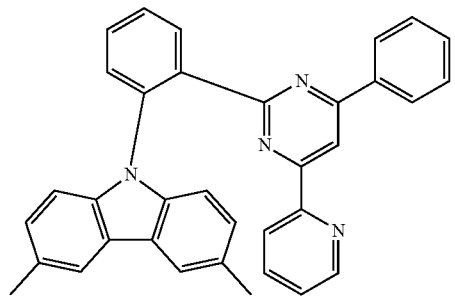
Compound A-60
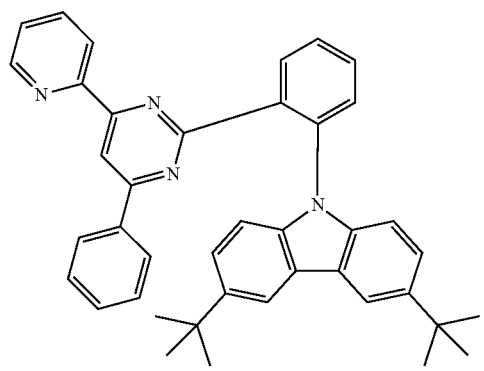
Compound A-61
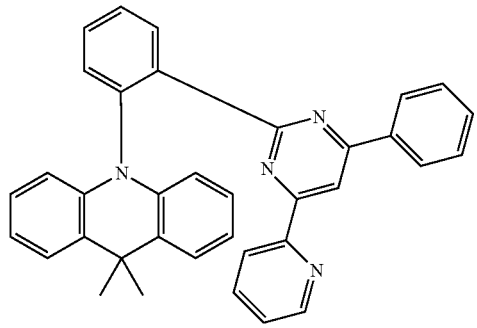
Compound A-62
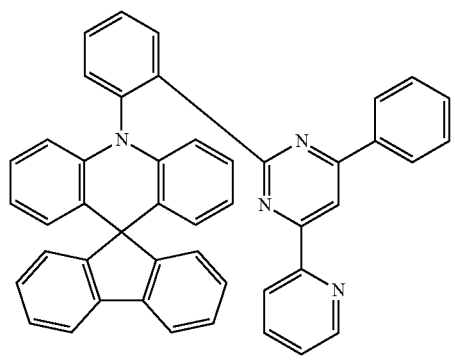
Compound A-63
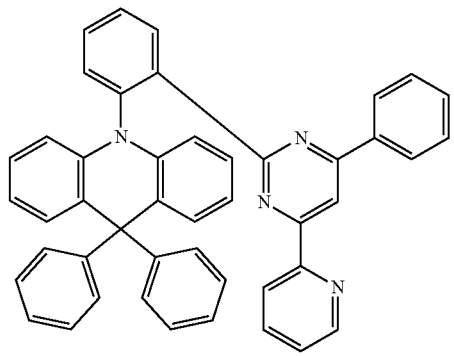
Compound A-64
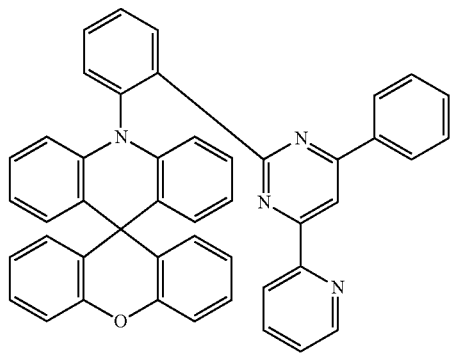
Compound A-65
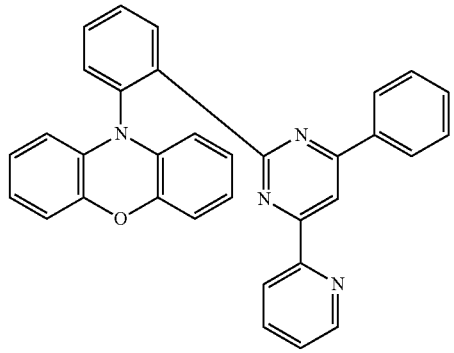
Compound A-66

Compound A-67
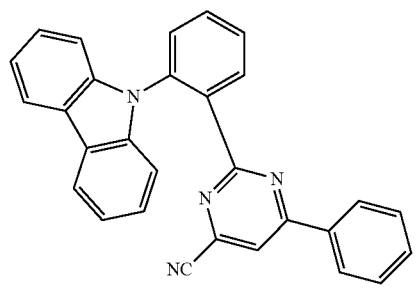
Compound A-68
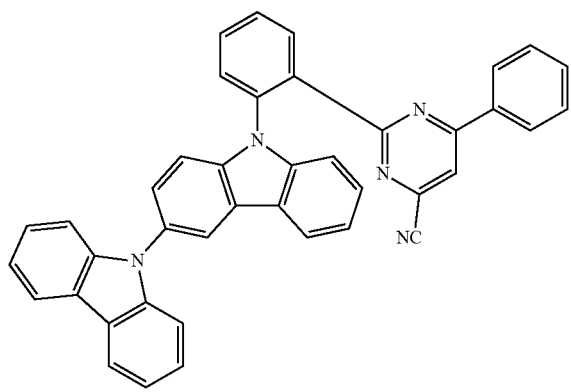
Compound A-68
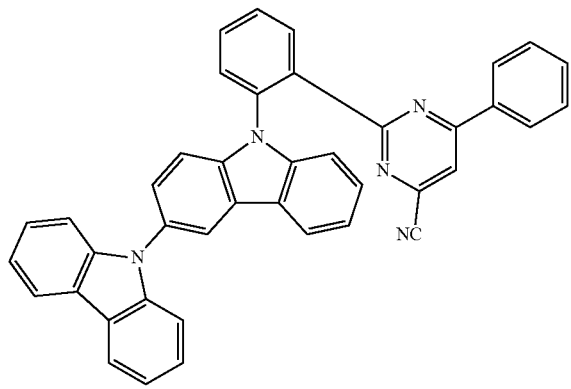
Compound A-69
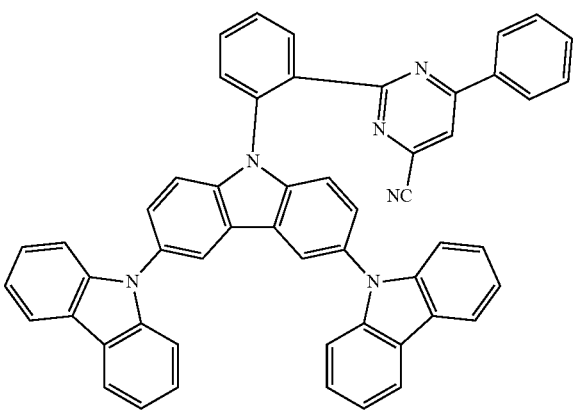
Compound A-70
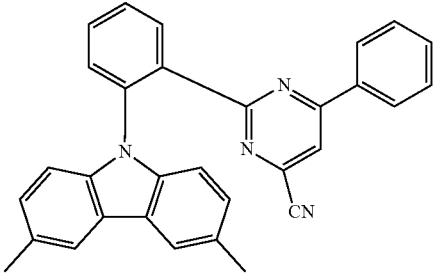
Compound A-71
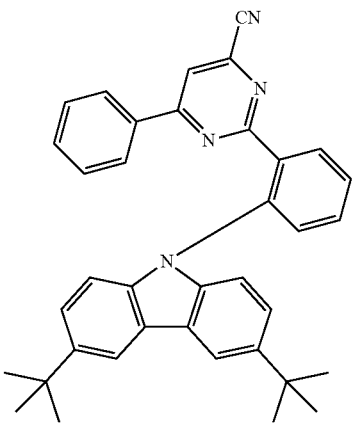
Compound A-72
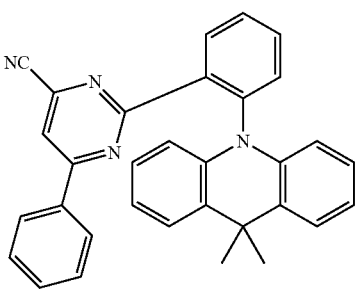
Compound A-73
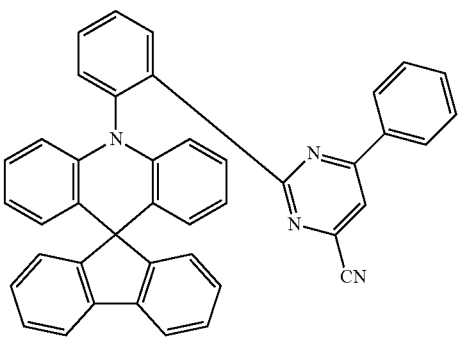

Compound A-74
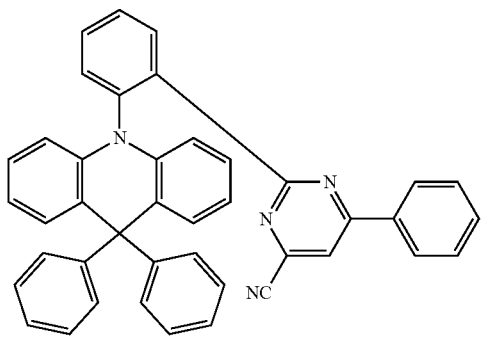
Compound A-75
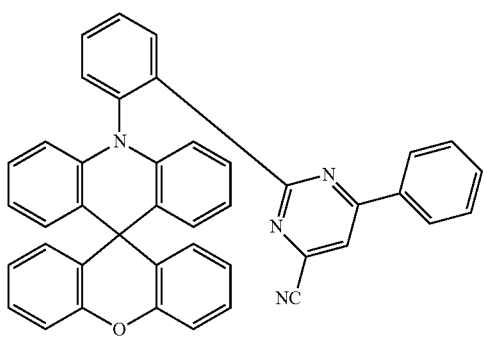
Compound A-76
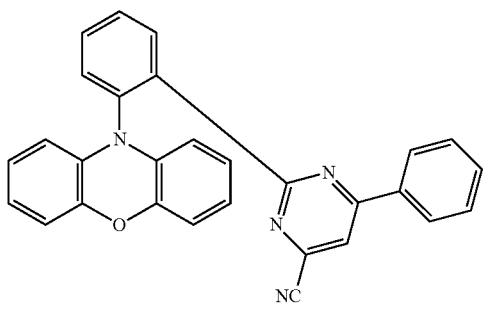
Compound A-77
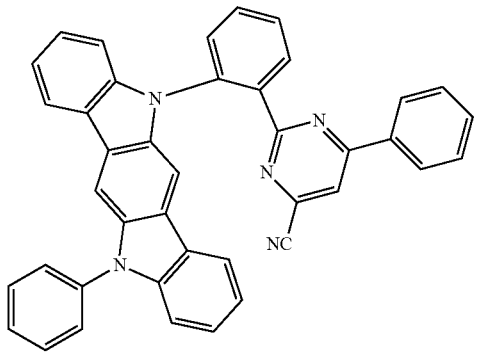
Compound A-78
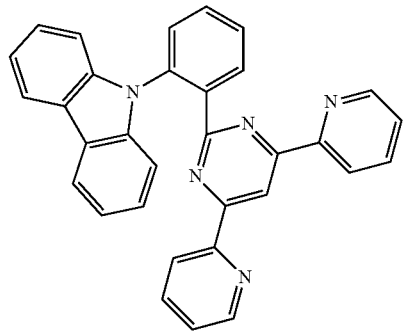
Compound A-79
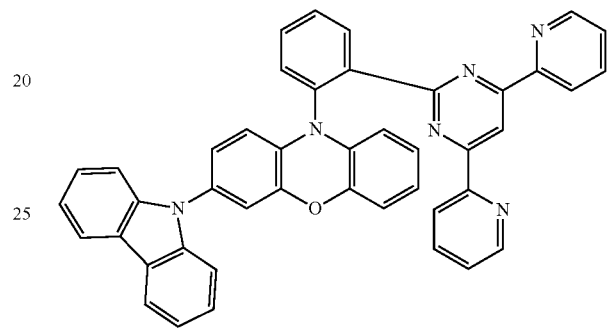
Compound A-80
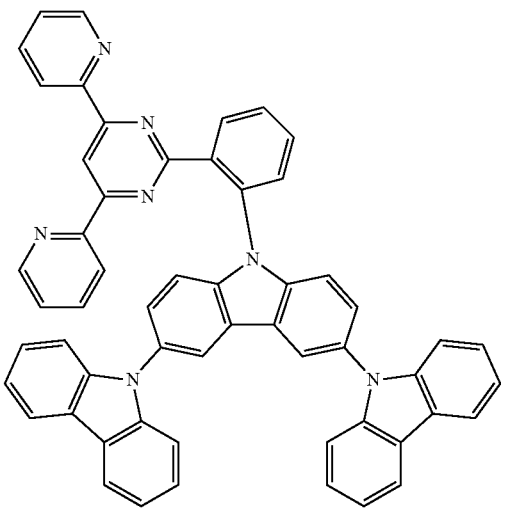
Compound A-81
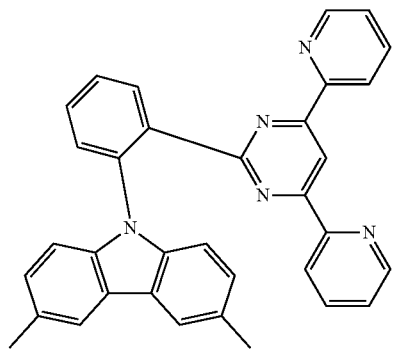

-continued

Compound A-82
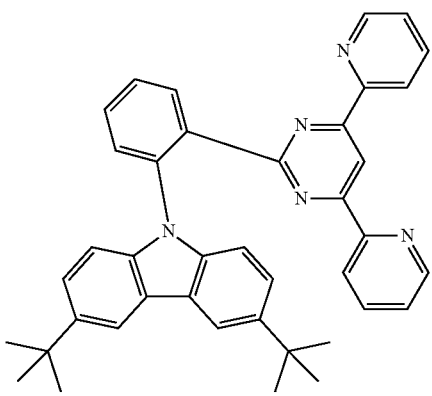

Compound A-83
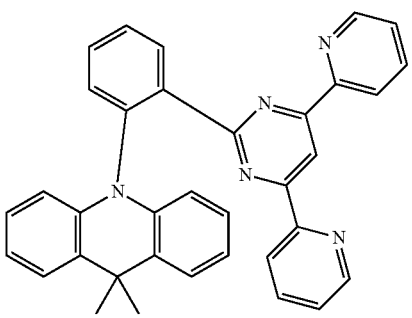

Compound A-84
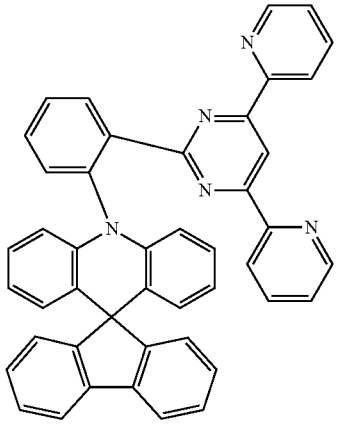

Compound A-85
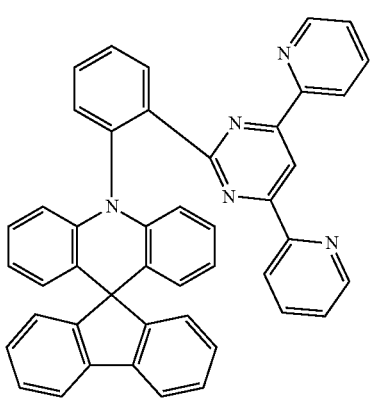

-continued

Compound A-86
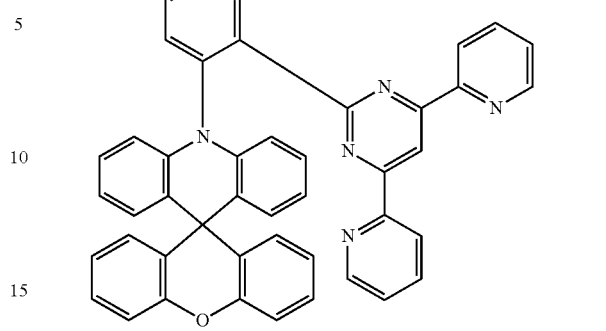

Compound A-87
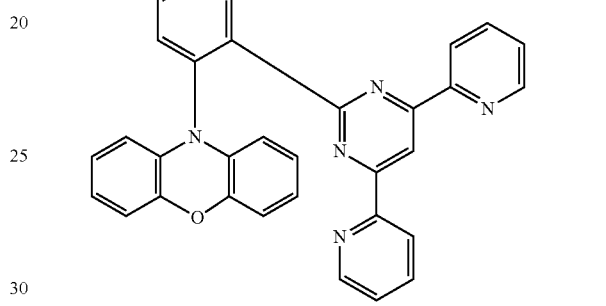

Compound A-88
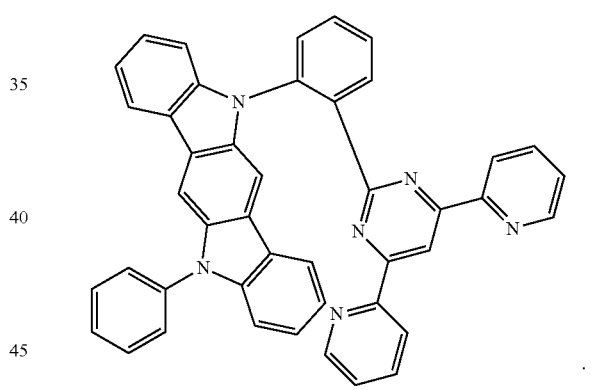

10. The organic light emitting diode of claim 1, wherein the excited state triplet energy level ($T_1^{TD1}$) of the first delayed fluorescent dopant is lower than an excited state triplet energy level ($T_1^H$) of the first host.

11. The organic light emitting diode of claim 1, wherein the first emitting material layer further comprising a fluorescent dopant.

12. The organic light emitting diode of claim 11, wherein each of an excited state singlet energy level ($S_1^{TD1}$) of the first delayed fluorescent dopant and an excited state singlet energy level ($S_1^{TD2}$) of the second delayed fluorescent dopant is respectively higher than an excited state singlet energy level ($S_1^{FD}$) of the fluorescent dopant.

13. The organic light emitting diode of claim 11, wherein each of the excited state triplet energy levels ($T_1^{TD1}$ and $T_1^{TD2}$) of the first and second delayed fluorescent dopants is respectively lower than an excited state triplet energy level ($T_1^H$) of the first host and higher than an excited state triplet energy level ($T_1^{FD}$) of the fluorescent dopant.

14. The organic light emitting diode of claim 1, further comprising a second emitting material layer disposed between the first electrode and the first emitting material layer or between the first emitting material layer and the second electrode.

15. The organic light emitting diode of claim 14, wherein the second emitting material layer comprises a second host and a first fluorescent dopant.

16. The organic light emitting diode of claim 15, wherein the second emitting material layer is disposed between the first electrode and the first emitting material layer, and further comprises an electron blocking layer disposed between the first electrode and the second emitting material layer.

17. The organic light emitting diode of claim 16, wherein the second host is formed as a same material as the electron blocking layer.

18. The organic light emitting diode of claim 15, wherein the second emitting material layer is disposed between the first emitting material layer and the second electrode, and further comprises a hole blocking layer disposed between the second emitting material layer and the second electrode.

19. The organic light emitting diode of claim 18, wherein the second host is formed as a same material as the hole blocking layer.

20. The organic light emitting diode of claim 15, wherein each of an excited state singlet energy level ($S_1^{TD1}$) of the first delayed fluorescent dopant and an excited state singlet energy level ($S_1^{TD2}$) of the second delayed fluorescent dopant is respectively higher than an excited state singlet energy level ($S_1^{FD1}$) of the first fluorescent dopant.

21. The organic light emitting diode of claim 15, wherein each of an excited state singlet energy level ($S_1^H$) and an excited state triplet energy level ($T_1^H$) of the first host is respectively higher than each of excited state singlet energy levels ($S_1^{TD1}$ and $S_1^{TD2}$) and the excited state triplet energy level ($T_1^{TD1}$ and $T_1^{TD2}$) of the first and second delayed fluorescent dopants, respectively, and
wherein an excited state singlet energy level ($S_1^{H2}$) of the second host is higher than an excited state singlet energy level ($S_1^{FD}$) of the first fluorescent dopant.

22. The organic light emitting diode of claim 15, further comprising a third emitting material layer disposed opposite to the second emitting material layer with respect to the first emitting material layer.

23. The organic light emitting diode of claim 22, wherein the third emitting material layer includes a third host and a second fluorescent dopant.

24. The organic light emitting diode of claim 23, wherein the second emitting material layer is disposed between the first electrode and the first emitting material layer and the third emitting material layer is disposed between the first emitting material layer and the second electrode, and further comprises an electron blocking layer disposed between the first electrode and the second emitting material layer.

25. The organic light emitting diode of claim 24, wherein the second host is formed of a same material as the electron blocking layer.

26. The organic light emitting diode of claim 24, further comprising a hole blocking layer disposed between the third emitting material layer and the second electrode.

27. The organic light emitting diode of claim 26, wherein the third host is formed of a same material as the hole blocking layer.

28. The organic light emitting diode of claim 23, wherein each of excited state singlet energy levels ($S_1^{TD1}$ and $S_1^{TD2}$) of the first and second delayed fluorescent dopants is respectively higher than each of excited state singlet energy levels ($S_1^{FD1}$ and $S_1^{FD2}$) of the first and second fluorescent dopants, respectively.

29. The organic light emitting diode of claim 23, wherein each of an excited state singlet energy level ($S_1^H$) and an excited state triplet energy level ($T_1^H$) of the first host is respectively higher than each of excited state singlet energy levels ($S_1^{TD1}$ and $S_1^{TD2}$) and the excited state triplet energy level ($T_1^{TD1}$ and $T_1^{TD2}$) of the first and second delayed fluorescent dopants, respectively,
wherein an excited state singlet energy level ($S_1^{H2}$) of the second host is higher than an excited state singlet energy level ($S_1^{FD1}$) of the first fluorescent dopant, and
wherein an excited state singlet energy level ($S_1^{H3}$) of the third host is higher than an excited state singlet energy level ($S_1^{FD2}$) of the second fluorescent dopant.

30. The organic light emitting diode of claim 1, wherein the at least one emitting unit comprises a first emitting unit disposed between the first and second electrodes and a second emitting unit disposed between the first emitting unit and the second electrode, wherein the first emitting unit comprises a lower emitting material layer and the second emitting unit comprises an upper emitting material layer,
wherein at least one of the lower emitting material layer and the upper emitting material layer comprises the first emitting material layer, and
further comprises a charge generation layer disposed between the first and second emitting units.

31. The organic light emitting diode of claim 30, wherein the excited state triplet energy level ($T_1^{TD1}$) of the first delayed fluorescent dopant and the excited state triplet energy level ($T_1^{TD2}$) of the second delayed fluorescent dopant satisfy the following relationship in Equation (2)

$$0.1 \text{ eV} \leq T_1^{TD2} - T_1^{TD1} \leq 0.3 \text{ eV} \qquad (2).$$

32. The organic light emitting diode of claim 30, wherein the HOMO energy level ($HOMO^{TD1}$) of the first delayed fluorescent dopant and the HOMO energy level ($HOMO^{TD2}$) of the second delayed fluorescent dopant satisfy the following relationship in Equation (5)

$$0.05 \text{ eV} < HOMO^{TD1} - HOMO^{TD2} < 1.0 \text{ eV} \qquad (5).$$

33. The organic light emitting diode of claim 30, wherein the LUMO energy level ($LUMO^{TD1}$) of the first delayed fluorescent dopant and the LUMO energy level ($LUMO^{TD2}$) of the second delayed fluorescent dopant satisfy the following relationship in Equation (8)

$$0.05 \text{ eV} < LUMO^{TD2} - LUMO^{TD1} < 1.0 \text{ eV} \qquad (8).$$

34. The organic light emitting device of claim 5, wherein the organic light emitting device includes an organic light emitting display device and an organic light emitting illumination device.

* * * * *